(12) United States Patent
Fukuhara et al.

(10) Patent No.: US 11,114,296 B2
(45) Date of Patent: Sep. 7, 2021

(54) SEMICONDUCTOR WAFER, ELECTRONIC DEVICE, METHOD OF PERFORMING INSPECTION ON SEMICONDUCTOR WAFER, AND METHOD OF MANUFACTURING ELECTRONIC DEVICE

(71) Applicant: SUMITOMO CHEMICAL COMPANY, LIMITED, Tokyo (JP)

(72) Inventors: Noboru Fukuhara, Ibaraki (JP); Yasuyuki Kurita, Tokyo (JP); Takayuki Inoue, Ibaraki (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 16/549,906

(22) Filed: Aug. 23, 2019

(65) Prior Publication Data
US 2019/0385846 A1    Dec. 19, 2019

Related U.S. Application Data

(63) Continuation of application No. PCT/JP2018/007058, filed on Feb. 26, 2018.

(30) Foreign Application Priority Data

Feb. 26, 2017    (JP) ............................. JP2017-034236

(51) Int. Cl.
*H01L 21/02*    (2006.01)
*H01L 29/20*    (2006.01)
(Continued)

(52) U.S. Cl.
CPC .... *H01L 21/02598* (2013.01); *H01L 29/2003* (2013.01); *H01L 29/42364* (2013.01); *H01L 29/7786* (2013.01)

(58) Field of Classification Search
CPC .......... H01L 21/02598; H01L 29/2003; H01L 29/42364; H01L 29/7786
See application file for complete search history.

(56) References Cited

U.S. PATENT DOCUMENTS 5,680,229 A * 10/1997 Yamanobe ............ H01L 31/113
257/55
8,816,395 B2 * 8/2014 Bunin ............... H01L 29/42316
257/194

(Continued)

FOREIGN PATENT DOCUMENTS

| JP | 2010-199409 A | 9/2010 |
| JP | 2013-15416 A | 1/2013 |
| WO | WO 2015/166572 A1 | 11/2015 |

OTHER PUBLICATIONS

International Preliminary Report on Patentability and English translation of the Written Opinion of the International Searching Authority for International Application No. PCT/JP2018/007058, dated Aug. 27, 2019.

(Continued)

*Primary Examiner* — Seahvosh Nikmanesh
(74) *Attorney, Agent, or Firm* — Birch, Stewart, Kolasch & Birch, LLP

(57) ABSTRACT

A semiconductor substrate in includes a buffer layer and a first crystalline layer. A bandgap of the first crystalline layer is smaller than a bandgap of a second layer. When a semiconductor wafer is formed as a transistor wafer, a channel of a transistor is formed at or near an interface between the first crystalline layer and the second layer. With a first electrode and a second electrode provided and a third electrode provided, when space charge redistribution, for emitting electrons and holes from a bandgap of a crystal positioned in the spatial region, is achieved by applying negative voltage to the third electrode or by applying (Continued)

positive voltage to the second electrode with the first electrode serving as a reference, an electron emission speed in the space charge redistribution is higher than a hole emission speed.

11 Claims, 68 Drawing Sheets

(51) Int. Cl.
*H01L 29/423* (2006.01)
*H01L 29/778* (2006.01)

(56) References Cited

U.S. PATENT DOCUMENTS

| | | | | |
|---|---|---|---|---|
| 8,871,565 | B2* | 10/2014 | Yamazaki | H01L 29/7869 |
| | | | | 438/104 |
| 9,542,977 | B2* | 1/2017 | Onuki | H01L 29/24 |
| 9,711,760 | B2* | 7/2017 | Soci | H05B 45/60 |
| 9,817,032 | B2* | 11/2017 | Takahashi | G01R 1/36 |
| 2008/0164418 | A1* | 7/2008 | Shahar | G01T 1/24 |
| | | | | 250/370.01 |
| 2010/0261304 | A1* | 10/2010 | Chang | H01L 21/02554 |
| | | | | 438/72 |
| 2013/0248883 | A1* | 9/2013 | Das | H01L 29/2003 |
| | | | | 257/77 |
| 2017/0047409 | A1 | 2/2017 | Iizuka et al. | |
| 2020/0335616 | A1* | 10/2020 | Chen | H01L 29/66462 |

OTHER PUBLICATIONS

Cornigli et al., "TCAD analysis of the leakage current and breakdown versus temperature of GaN-on-Silicon vertical structures," Solid-State Electronics, vol. 115, 2016, pp. 173-178.
"GaN Power Device Team, Energy Semiconductor Electronics Research Laboratory," https://unit.aist.go.jp/adperc/ci/eserl/unit/introduction/GaNteam.htm, searched on Jan. 1, 2015, 7 pages.
International Search Report (PCT/ISA/210) issued in PCT/JP2018/007058, dated May 22, 2018.
Ohno et al., "Observation of Side-Gating Effect in AlGaN/GaN Heterostructure Field Effect Transistors," Japanese Journal of Applied Physics, vol. 52, 2013, pp. 1-5.
Uren et al., "Buffer Design to Minimize Current Collapse in GaN/AlGaN HFETs," IEEE Trans. Electron Devices, vol. 59, No. 12, 2012, pp. 3327-3333.
European Communication and extended search report issued in the corresponding European Patent Application No. 18757086.6 dated Mar. 31, 2021 i.
Uren et al., "Buffer Transport Mechanisms in Intentionally Carbon Doped GaN Heterojunction Field Effect Transistors," Applied Physics Letters, vol. 104, No. 26, 2014 (12 pages total).

* cited by examiner

TIME CONSTANT SPECTRUM FOR HOLE EMISSION

TIME CONSTANT SPECTRUM FOR ELECTRON EMISSION

SEMICONDUCTOR WAFER, ELECTRONIC DEVICE, METHOD OF PERFORMING INSPECTION ON SEMICONDUCTOR WAFER, AND METHOD OF MANUFACTURING ELECTRONIC DEVICE

The contents of the following Japanese patent applications are incorporated herein by reference:
NO. 2017-034236 filed in JP on Feb. 26, 2017, and
NO. PCT/JP2018/007058 filed on Feb. 26, 2018.

BACKGROUND

1. Technical Field

The present invention relates to a semiconductor wafer, an electronic device, a method of performing inspection on a semiconductor wafer, and a method of manufacturing an electronic device

2. Related Art

Compound semiconductor heterojunctions have been utilized to manufacture various transistors with excellent high-frequency performance and high breakdown voltage performance. For example, a GaN-high electron mobility transistor (GaN-HEMT), using two-dimensional electron gas produced at an AlGaN/GaN heterointerface as a channel, is a promising candidate of a high power device with excellent time response. Specifically, a transistor used for a power switch is required to operate at a high speed to switch between an ON state (with current flowing between the source and the drain resulting in low voltage between both terminals) and an OFF state (with the current between the source and the drain shut off, resulting in higher voltage between both terminals). In this context, the GaN-HEMT is said to be usable as the power switch to achieve a lower resistance in the ON state, high breakdown voltage in the OFF state, and a small power loss in an ON/OFF switching transitional state.

However, in the GaN-HEMT, a current collapse phenomenon has been known, which is that the ON resistance increases as a result of switching the switch state to the ON state after application of stress (drain voltage stress) with application of high voltage between the source and the drain in the OFF state. Occurrence of the current collapse may result in a problem that predetermined device performance fails to be achieved. An increase in resistance (decrease in current) due to the drain voltage stress will be hereinafter referred to as "current collapse (phenomenon)".

Non-Patent Document 1 has the following description on a mechanism behind the occurrence of the current collapse: "When the drain voltage is high and/or the gate voltage is low, a depletion layer with high electric field is formed near the gate terminal on the drain side. Electrons in a channel, formed at the AlGaN/GaN heterointerface, are accelerated by the high electric field, to move over an AlGaN barrier layer to be trapped at an AlGaN layer surface state. As a result, the AlGaN layer surface is negatively charged. The resultant negative charges repel the electrons in a channel immediately below. This results in a decrease in the electron density in the channel and an increase in the channel resistance, and thus the drain current decreases. The AlGaN layer surface state is at a deep level, meaning that it takes a while for the electrons trapped to be emitted from the surface level. Thus, the drain current amount cannot be immediately restored. This is the phenomenon known as the current collapse".

Non-Patent Document 2 has a description on a buffer layer design for minimizing the current collapse, in a GaN/AlGaN heterojunction electric field effect transistor. It is described in the document that a result of a simulation using drift-diffusion model indicates that strong current collapse is induced by introduction of carbon impurities providing an acceptor level. Non-Patent Document 3 has a description on an effect of a side gate of an AlGaN/GaN heterostructure transistor. Specifically, it is described in the document that holes are emitted from the trapped level when negative biases are applied to the side gate, and that the hole emission leads to negative space charge redistribution. Patent Document 1 discloses a method of measuring current collapse attributable to a buffer, using a back gate.

PRIOR ART LITERATURE

[Patent Document 1] Japanese Patent Application Publication No. 2010-199409
[Non-Patent Document 1] "GaN Power Device Team, Energy Semiconductor Electronics Research Laboratory", [online], National Institute of Advanced Industrial Science and Technology, [searched on Jan. 30, 2016], Internet (URL: https://unit.aist.go.jp/adperc/ci/eserl/unit/introduction/GaNteam.htm)
[Non-Patent Document 2] M. J. Uren et al., "Buffer Design to Minimize Current Collapse in GaN/AlGaN HFETs", IEEE Trans. Electron Devices, 2012, Vol. 59, No. 12, pp. 3327-3333
[Non-Patent Document 3] Yasuo Ohno et al., "Observation of Side-Gating Effect in AlGaN/GaN Heterostructure Field Effect Transistors", Japanese Journal of Applied Physic, The Japan Society of Applied Physics, 2013, Vol. 52, 08JN28-1

As described above, causes of the current collapse can be classified into a factor attributable to a trap level of the wafer surface of the AlGaN layer and the like and a factor attributable to a trap level in the buffer layer. The trap level of the wafer surface depends heavily on a device manufacturing process, whereas the trap level in the buffer level depends heavily on a manufacturing process for a semiconductor wafer, in particular, an epitaxial growth process. Thus, to comprehensively suppress the current collapse, consistent countermeasures entirely covering processes from semiconductor wafer manufacturing to device manufacturing need to be taken. On the other hand, the semiconductor wafer manufacturing process and the device manufacturing process are clearly separable. Thus, it is effective to take countermeasures independently on each of the causes (processes) separated from one another.

Non-Patent Documents and Patent Document described above disclose the causes and the mechanisms of the current collapse, but disclose no conditions or solutions for suppressing or preventing the current collapse attributable to a buffer. An object of the present invention is to provide a technique for a semiconductor wafer that is less likely to have or is free of current collapse mainly attributable to a buffer layer. Another object of the present invention is to provide an inspection technique with which a high-quality semiconductor wafer that is less likely to have or is free of current collapse mainly attributable to a buffer can be selected.

SUMMARY

To solve the problems described above, a first aspect of the present invention provides a semiconductor wafer. The semiconductor wafer may include a substrate, a buffer layer, a first crystalline layer, and a second layer. The substrate, the buffer layer, the first crystalline layer, and the second layer may be positioned in order of the substrate, the buffer layer, the first crystalline layer, and the second layer. The buffer layer and the first crystalline layer may be made of a group III nitride layer. A bandgap of the first crystalline layer may be smaller than a bandgap of the second layer. When the semiconductor wafer is formed as a transistor wafer, a channel of a transistor may be formed at or near an interface between the first crystalline layer and the second layer. With a first electrode and a second electrode, electrically connected to the channel, provided closer to a front surface than the channel is and a third electrode, at which an electric field is applicable to a spatial region positioned between the channel and the wafer, provided closer to a back surface than the channel is, when space charge redistribution, for emitting electrons and holes from a bandgap of a crystal positioned in the spatial region, is achieved by applying negative voltage to the third electrode or by applying positive voltage to the second electrode with the first electrode serving as a reference, an electron emission speed in the space charge redistribution may be higher than a hole emission speed.

A second aspect of the present invention provides a semiconductor wafer. The semiconductor wafer may include a substrate, a buffer layer, a first crystalline layer, and a second layer. The substrate, the buffer layer, the first crystalline layer, and the second layer may be positioned in order of the substrate, the buffer layer, the first crystalline layer, and the second layer. The buffer layer and the first crystalline layer may be made of a group III nitride layer. A bandgap of the first crystalline layer may be smaller than a bandgap of the second layer. When the semiconductor wafer is formed as a transistor wafer, a channel of a transistor may be formed at or near an interface between the first crystalline layer and the second layer. With a first electrode and a second electrode, electrically connected to the channel, provided closer to a front surface than the channel is, when voltage at a level not causing saturation of current flowing between the first electrode and the second electrode is applied between the first electrode and the second electrode and negative voltage is applied to the wafer, with a lower one of potentials of the first electrode and the second electrode serving as a reference, the current flowing between the first electrode and the second electrode may not decrease with time.

In the above-described semiconductor wafer, the second layer may be a second crystalline layer made of a group III nitride layer. The channel may be two-dimensional electron gas. In this case, the first crystalline layer may be made of $Al_xGa_{1-x}N$. The second crystalline layer may be made of $Al_yGa_{1-y}N$ where x≠y. The substrate may be made of a conductive monocrystalline Si. In this case, the first crystalline layer may be made of GaN. The second crystalline layer may be made of $Al_yGa_{1-y}N$ where 0<y≤1. As a modified structure with the same operation principle as the GaN-HEMT using the two-dimensional electron gas formed at the AlGaN/GaN heterointerface as the channel, the semiconductor wafer may have a structure further include one or a plurality of $Al_zGa_{1-z}N$ (0<z≤1) layers additionally provided on the second crystalline layer. The added layer may be intentionally provided with impurities.

In the above-described semiconductor wafer, an absolute value of the negative voltage may be smaller than an absolute value of pinch-off voltage of the two-dimensional electron gas. Alternatively, the negative voltage may be voltage within a range between −10V and −200V (a range between equal to or higher than −200V and equal to or lower than −10V). Preferably, the negative voltage may be voltage within a range between −40V and −20V (a range between equal to or higher than −40V and equal to or lower than −20V). The voltage of the second electrode relative to the first electrode may be 5 V or lower. Preferably, the voltage of the second electrode relative to the first electrode may be equal to or higher than 0.1V and equal to or lower than 0.2V. Preferably, the voltage of the second electrode relative to the first electrode may be equal to or higher than 0.5V and equal to or lower than 1.5V. The current flowing between the first electrode and the second electrode when the negative voltage is applied to the wafer may be measured over time. The current may be measured with a measurement start time of 1 millisecond and a measurement end time of 10,000 seconds. At this time, a minimum measurement interval may be 1 millisecond. Preferably, the current may be measured with a measurement start time of 0.1 milliseconds, a measurement end time of 400 seconds, and a minimum measurement interval of 0.1 milliseconds. The measurement may be performed with the temperature of a measurement element being within a range between a room temperature (approximately 23° C.) or higher and approximately 200° C. or lower. Preferably, the measurement may be performed with the temperature of the measurement element being within a range between a room temperature or higher and approximately 120° C. or lower. A gate electrode with which current can be controlled may be provided between the first electrode and the second electrode. While the current flowing between the first electrode and the second electrode is measured over time, voltage applied to the gate (gate voltage) may be fixed to a constant value. Preferably, the gate voltage may be 0V for a normally on device. As the gate voltage with which current flows, positive voltage may be applied for a normally off device.

In the above-described semiconductor wafer, the second layer may be an insulating layer functioning as a gate insulating film for the transistor when the transistor is formed. For example, the insulating layer may be a $SiO_x$ layer, an $AlO_x$ layer, a $SiN_x$ layer, or a stacked layer including a combination of these.

In the above-described semiconductor wafer, the substrate may be a conductive substrate. In the above-described semiconductor wafer, the substrate may be a monocrystalline wafer made of Si, SiC, or GaN.

A third aspect of the present invention provides an electronic device including the above-described semiconductor wafer.

A fourth aspect of the present invention provides a method of performing inspection on a semiconductor wafer, and the method may include preparing a semiconductor wafer including a substrate, a buffer layer, a first crystalline layer, and a second layer, the substrate, the buffer layer, the first crystalline layer, and the second layer being positioned in order of the buffer layer, the first crystalline layer, and the second layer, the buffer layer and the first crystalline layer being made of a group III nitride layer, a bandgap of the first crystalline layer being smaller than a bandgap of the second layer, when the semiconductor wafer is formed as a transistor wafer, a channel of a transistor being formed at or near an interface between the first crystalline layer and the second layer; providing a first electrode and a second electrode, electrically connected to the channel, to be closer to a front surface than the channel is and providing a third electrode, at which an electric field is applicable to a spatial region positioned between the channel and the wafer, to be closer to a back surface than the channel is; applying negative voltage to the third electrode or applying positive voltage to the second electrode with the first electrode serving as a reference to achieve a space charge redistribution for emitting electrons and holes from a bandgap of a crystal positioned in the spatial region; and determining that the semiconductor water has passed the inspection when an electron emission speed in a space charge redistribution is higher than a hole emission speed.

A fifth aspect of the present invention provides a method of performing inspection on a semiconductor wafer, and the method may include preparing a semiconductor wafer including a substrate, a buffer layer, a first crystalline layer, and a second layer, the substrate, the buffer layer, the first crystalline layer, and the second layer being positioned in order of the buffer layer, the first crystalline layer, and the second layer, the buffer layer and the first crystalline layer being made of a group III nitride layer, a bandgap of the first crystalline layer being smaller than a bandgap of the second layer, when the semiconductor wafer is formed as a transistor wafer, a channel of a transistor being formed at or near an interface between the first crystalline layer and the second layer; providing a first electrode and a second electrode, electrically connected to the channel, to be closer to a front surface than the channel is and providing a third electrode, at which an electric field is applicable to a spatial region positioned between the channel and the wafer, to be closer to a back surface than the channel; applying voltage between the first electrode and the second electrode, the voltage being at a level not causing saturation of the current flowing between the first electrode and the second electrode and applying negative voltage to the wafer, with a lower one of potentials of the first electrode and the second electrode serving as a reference; and determining that the semiconductor wafer has passed the inspection, when current flowing between the first electrode and the second electrode does not decrease with time.

In the above-described method of performing inspection on a semiconductor wafer, the second layer may be a second crystalline layer made of a group III nitride layer. The channel may be two-dimensional electron gas. Alternatively, the second layer may be an insulating layer functioning as a gate insulating film for the transistor when the transistor is formed.

A sixth aspect of the present invention provides a method of manufacturing an electronic device. The method of manufacturing an electronic device may include inspecting a semiconductor wafer with the above-described method of performing inspection. The method of manufacturing an electronic device may include forming an electronic device by using a semiconductor wafer that has passed the inspecting.

The "interface" between the first crystalline layer and the second layer is a junction surface between the first crystalline layer and the second layer. The concept of the "interface" of course includes a case where the first crystalline layer and the second layer, and also include a case where the first crystalline layer and the second layer are in contact with each other with an extremely thin layer provided in between.

BRIEF DESCRIPTION OF THE DRAWINGS

FIG. 2 shows a cross section of the semiconductor wafer 100 with a second layer 114 being a second crystalline layer 114a.

DESCRIPTION OF EXEMPLARY EMBODIMENTS

First Embodiment

Figure 1:
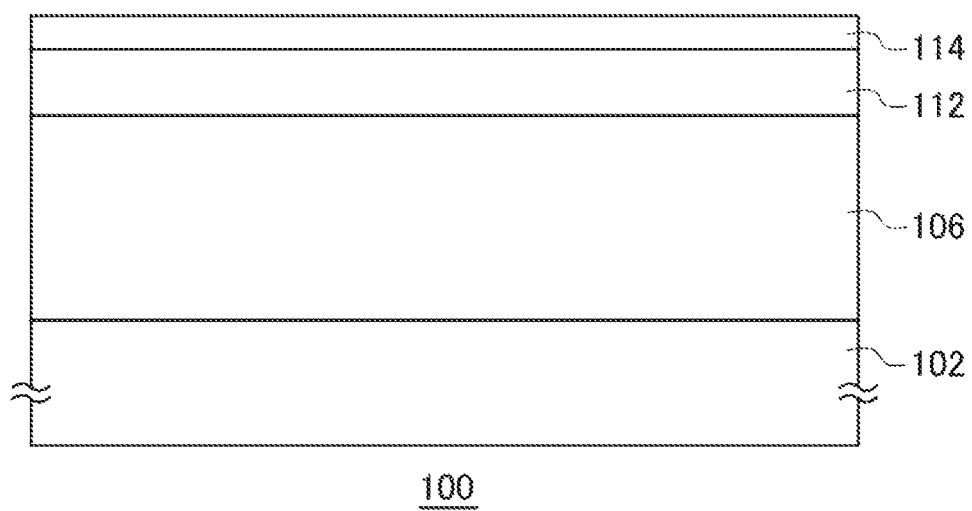
FIG. 1 shows a cross section of a semiconductor wafer 100.

FIG. 1 is a cross-sectional view of a semiconductor wafer 100. The semiconductor wafer 100 includes a substrate 102, a buffer layer 106, a first crystalline layer 112, and a second layer 114. As shown in FIG. 1, the substrate 102, the buffer layer 106, the first crystalline layer 112, and the second layer 114 are positioned in the order of the substrate 102, the buffer layer 106, the first crystalline layer 112, and the second layer 114. The buffer layer 106 and the first crystalline layer 112 are made of a group III nitride layer. A bandgap of the first crystalline layer 112 is smaller than a bandgap of the second layer 114.

Figure 2:
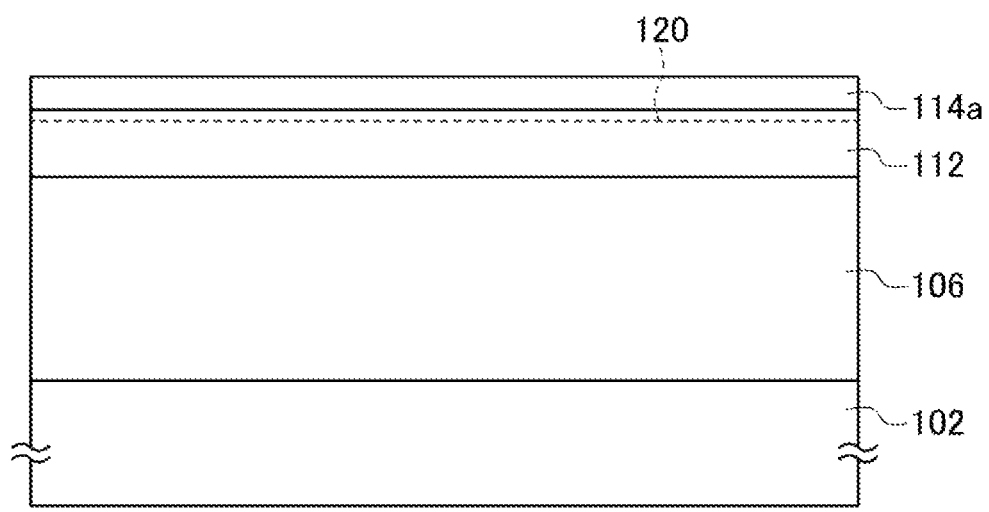

When the semiconductor wafer 100 is formed as a transistor wafer, a channel of a transistor is formed at or near an interface between the first crystalline layer 112 and the second layer 114. The second layer 114 may be a second crystalline layer 114a made of a group III nitride layer as shown in FIG. 2. In such a case, two-dimensional electron gas 120, serving as the channel, is produced at the interface between the first crystalline layer 112 and the second crystalline layer 114a.

Figure 3:
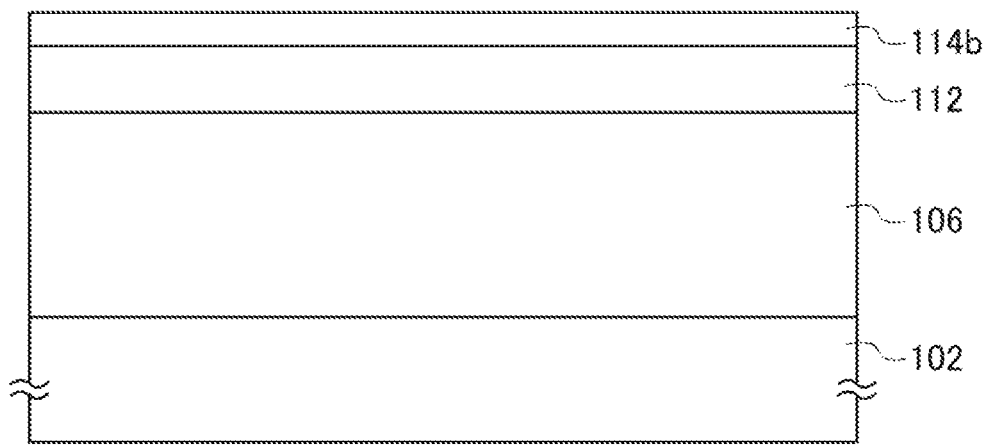
FIG. 3 shows a cross section of the semiconductor wafer 100 with the second layer 114 being an insulating layer 114b.

Alternatively, as shown in FIG. 3, the second layer 114 may be an insulating layer 114b that functions as a gate insulating film when a transistor is formed on the semiconductor wafer 100. In this case, impurity diffusion regions, serving as a source region and a drain region of the transistor, are formed on the semiconductor wafer 100. When appropriate voltage is applied to the gate, a channel is generated near the interface between the first crystalline layer 112 and the insulating layer 114b.

When the second layer 114 is the insulating layer 114b, an AlGaN layer with a larger bandgap than that of the first crystalline layer 112 may be selectively formed in the source region, the drain region, and in an access region between the gate electrode and the source/drain region. In such a case, the channel is generated near the interface between the first crystalline layer 112 and the insulating layer 114b when appropriate voltage is applied to the gate.

The configuration of the second crystalline layer 114a (FIG. 2) serving as the second layer 114 will be described below. The substrate 102 is a supporting substrate that supports the buffer layer 106, the first crystalline layer 112, and the second crystalline layer 114a. Examples of a material of the wafer 102 include silicon, sapphire, GaN crystals, and the like. A silicon substrate may be used as the substrate 102, and in such a case, a manufacturing cost can be reduced and a semiconductor manufacturing apparatus used for conventional silicon processes can be used. Accordingly, higher cost competitiveness can be achieved. Further, the use of the silicon substrate as the substrate 102 enables a large wafer, with a diameter equal to or larger than 150 mm, to be industrially used at a low cost.

The substrate 102 may be a conductive substrate. An example of the conductive substrate may include a silicon substrate doped with impurities. When the conductive substrate is used as the substrate 102, an electric field from a back gate electrode described later can be effectively applied to the buffer layer 106.

The substrate 102 may be a monocrystalline substrate made of Si, SiC, or GaN. With the monocrystalline substrate made of Si, SiC, or GaN uses as the substrate 102, the epitaxial growth of the first crystalline layer 112 and the second crystalline layer 114a with high quality can be achieved via the buffer layer 106 and another intermediate layer if necessary.

The buffer layer 106 is a buffer layer formed for various objects including: improving the crystalline quality of the first crystalline layer 112 and the second crystalline layer 114a; improving insulation between the substrate 102 and the first crystalline layer 112/second crystalline layer 114a; and adjusting internal stress so that the semiconductor wafer 100 is less likely to warp. Examples of the buffer layer 106 include a GaN layer and an AlGaN layer. Also, the buffer layer may be a multilayer stacked layer including two types of crystalline layers (such as an AlN layer, an AlGaN layer, and a GaN layer) with different compositions that are alternately and repeatedly stacked.

The first crystalline layer 112 and the second crystalline layer 114a are device forming layers, on which a device, such as a High Electron Mobility Transistor (HEMT), is to be formed. The bandgap of the second crystalline layer 114a is larger than the bandgap of the first crystalline layer 112. Two-dimensional electron gas is produced at the heterointerface between the first crystalline layer 112 and the second crystalline layer 114a, as a result of spontaneous polarization due to a difference in Al compositions and piezoelectric polarization due to a difference in lattice constants. The second crystalline layer 114a lattice-matches or pseudo-lattice-matches with the first crystalline layer 112 while being in contact with the first crystalline layer 112

The first crystalline layer 112 is made of $Al_xGa_{1-x}N$, for example, and the second crystalline layer 114a is made of $Al_yGa_{1-y}N$ ($x \neq y$), for example. Specifically, the first crystalline layer 112 may be GaN, for example, and the second crystalline layer 114a may be $Al_yGa_{1-y}N$ ($0<y\leq 1$), for example. The thickness of the first crystalline layer 112 is selectable within a range between 200 and 2,000 nm, and may be 800 nm, for example. The thickness of the second crystalline layer 114a is selectable within a range between 10 and 100 nm, and may be 25 nm, for example.

When the interface between the first crystalline layer 112 and the second crystalline layer 114a is an AlGaN/GaN heterointerface and two-dimensional electron gas produced at the interface is used as a GaN-HEMT channel, the structure may further include one or a plurality of $Al_zGa_{1-z}N$ ($0<z\leq 1$) layers additionally provided on the second crystalline layer 114a. The added layer may be intentionally doped with impurities.

In the present embodiment, the buffer layer 106 and the first crystalline layer 112 are described as separate layers. However, when the buffer layer 106 and the first crystalline layer 112 have the same composition, the buffer layer 106 and the first crystalline layer 112 may be regarded as a single layer. In such a case, upper and lower layers in this single layer respectively correspond to the first crystalline layer 112 and the buffer layer 106. In the description below, the crystalline layer including both the first crystalline layer 112 and the buffer layer 106 will be referred to as a "sub heterointerface crystalline layer". The "sub heterointerface crystalline layer" is a crystalline layer positioned between the wafer 102 and the channel-formed interface between the first crystalline layer 112 and the second layer 114 (second crystalline layer 114a), and includes the buffer layer 106 and the first crystalline layer 112, for example. If an intermediate layer not described in this document is formed between the substrate 102 and the buffer layer 106, for example, the "sub heterointerface crystalline layer" of course includes the intermediate layer.

The buffer layer 106, the first crystalline layer 112, and the second crystalline layer 114a can be formed by Metal Organic Chemical Vapor Deposition (MOCVD), which is a generally employed method. In an example where an AlGaN layer and a GaN layer are formed by MOCVD, trimethylaluminum ($Al(CH_3)_3$) and trimethylgallium ($Ga(CH_3)_3$) can be used as group III source gas, and ammonia ($NH_3$) can be used as nitrogen source gas. The growth temperature can be selected within a range between 550° C. and 1200° C. both inclusive. A flow ratio of group V source gas to the group III source gas, that is, a ratio V/III can be selected within a range between 50 and 22,000 both inclusive. The thickness of the layer to be formed can be controlled based on growth time, corresponding to a designed thickness, calculated from growth rate that has been obtained in a preliminary experiment, for example.

Figure 4:
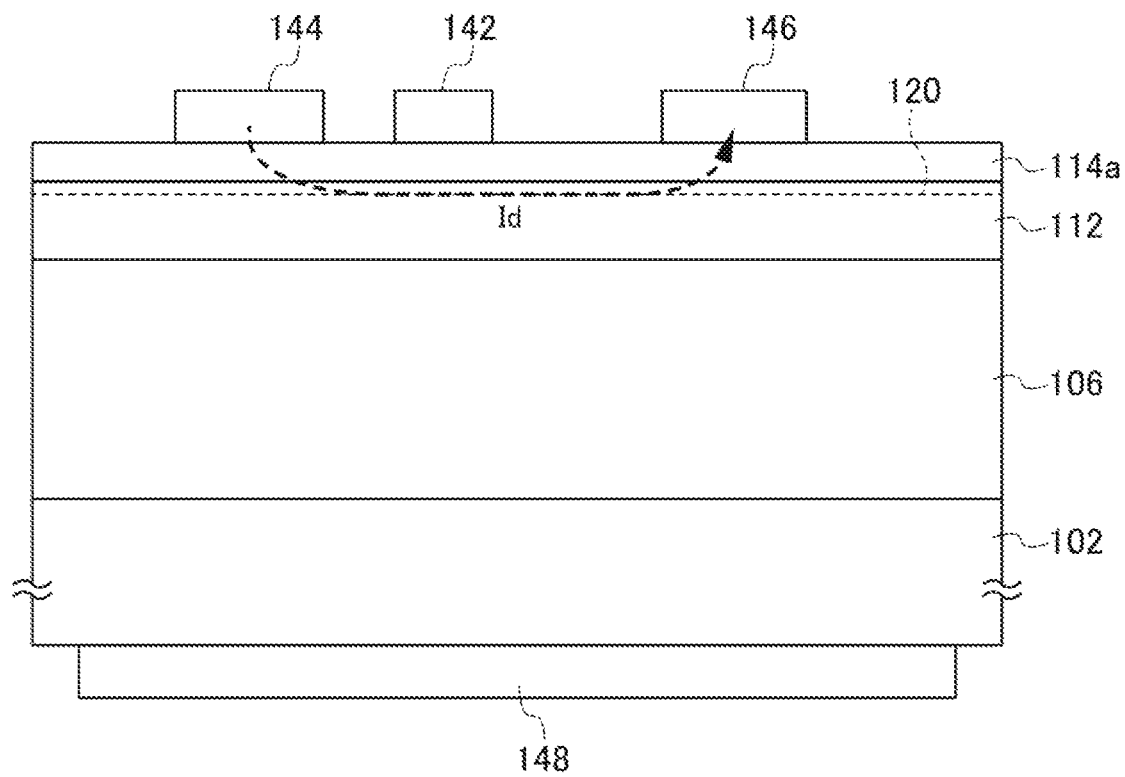
FIG. 4 shows a cross section of the semiconductor wafer 100 provided with a first electrode 144, a second electrode 146, and a third electrode 148.

FIG. 4 is a cross-sectional view of a configuration showing a case where a first electrode 144, a second electrode 146, and a third electrode 148 are arranged on the semiconductor wafer 100. An electrode 142 functions as the gate of the transistor, the first electrode 144 functions as the source of the transistor, and the second electrode 146 functions as the drain of the transistor. The third electrode 148 functions as the back gate of the transistor.

The first electrode 144 and the second electrode 146 are electrically connected to the two-dimensional electron gas 120, and are arranged closer to the front surface than the two-dimensional electron gas 120 is. The third electrode 148 enables an electric field to be applied to a spatial region between the two-dimensional electron gas 120 and the substrate 102, and is arranged closer to the back surface than the two-dimensional electron gas 120 is. Here, the terms "front surface side" and "back surface side" are respectively defined as upper and lower sides in FIG. 4.

By applying negative voltage to the third electrode 148 and applying positive voltage to the second electrode 146 with the potential of the first electrode 144 serving as a reference, space charge redistribution can be achieved for emitting electrons and holes from a bandgap of a crystal (sub heterointerface crystalline layer) positioned in the spatial region between the two-dimensional electron gas 120 and the substrate 102.

The semiconductor wafer 100 according to the present embodiment features the electrons being emitted at a higher speed than the holes with the space charge redistribution thus achieved. Such a semiconductor wafer 100 is less likely to have or is free of current collapse attributable to the buffer layer 106. As a result, the semiconductor wafer 100 enables a high performance semiconductor device to be manufactured.

The negative voltage described above may have an absolute value that is smaller than an absolute value of pinch-off voltage of the two-dimensional electron gas 120. For example, the value of the negative voltage may be within a range between −10V and −200V (a range between equal to or higher than −200V and equal to or lower than −10V). The range of the negative voltage is preferably between −20V and −40V (a range between equal to or higher than −40V and equal to or lower than −20V).

Figure 5:
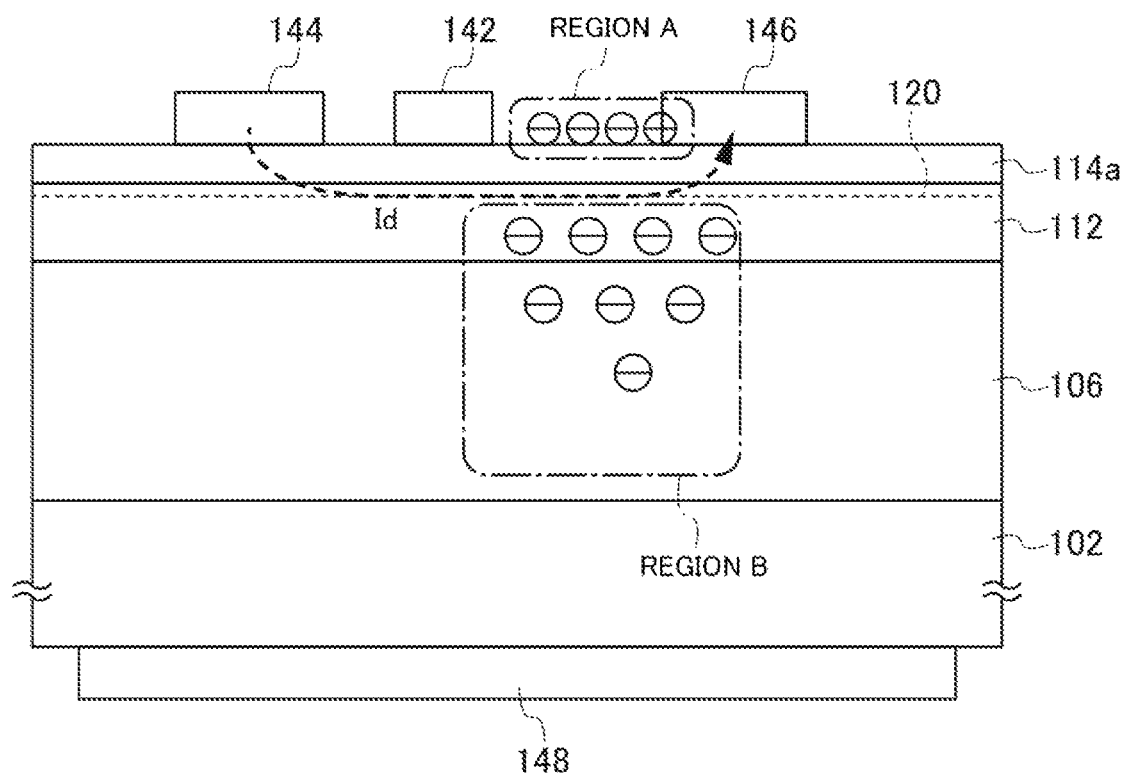
FIG. 5 is a schematic view of a space charge distribution leading to current collapse.

A mechanism behind the occurrence of the current collapse will be described more in detail below. FIG. 5 is a schematic view showing a space charge distribution leading to the current collapse. When the GaN-HEMT operates as the switching element, an ON state involving low voltage (also referred to as "drain voltage") between the first electrode 144 (source) and the second electrode 146 (drain) with drain current Id flowing and an OFF state involving high drain voltage with the drain current Id shut off are repeatedly achieved. In the ON state, voltage of the gate of the electrode 142 (also referred to as "gate voltage") higher on the positive side than a threshold voltage is applied and lowest possible drain voltage enabling predetermined current to flow, which is approximately 10V or lower, is preferably used. In the OFF state, the gate voltage higher on the negative side than the threshold voltage is applied, and substantially no current flows. In this state, voltage that is substantially as high as the maximum voltage of operation power, which is approximately equal to or higher than +200V and equal to or lower than +1200V, is applied as the drain voltage.

The current collapse is a phenomenon in which the application of the drain voltage in the OFF state results in the drain current in the ON state being lower than that before the application of the drain voltage. This is said to be attributable to negative space charges induced on a certain location of the transistor, due to the application of the drain voltage in the OFF state. These space charges, which have been induced in the OFF state, change to be relaxed in the transition from the OFF state to the ON state. However if a time required for the relaxing is unignorably long relative to the switching time between the OFF state and the ON state, the drain current decreases and the ON resistance increases. Thus, the performance of the system as a whole is compromised. An appropriate evaluation method and an appropriate countermeasure conforming to the characteristics of the space charges are required for suppressing or preventing the current collapse.

It is known that there are two main locations where the space charges are induced due to the drain voltage in the OFF state. One is a region A shown in FIG. 5 that is at or around the AlGaN surface between the gate electrode and the drain electrode. The other one is a region B shown in FIG. 5 that includes the first crystalline layer 112 (hereinafter, also referred to as "channel layer") and the buffer layer 106, and is located between a region on the lower side of the region in which the gate electrode is formed and a region on the lower side of the drain electrode.

Occurrence of the current collapse attributable to the location at or near the AlGaN surface depends heavily on a condition in a device processing step for preparing a device by using a semiconductor crystal wafer. On the other hand, occurrence of the current collapse attributable to the channel layer and/or the buffer layer 106 depends heavily on an epitaxial growth process. An object of the invention of the present application is to provide a technique to achieve a semiconductor wafer that is less likely to have or is free of the latter current collapse attributable to the channel layer and/or the buffer layer 106. Also, an object of the present invention is to provide an inspection technique enabling selection of a high quality semiconductor wafer that is less likely to have or is free of the current collapse attributable to the channel layer and/or the buffer layer 106. In view of this, the current collapse attributable to the channel layer and/or the buffer layer 106 will be described.

Generally, a ratio between levels of contribution of these respective two causes to the occurrence of current collapse cannot be figured out from a result of measuring the current collapse. Thus, the determination can only be empirically made based on results measured under various processing conditions of the transistor and epitaxial growth step conditions. However, the mechanism behind neither of these causes has not necessarily been clearly understood yet. Furthermore, a technique for controlling or preventing the current collapse has not necessarily been established yet. Thus, generally, it should be difficult to separately evaluate the causes and reduce or prevent the occurrence due to the causes. To recognize the current collapse phenomenon attributable to the channel layer and/or buffer layer 106, measurement needs to be performed in a state that is less likely to have or is free of the current collapse attributable to the location at or near the AlGaN surface, or in a state where the current collapse attributable to the cause can be quantitatively recognized. This requires an advanced transistor production technique, that is, a technique almost as sophisticated as that for manufacturing a transistor product. A manufacturer that produces a semiconductor wafer may acquire the technique for producing the transistor to check the epitaxial step in an attempt to recognize the current collapse phenomenon attributable to the channel layer and/or the buffer layer 106. However, this is not a very good idea in terms of cost reduction. Thus, what is required is an alternative simple evaluation method for evaluating the current collapse attributable to the channel layer and/or the buffer layer 106 without being affected by the space charges at or around the AlGaN surface.

A method of evaluating current collapse without being affected by the current collapse attributable to the location at or near the AlGaN surface includes methods using a back gate effect, as described in Patent Document 1 and Non-Patent Document 3, for example. An actual measurement method will be described with reference to FIG. 4.

The transistor has four electrodes including the first electrode 144 (hereinafter, also referred to as a "source electrode 144"), the second electrode 146 (hereinafter, also referred to as a "drain electrode 146"), the electrode 142 (hereinafter, also referred to as a "gate electrode 142"), and the third electrode 148 formed on the wafer back surface (hereinafter, also referred to as a "wafer back surface electrode 148"). The source electrode 144 is used as a common electrode, to serve as a voltage reference. In a normal operation, positive voltage is applied as the drain voltage, and the drain current Id flowing from the source electrode 144 to the drain electrode 146 is controlled with the potential of the gate electrode 142 formed between the electrodes. Meanwhile, the wafer back surface electrode 148 is generally fixed to a predetermined voltage, that is, generally set to be the same potential as the common electrode.

On the other hand, when the back gate effect is measured, a change in the drain current with respect to a change in the potential of the wafer back surface electrode 148 is measured with the potential of the gate electrode 142 on the front surface side fixed. The drain current is modulated with the wafer back surface electrode 148 used as the gate electrode, instead of the gate electrode 142 on the front surface side. Thus, such a modulation of the drain current is referred to as the back gate effect. Generally, due to a lower modulation efficiency than that with the gate electrode 142 on the front surface side, voltage (back gate voltage) higher than the gate voltage on the front surface side is applied to the wafer back surface electrode 148. The drain current modulation using the back gate voltage has characteristics depending on the space charge distribution of the crystalline layer between the wafer back surface electrode 148 and the two-dimensional electron gas 120 (which may also be simply referred to as "two-dimensional electrons"), and thus may result in information about a property related to the current collapse attributable to the channel layer and/or the buffer layer 106. However, the information does not necessarily clearly indicate the association between the back gate effect and the current collapse. Furthermore, a method of reducing or preventing the current collapse has not been clearly established yet.

An example of actual measurement of the back gate effect of the GaN-HEMT will be described below. A semiconductor wafer with the same layer structure as the semiconductor wafer 100 shown in FIG. 2 was used. The substrate 102 was a p-type silicon wafer. The buffer layer 106 was formed by a plurality of $Al_wGa_{1-w}N$ (0<w≤1) layers with different Al compositions and a GaN layer. A GaN layer was used as the first crystalline layer 112, and an $Al_vGa_{1-v}N$ layer (0<v≤1) was used as the second crystalline layer 114a. The thickness and the Al composition of the second crystalline layer 114a were respectively 30 nm and 20%. The transistor produced had a structure that is the same as that in FIG. 4. For a step of producing the transistor, a normal photolithography may be employed. The step of producing the transistor includes: (1) a surface etching step for element isolation; (2) a step of forming the source electrode/drain electrode by vacuum evaporation and a lift-off process, and then performing thermal treatment; and (3) a step of forming the gate electrode by vacuum evaporation and a lift-off process. In the etching step for element isolation, reactive ion etching was employed to form a trench having a depth of approximately 100 nm. Gas used in the etching step was mixed gas of chlorine and bromine trichloride. The source electrode 144 and the drain electrode 146 had a Ti/Al/Ti/Au layered structure, and the gate electrode 142 had a Ni/Au layered structure. The gate length and the gate width of the transistor were respectively 10 μm and 100 μm. A distance between the source electrode 144 and the gate electrode 142 was 5 μm. A distance between the gate electrode 142 and the drain electrode 146 was 5 μm. The values are not limited to these, and may be freely selected, as long as the GaN-HEMT can operate. A surface protection film, a "field plate", and the like are not formed for suppressing the occurrence of the current collapse attributable to the location at or around the surface of the AlGaN layer (second crystalline layer 114a).

Figure 6A:
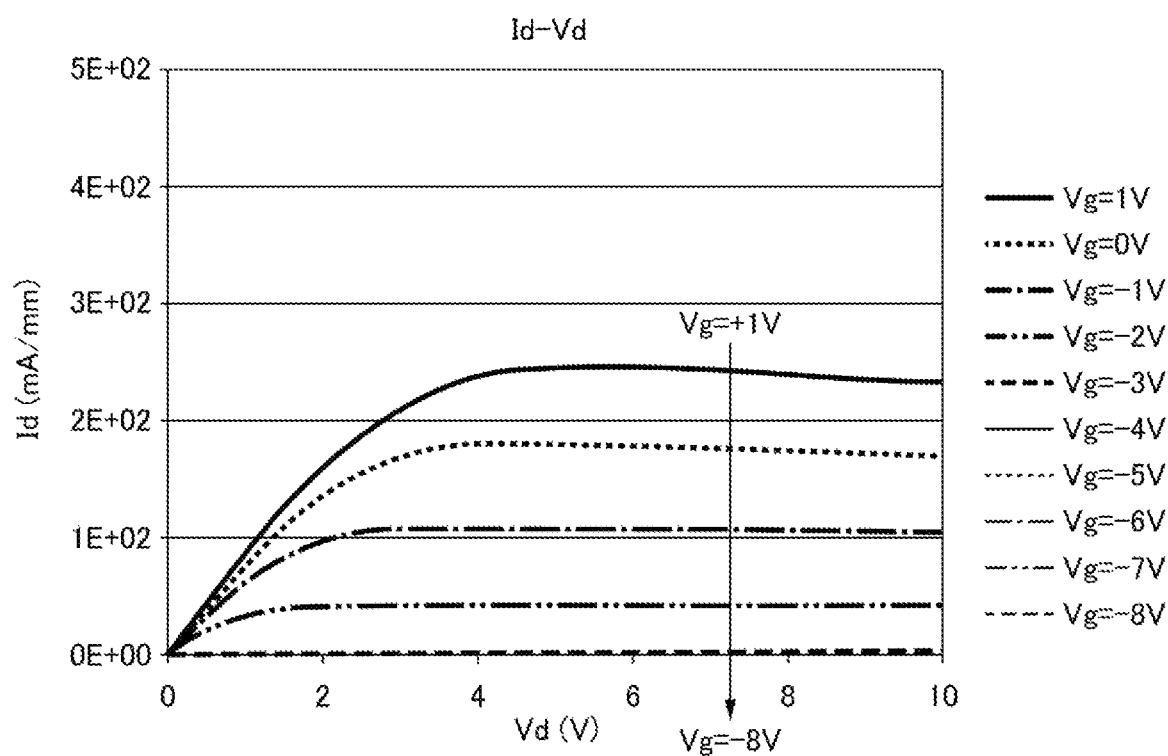
FIG. 6A is a graph showing drain current Id-drain voltage Vd characteristics in a GaN-HEMT produced.
Figure 6B:
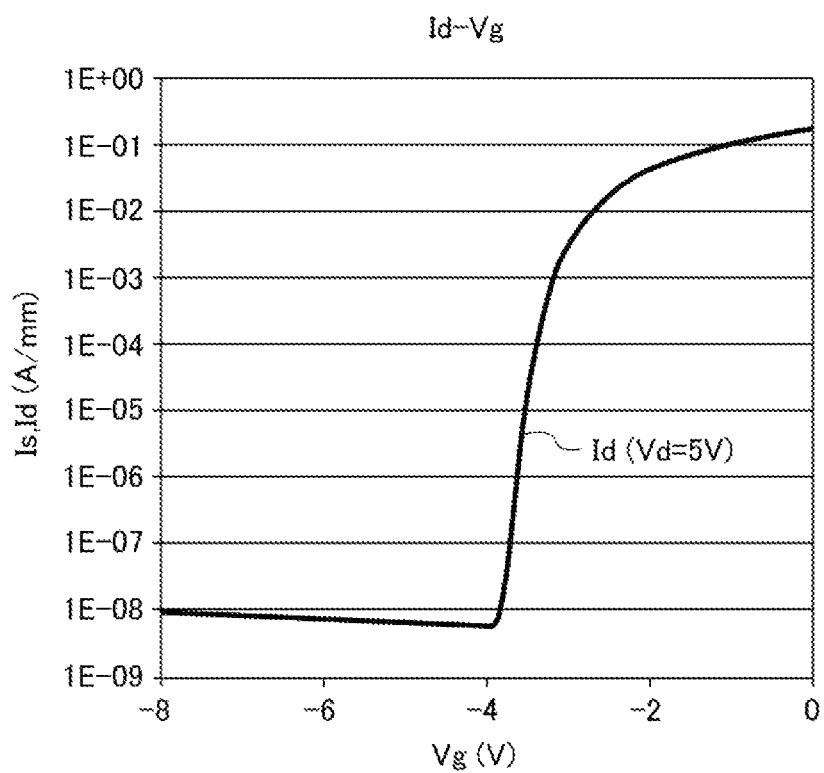
FIG. 6B is a graph showing drain current Id-gate voltage Vg characteristics in the GaN-HEMT produced.

FIG. 6A and FIG. 6B are graphs showing current-voltage characteristics of the GaN-HEMT produced as described above. FIG. 6A shows characteristics of the drain current Id corresponding to the vertical axis relative to the drain voltage Vd corresponding to the horizontal axis, which can be referred to as Id-Vd characteristics. The gate voltage was varied from +1V to -8V with step voltage of -1V. The variation involved no particular abnormality, whereby the drain current Id was favorably modulated with respect to the gate voltage Vg. Furthermore, with the maximum drain voltage being as low as 10V, there were no signs of current collapse.

FIG. 6B shows characteristics of the drain current Id corresponding to the vertical axis with respect to the gate voltage Vg corresponding to the horizontal axis, which can be referred to as Id-Vg characteristics. Absolute values of the drain current Id, corresponding to the vertical axis, are logarithmically plotted. The drain current Id was favorably pinched off with respect to the gate voltage Vg. The modulation characteristics of the gate voltage Vg relative to the drain current Id are normal characteristics with no distinction.

Figure 7A:
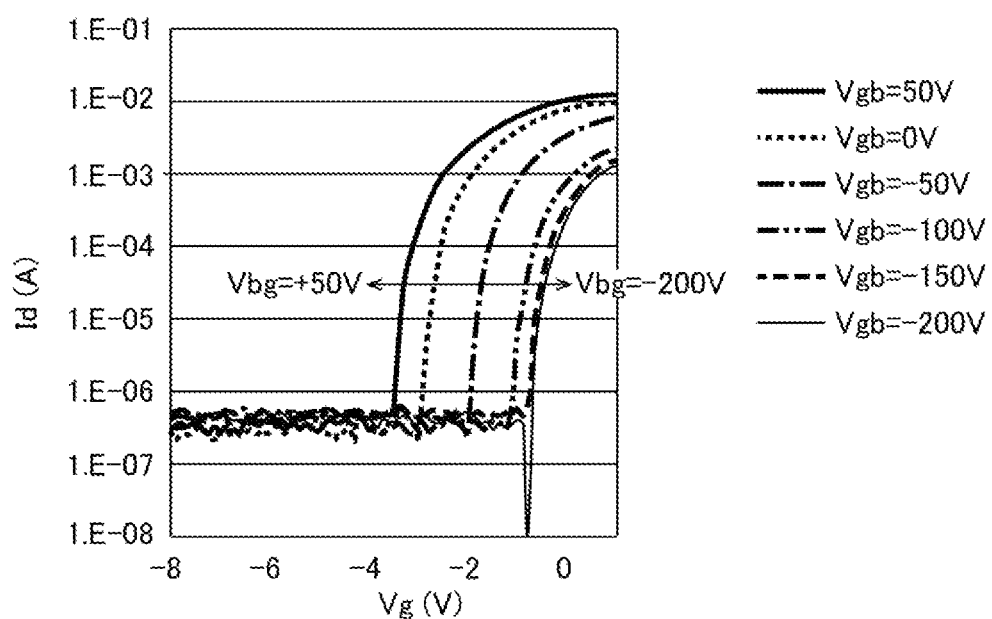
FIG. 7A shows characteristics of modification of the drain current Id by back gate voltage Vbg in the GaN-HEMT, with a result of logarithmically plotting absolute values of the drain current Id corresponding to the vertical axis with respect to the gate voltage Vg corresponding to the horizontal axis.
Figure 7B:
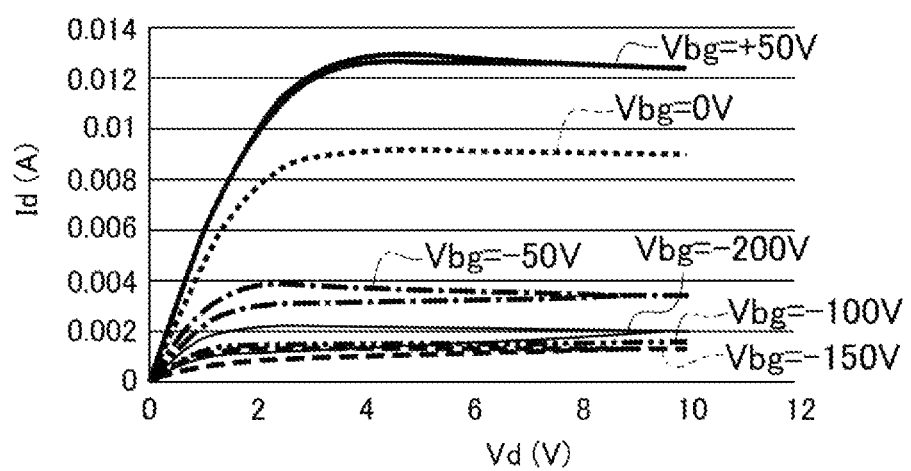
FIG. 7B shows characteristics of modification of the drain current Id by back gate voltage Vbg in the GaN-HEMT, with a result of measuring the drain current Id corresponding to the vertical axis with respect to the drain voltage Vg corresponding to the horizontal axis.
Figure 7C:
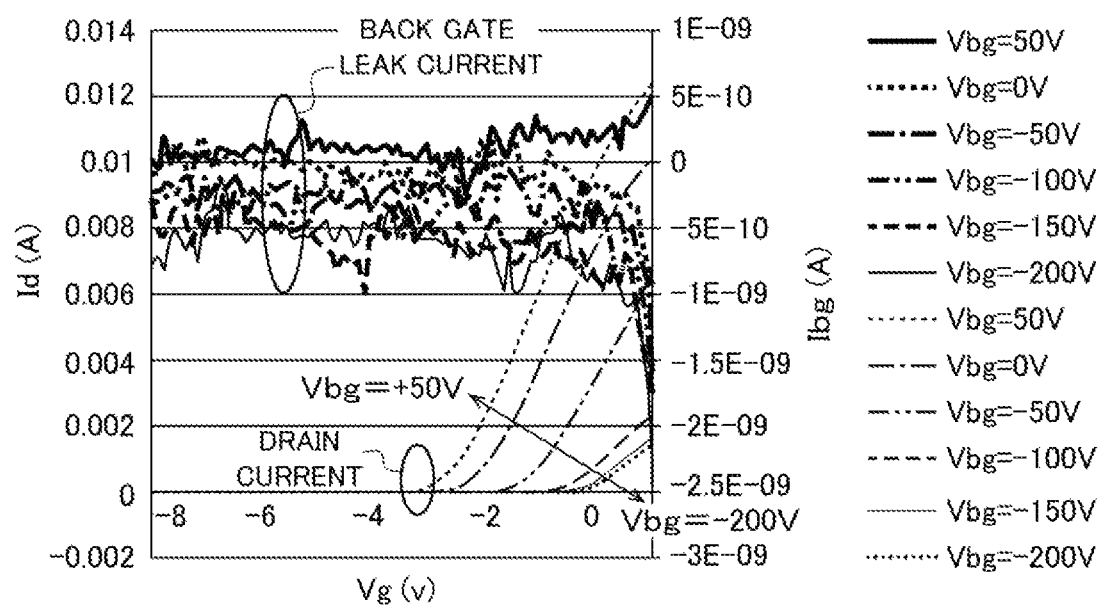
FIG. 7C is a graph showing modification of the drain current Id by back gate voltage Vbg in the GaN-HEMT, with the drain current Id in FIG. 7A plotted in a linear scale.

FIG. 7A to FIG. 7C show characteristics of modulation of the drain current Id, using back gate voltage Vbg of the GaN-HEMT described above. FIG. 7A shows a result of logarithmically plotting absolute values of the drain current Id, corresponding to the vertical axis, with respect to the gate voltage Vg, corresponding to the horizontal axis. Measurement was performed with the drain voltage fixed to 5V, and the back gate voltage varied from +50V to -200V with a voltage step of -50V. It can be seen that the drain current decreases as the negative back gate voltage increases. The modulation efficiency was 1/50 of the surface gate voltage or lower.

FIG. 7B shows a result of measuring the drain current Id, corresponding to the vertical axis, with respect to the drain voltage Vd, corresponding to the horizontal axis. The measurement was performed with the gate voltage set to 0V, and the back gate voltage varied from +50V to -200V with a voltage step of -50V. It can be seen that the drain current Id and the threshold voltage were modulated using the back gate voltage.

FIG. 7C is a graph in which the drain current Id in FIG. 7A is plotted in a linear scale. Back gate leak current (back gate current) was also plotted. In a steady state, the back gate leak current is approximately equal to or lower than $1 \times 10^{-9}$ A. Assuming that leak current carriers are substantially uniformly distributed with the current density based on an element area including the source electrode and the drain electrode being approximately $5 \times 10^{-5}$ A/cm² or lower, the space charge amount of the carriers is ignorable with respect to the amount modulation of the two-dimensional electron concentration using the back gate voltage.

When the back gate effect is measured, the drain voltage is preferably low, for suppressing the current collapse attributable to the location at and around the AlGaN surface as much as possible. The measurement is performed in a linear region so as not to involve concentration of the electric field due to the drain voltage. Still, lower drain voltage leads to smaller measurement current, resulting in more measurement errors, and thus the drain voltage should not be excessively low. Specifically, the drain voltage is preferably within a range between approximately 0.1V and 5V. Further, the back gate voltage Vbg is shielded due to the presence of the two-dimensional electrons formed around the interface between the first crystalline layer 112 and the second crystalline layer 114a. Therefore, the surface potential would not be modulated with the back gate, and thus the back gate voltage is preferably lower (the absolute value thereof is smaller) than the threshold voltage for drain current modulation using the back gate voltage (also referred to as threshold voltage for back gate effect). The threshold voltage for the back gate effect, which depends on the film thickness and the composition of the AlGaN layer producing the two-dimensional electrons as well as the structure and the space charge distribution of the channel layer and/or the buffer layer 106, that is, the sub heterointerface crystalline layer, is generally about −500V to −200V. Furthermore, formation of the space charges of the sub heterointerface crystalline layer is affected by the trap level in the sub heterointerface crystalline layer. Thus, a change in the space charges in the sub heterointerface crystalline layer over time, that is, a change in the back gate effect over time is preferably measured as well.

Figure 8A:
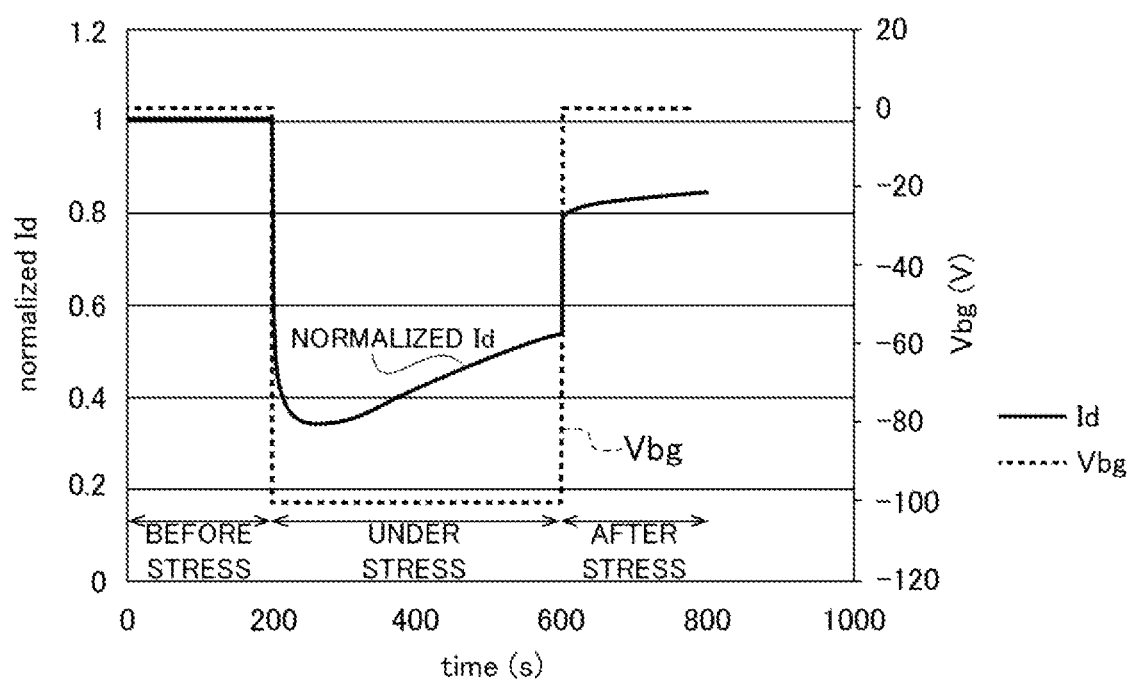
FIG. 8A shows a change in the drain current as a result of applying negative voltage to a back gate electrode in a stepwise manner.
Figure 8B:
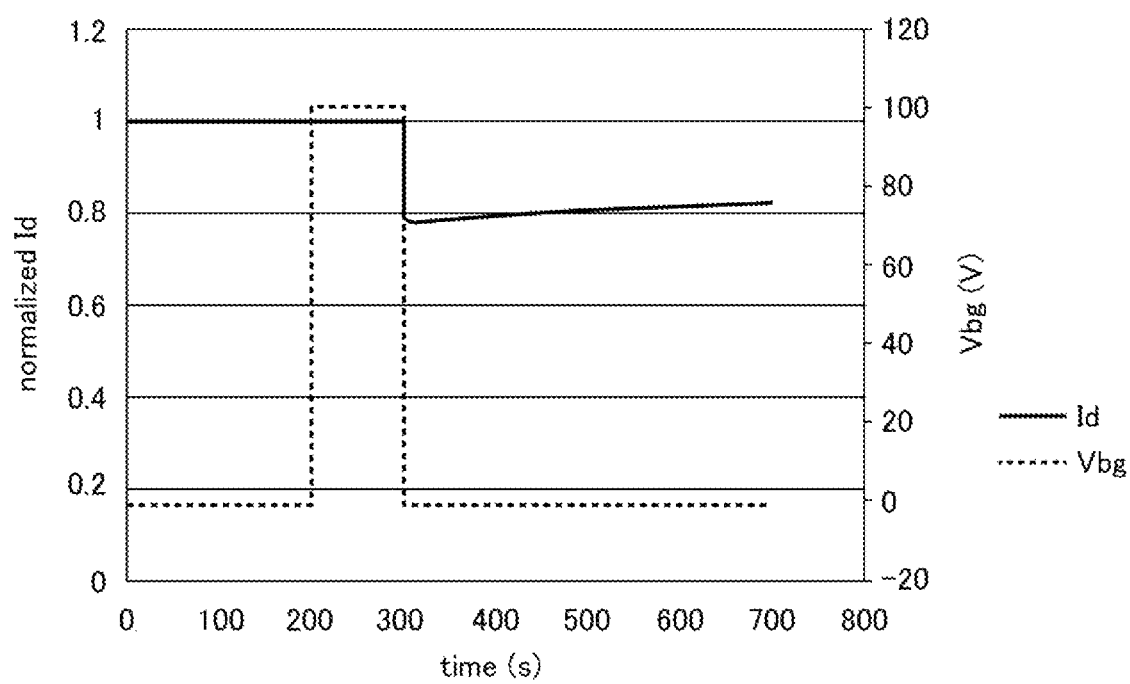
FIG. 8B shows a change in the drain current as a result of applying positive voltage to the back gate electrode in a stepwise manner.

FIG. 8A and FIG. 8B show an example of measurement of the back gate effect of the transistor based on the conditions described above. FIG. 8A shows a case where the back gate voltage is negative voltage, and FIG. 8B shows a case where the back gate voltage is positive voltage. A transistor used for the measurement is the same as that used in the measurement shown in FIGS. 6A and 6B, and in FIG. 7A to FIG. 7C. The vertical axis represents normalized drain current and the horizontal axis represents time (seconds). A change in the drain current over time was measured with the back gate voltage modulated stepwise. The change in the drain current over time was measured in each of a period before the application of the back gate voltage stress (hereinafter, referred to as before stress), a period during which the back gate voltage stress is applied (hereinafter, referred to as under stress), and a period after the application of the back gate voltage stress (hereinafter, referred to as after stress). In all the measurements, the drain voltage was fixed to 1V, and the drain current was measured at an interval of 0.1 seconds.

In FIG. 8A, the back gate stress voltage was −100V. The measurement time was 200 seconds before stress, 400 seconds under stress, and 200 seconds after stress. In FIG. 8B, the back gate stress voltage was +100V. The measurement time was 200 seconds before stress, 100 seconds under stress, and 400 second after stress. The back gate voltage was 0V at all points before stress and after stress (the back gate voltage was 0V at all points before stress and after stress also in data described later). The drain current was normalized based on the last drain current before the back gate voltage stress (the drain current based on the back gate voltage discussed below is of a normalized value).

Detailed descriptions will be first given on a case where the back gate stress voltage is negative voltage. First of all, the drain current decreases in a time period that is equal to or shorter than 0.1 seconds immediately after application of the negative back gate voltage stress. Then, the current decreased for several tens of seconds. Thereafter, the drain current gently increased. The drain current after the back gate voltage stress was lower than that before the back gate voltage stress. It seems that this current decrease is associated with the current collapse due to the drain voltage stress, as will be described in detail later.

FIG. 9A to FIG. 9C and FIG. 10A to FIG. 10C show a mechanism behind a change in the drain current due to the back gate effect. A model was established based on the model in Non-Patent Document 3, so that the back gate voltage is applied to limited layers, and not only emission of holes but also emission of electron from the trap level is taken into consideration. The thickness of the layer to which the back gate voltage is applied can be calculated (as will be described in detail later) based on voltage dependency of the decreasing amount of the drain current, changing within 0.1 seconds or shorter before the charges are emitted from the trap level after the negative voltage has been applied to the back gate. The modulation of the drain current due to the back gate voltage is caused by the modulation of an electric field in a channel layer portion immediately below the two-dimensional electrons due to the back gate potential. The magnitude of the modulation varies depending on the thickness of the layer to which the back gate voltage is applied as described above, and on a change in the space charges in the layer caused by charging and discharging at the trap level.

Figure 9A:
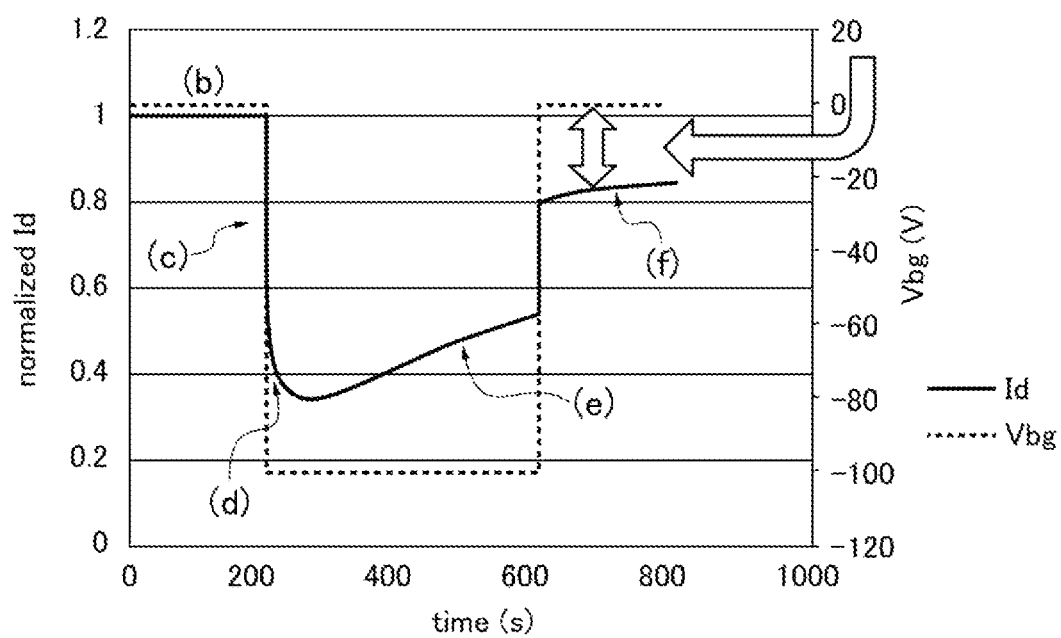
FIG. 9A shows a result of measuring a change in the drain current due to negative back gate stress voltage.
Figure 9B:
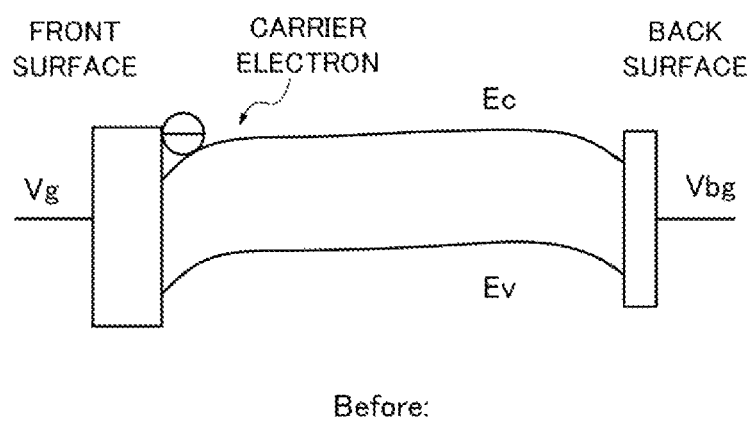
FIG. 9B shows a band energy profile in a state before application of back gate stress voltage.

FIG. 9A shows a result of measuring a change in the drain current, in the case where the back gate stress voltage is negative voltage. FIG. 9B is a diagram showing a band in the state before the back gate stress. An upper section is a rather detailed view of the band. A left side corresponds to a surface (gate electrode) side. A right side corresponds to a substrate side. A conduction band Ec is shown on an upper side. An energy profile of a valence band Ev is shown on a lower side. To simplify the description, the band energy, in the initial state, which is greater on the substrate side than the two-dimensional electrons is schematically represented by a straight line as in the lower section of FIG. 9B. The energy profile of the band deforms from the straight line due to the initial fixed charges. Still, for the description of the current collapse, it suffices if a change in the space charges due to a change in potential is taken into consideration, and thus such a deformation can be omitted as in this diagram showing the band.

Figure 9C:
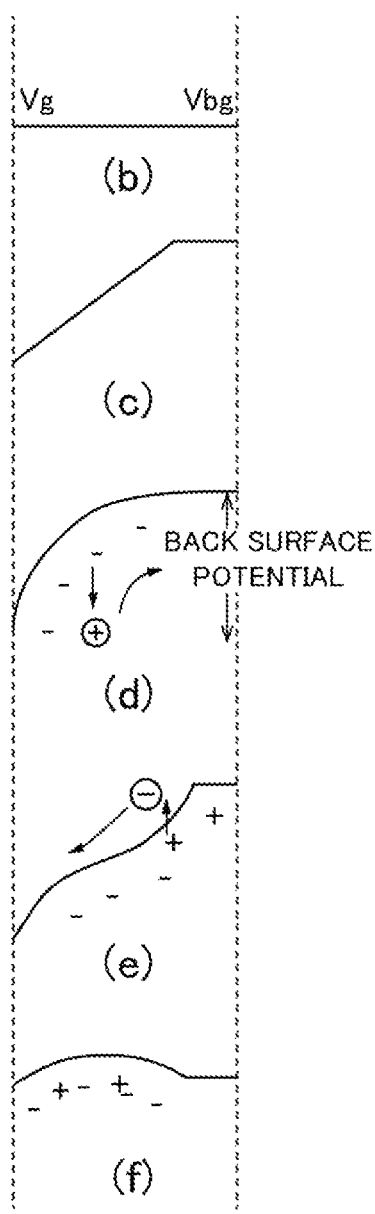
FIG. 9C shows an overview of a band diagram at each time point.

FIG. 9C is a schematic view of the band at each time point in FIG. 9A. A section (b) in FIG. 9C shows a band profile in the initial state as described above. A section (c) in FIG. 9C shows a band profile immediately after the negative voltage has been applied to the back gate. Assuming that the space charges changes, a change in the electric field profile due to the back gate is uniform. The current decreasing amount is approximately proportional to the back gate voltage. A factor of this proportionality corresponds to the thickness of the layer (hereinafter, referred to as a depletion layer) to which the back gate voltage is applied as described above. While the back gate stress is being applied, the space charges in the depletion layer change and the intensity of the electric field below the channel and the current changes, while the back gate voltage remains to be the same. When the change in the space charges is attributable to the trap level, separation of the quasi Fermi levels for electrons and holes in the depletion layer occurs, resulting in the space charges due to carrier emission from the trap level. A section (d) in FIG. 9C shows a state where the drain current has decreased with time. Negative space charges increase due to the "hole emission" from the hole trap level. As a result, an upwardly convex potential profile is obtained. Thus, an electric field below the channel increases to lower the two-dimensional current, whereby the drain current decreases.

A section (e) in FIG. 9C shows a state where the drain current has increased with time. A downwardly convex potential profile is obtained with positive space charges increasing due to the occurrence of "electron emission" from the electron trap level. Thus, the electric field below the channel decreases to increase the two-dimensional current, whereby the drain current increases. In this sample, both "hole emission" and "electron emission" occurred. These current components depend on the type and the concentration of the trap level of the sub heterointerface crystalline layer. A section (f) in FIG. 9C shows a state after the back gate stress. It is shown that despite the back gate voltage being 0V, the drain current is changed due to a change in the space charges under stress remaining in the depletion layer. If the "hole emission" is predominant, the upwardly convex profile remains, and the drain current before stress becomes lower On the other hand, if the "electron emission" is predominant, the decrease in the drain current does not occur.

Figure 10A:
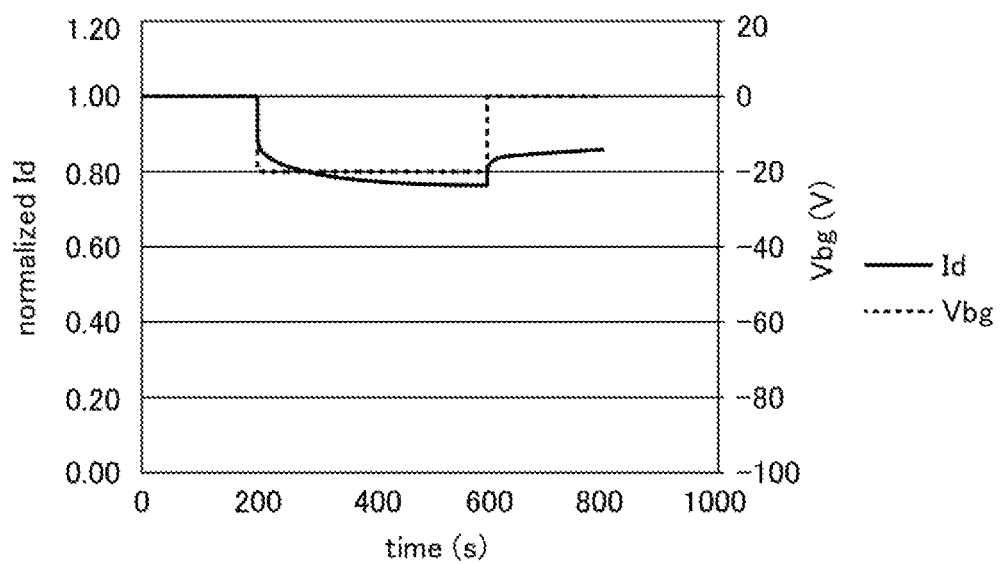
FIG. 10A shows a change in the drain current with negative back gate voltage varied.
Figure 10B:
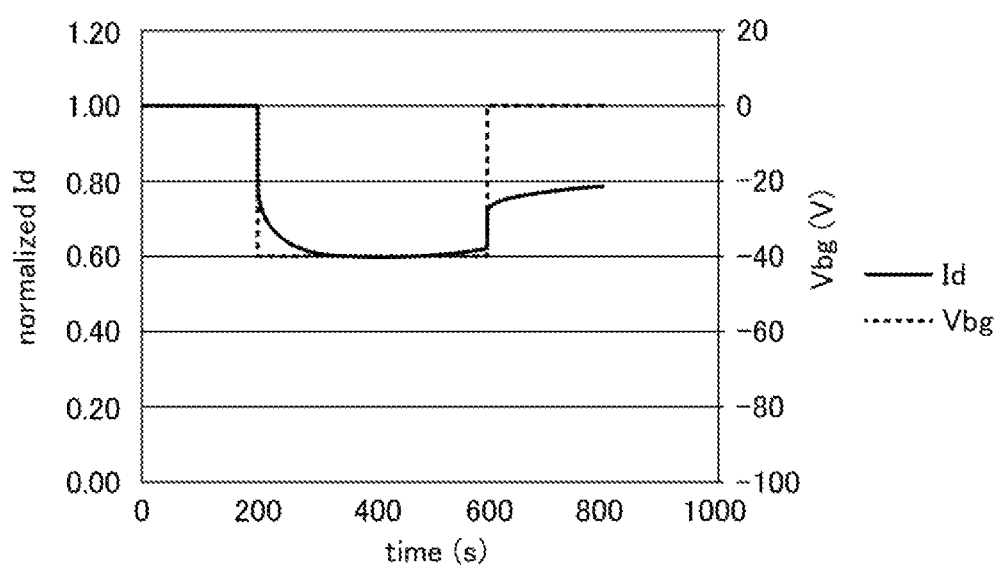
FIG. 10B shows a change in the drain current with negative back gate voltage varied.
Figure 10C:
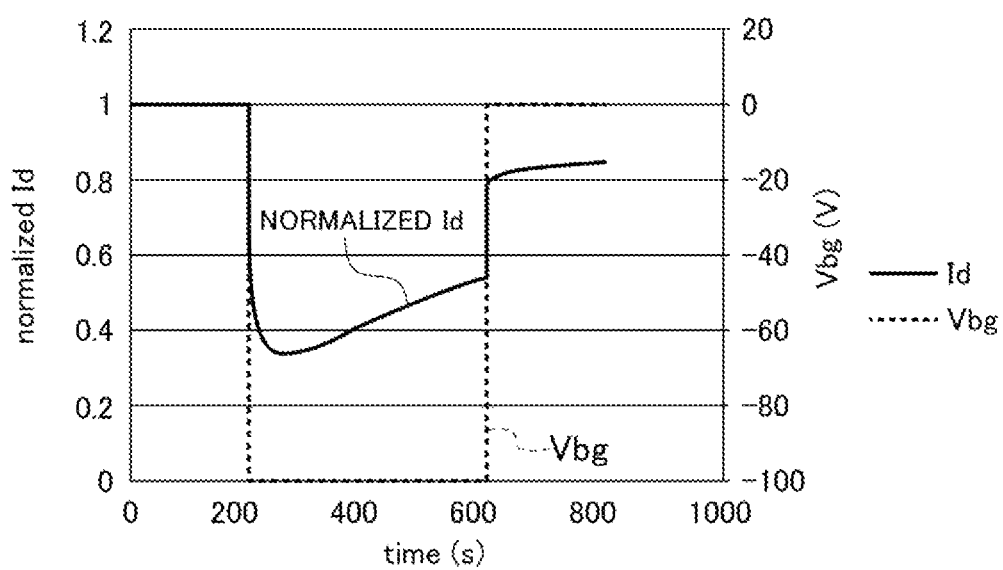
FIG. 10C shows a change in the drain current with negative back gate voltage varied.

FIG. 10A to FIG. 10C show a result of measuring a change in the drain current over time with the back gate stress voltage changed, in a case that the back gate voltage is negative voltage. FIG. 10C is a diagram that is the same as FIG. 8A, but with the back gate stress voltage set to be −100V. FIG. 10A and FIG. 10B show cases where the back gate stress voltage is set to be −20V and −40V, respectively. Other measurement conditions were the same as those in the case of FIG. 10C. A change in current under back gate stress includes an early change that is current decreasing within 0.1 seconds after the stress start. A larger absolute value of the back gate voltage results in the current decreasing more in such an event. The current changes under stress, wherein FIG. 10A shows the current decreasing only, and FIG. 10B shows an increasing component appearing at an intermediate point in the decreasing change of the current. A time constant of the current decrease becomes smaller along with an increase of an absolute value of the back gate voltage. FIG. 10C shows the increasing component of the current being larger due to further reduction of the time constant of the current decrease. As in the case of the current decrease, a larger absolute value of the back gate voltage resulted in a smaller time constant of the current increase. The increasing and decreasing components of the current will be analyzed more in detail later.

The magnitudes of the current decrease after stress in FIG. 10B and FIG. 10C do not conform to the order of the magnitudes of the back gate voltage. The current decrease after stress in the case where the back gate voltage stress is −40V as shown in FIG. 10B is larger than the current decrease after stress in the case where the back gate voltage stress is −100V as shown in FIG. 10C. The reason behind this will be described below.

FIG. 11A to FIG. 11D show results of measuring a change in the drain current with the back gate voltage stress time set to be shorter than that in the measurement in FIG. 8A. The stress time was 200 seconds, 100 seconds, 40 seconds, 20 seconds, 10 seconds, 4 seconds, and 2 seconds (1 second). The measurement results are shown in an overlapping manner. The back gate voltage was −20V in FIG. 11A, −40V in FIG. 11B, −100V in FIG. 11C, and −200 V in FIG. 11D. The time before stress and the measurement time after stress were respectively changed to 50 seconds and 200 seconds, but such changes have no impact on the fundamental discussion (the time before stress was changed to 200 seconds only for the measurement performed with −100V, and this also has no impact on the fundamental content of the discussion).

Figure 11A:
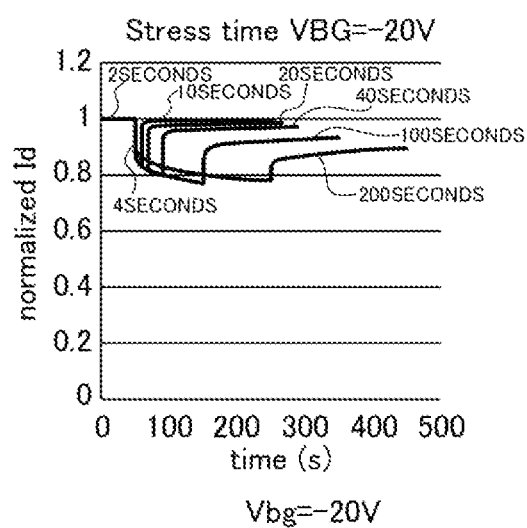
FIG. 11A shows a change in the drain current with stress time with negative back gate voltage varied.
Figure 11B:
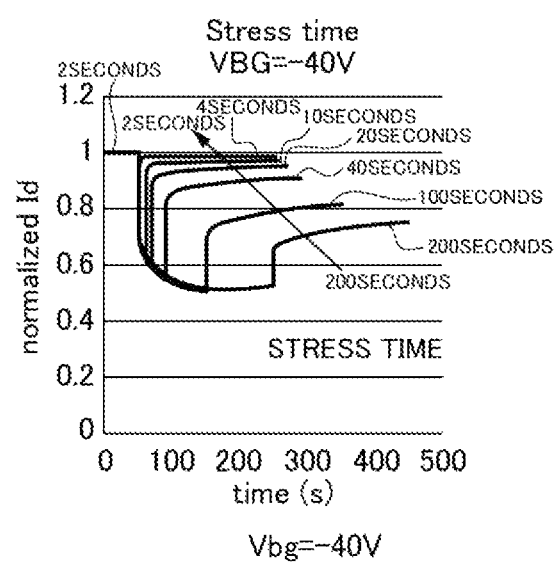
FIG. 11B shows a change in the drain current with stress time with negative back gate voltage varied.
Figure 11C:
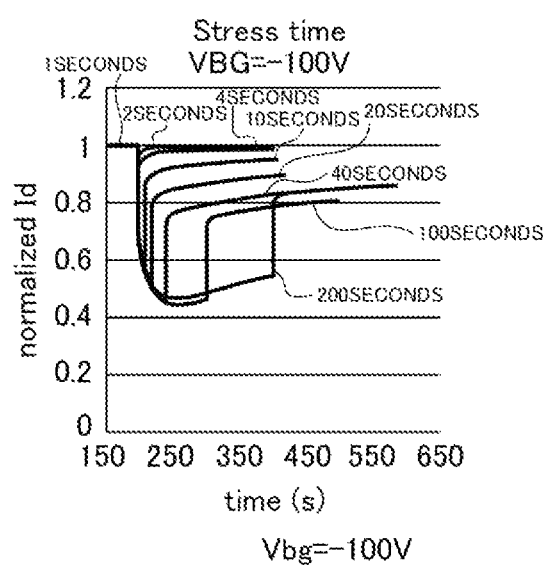
FIG. 11C shows a change in the drain current with stress time with negative back gate voltage varied.
Figure 11D:
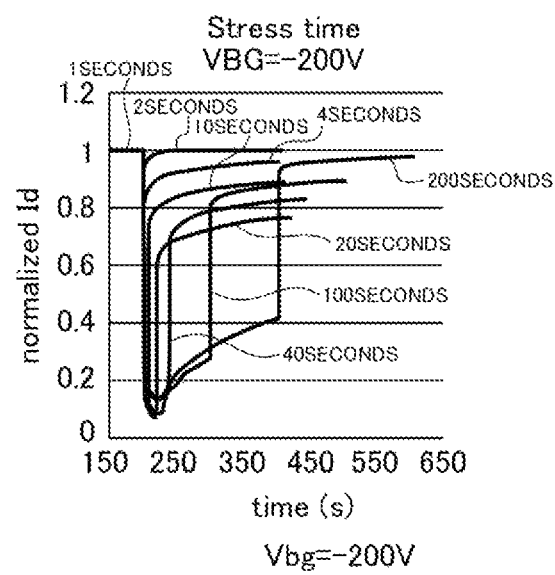
FIG. 11D shows a change in the drain current with stress time with negative back gate voltage varied.

In a case where Vbg=−20V as shown in FIG. 11A, the drain current during the stress application decreased with time. Although the drain current after stress increases to be restored, the resultant drain current was lower than the drain current before stress. Between cases different from each other in stress time, one with a longer stress time results in lower drain current after stress, because logically, a change in the drain current over time under stress is the same and the recovery amount after stress is substantially the same. Such a phenomenon occurs in the case of Vbg=−40V shown in FIG. 11B, but with a difference that the "time constant" of the drain current decrease during stress is smaller. In the case of Vbg=−100V shown in FIG. 11C, the drain current decreases in an initial period under stress. The "time constant" in this event is even smaller than that in the case of Vbg=−40. In cases with a stress time of 200 seconds and with a stress time of 100 seconds, the drain current under stress decreases immediately after the stress application, but starts to increase 50 seconds after the stress start. In 200 seconds under stress, the drain current increased during the last 100 seconds under stress. As described above, the current restoration amount after stress is the same between the cases, and thus the decreased amount of the drain current after stress is smaller in the case of a stress time of 200 seconds than in the case of a stress time of 100 seconds. In the case of Vbg=−200V shown in FIG. 11D, the time constant of the drain current decrease under stress is small, resulting in the drain current starting to increase around 20 seconds after the stress start. The time constant of the increasing component of the drain current is smaller and the current increasing component under stress is large than that in the case of a stress voltage of −100V shown in FIG. 11C. The drain current starts to increase approximately 20 seconds after the stress start, and thus the drain current after stress increases as the stress time increases from 40 seconds, to 100 seconds, and to 200 seconds. That is, the drain current after stress decreases less accordingly.

As described above, the current decrease after the back gate voltage stress is determined by a change in the drain current under stress. The current changes under stress, to decrease due to "hole emission" from the trap level, and to increase due to "electron emission" from the trap level. Accordingly, a component as a result of subtracting the "electron emission" component from the "hole emission" component corresponds to the current decrease after back gate voltage stress. A time constant of a change in the "hole emission" component and the "electron emission" component depends on the back gate voltage, that is, changes more with a higher back gate voltage. Accordingly, the amount of current decrease after back gate voltage stress changes based on relationship between the back gate voltage and the back gate stress time. Therefore, an evaluation method, for suppressing the current collapse, using the current decrease after stress as an index might fail to achieve correct evaluation, unless the back gate voltage and the stress time are set as appropriate in accordance with the characteristics of the sub heterointerface crystalline layer. For this reason, the inventors believe that an appropriate evaluation index would be a change in the drain current over time under stress with negative back gate voltage.

Figure 12A:
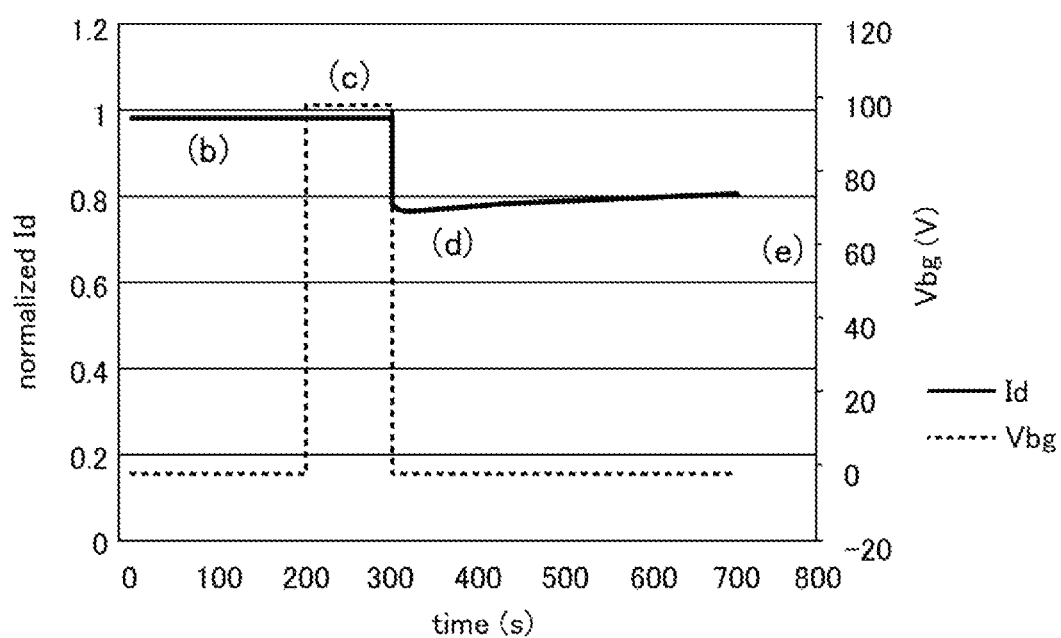
FIG. 12A shows a result of measuring a change in the drain current in a case of positive back gate stress voltage.
Figure 12B:
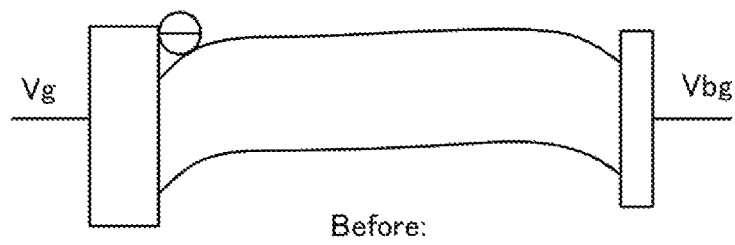
FIG. 12B shows a band energy profile in a state before application of back gate stress voltage.
Figure 12C:
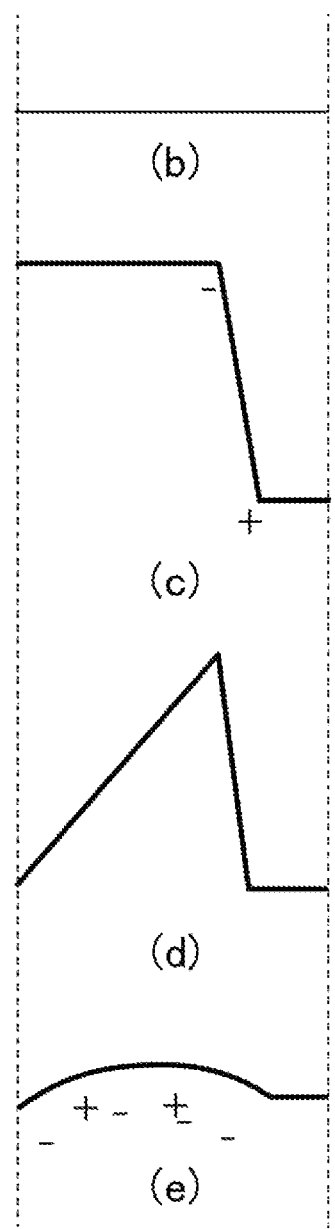
FIG. 12C shows overview of a band diagram at each point.

FIG. 12A shows a result of measuring a change in the drain current with positive back gate stress voltage. FIG. 12B is a band diagram showing a state before back gate stress. FIG. 12C simply shows the band profile with a single line as in FIG. 9C. A section (b) in FIG. 12C corresponds to a simple illustration on a lower side FIG. 12B. The section (b) in FIG. 12C shows a state before back gate stress. The drain current at this time is in the state shown in the section (b) in FIG. 12A. A section (c) in FIG. 12C is an imaginary view of the profile of the band energy corresponding to application of positive stress voltage to the back gate. The drain current slightly increased in the state shown in a section (c) in FIG. 12C, but with no large change under stress. There is no large increase in the back gate leak current under stress from FIG. 7C. Accordingly, this indicates that the potential is formed with the fixed space charges, and not with the current flowing. In this case, an upwardly convex energy potential is formed, and thus the space charges are negative charges. Application of voltage on both sides of a layer with the negative space charges results in a strong electric field on the positive side. In the steady state, the space charge distribution depends on defect concentration, which is high on the substrate side. Thus, the electric field is expected to be concentrated on the substrate side of the sub heterointerface crystalline layer. A section (d) in FIG. 12C shows a state after stress, that is, immediately after the stress voltage has become 0V. If there is no change in the space charge distribution, the potential is raised in accordance with the level of concentration of the electric field under stress. That is, the current decreases regardless of the "hole emission" from the sub heterointerface crystalline layer. Accordingly, this means that the drain current decreases even with a crystal free of current collapse due to the drain voltage stress. Thus, this current decrease is not suitable for the evaluation index for the current collapse due to the drain voltage stress. A section (e) in FIG. 12C shows how the space charges recover to the initial state as time elapses after stress. The current decrease in the initial period after stress in the case of positive back gate voltage is similar to that in the initial state under stress in the case of negative back gate voltage.

Figure 13A:
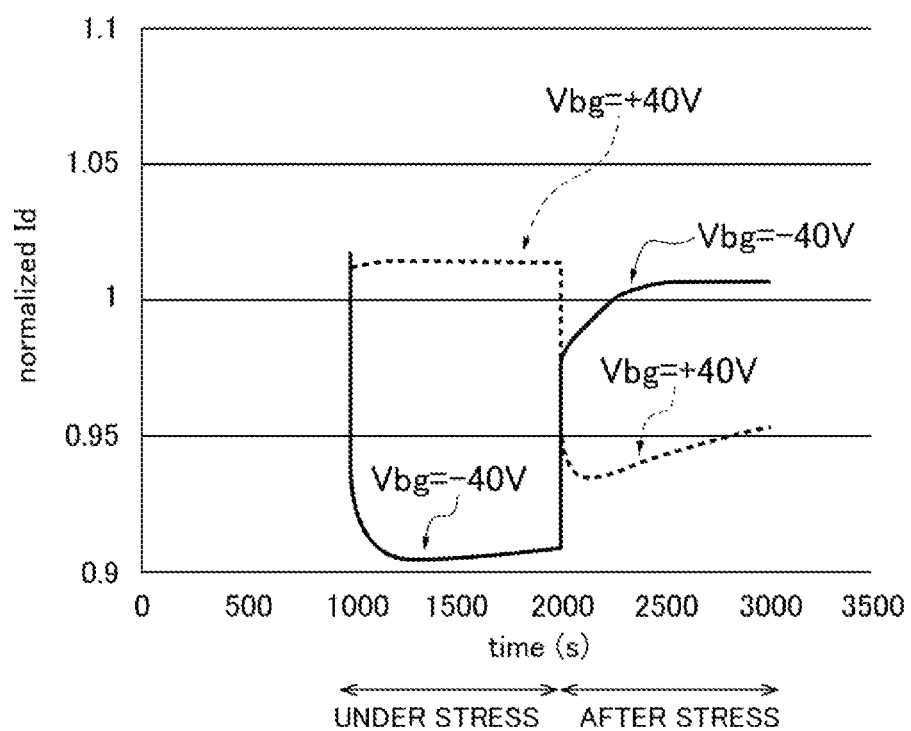
FIG. 13A shows stress voltage polarity comparison in a case that "hole emission" is predominant.
Figure 13B:
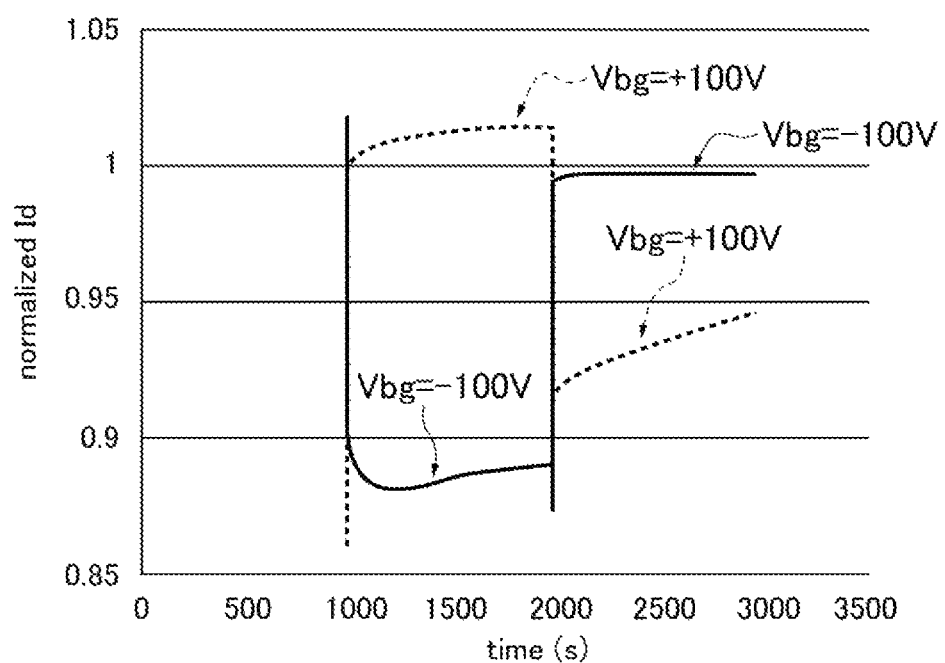
FIG. 13B shows stress voltage polarity comparison in a case that "hole emission" is predominant.

A comparison will be made between a change in the drain current under stress with negative back gate voltage and a change in the drain current after stress with positive back gate voltage. FIG. 13A and FIG. 13B show measurement on a change in the drain current with respect to the back gate voltage, in a transistor produced using a wafer different from that in the case of FIG. 10A to FIG. 10C. The structure of the transistor was the same as that in the case of FIG. 10A to FIG. 10C. The drain voltage and the gate voltage were also the same as those in FIG. 10A to FIG. 10C. A time before stress, a time under stress, and a time after stress were all set to be 1,000 seconds. The back gate stress voltage was +40V and −40V in FIG. 13A and was +100V and −100V in FIG. 13B. The drain current change under stress with the back gate voltage of −40V and the drain current change after stress with the back gate voltage of +40V in FIG. 13A have common characteristics that a sharp decrease of drain current is followed by the current first decreasing and then increasing. However, the case of +40V involved a smaller amount of the sharp decrease in the drain current and a larger current increase. The case where the back gate voltage is −100V was almost the same as the case of −40V. Meanwhile, there was no initial decrease in drain current after stress in the case of +100V, supposedly because the current increasing component increased due to the increase in the back gate voltage as in FIG. 10A to FIG. 10C. It is possible that the "half recovery" phenomenon due to the hole emission as described in Non-Patent Document 3 may have contributed to the smaller initial drain current decreasing component after stress with positive back gate voltage than that under stress with the negative back gate voltage. It seems that a portion where the electric field is concentrated on the wafer side of the sub heterointerface crystalline layer in the section (c) in FIG. 12C, which starts to be relaxed in the section (d) in FIG. 12C, serves as a component contributing to the increase in the current increasing component after stress with positive back gate voltage. A detailed mechanism behind the concentration of the electric field in a deep portion in the sub heterointerface crystalline layer under stress with positive back gate voltage and the relaxation of electric field after stress is unknown.

Figure 14A:
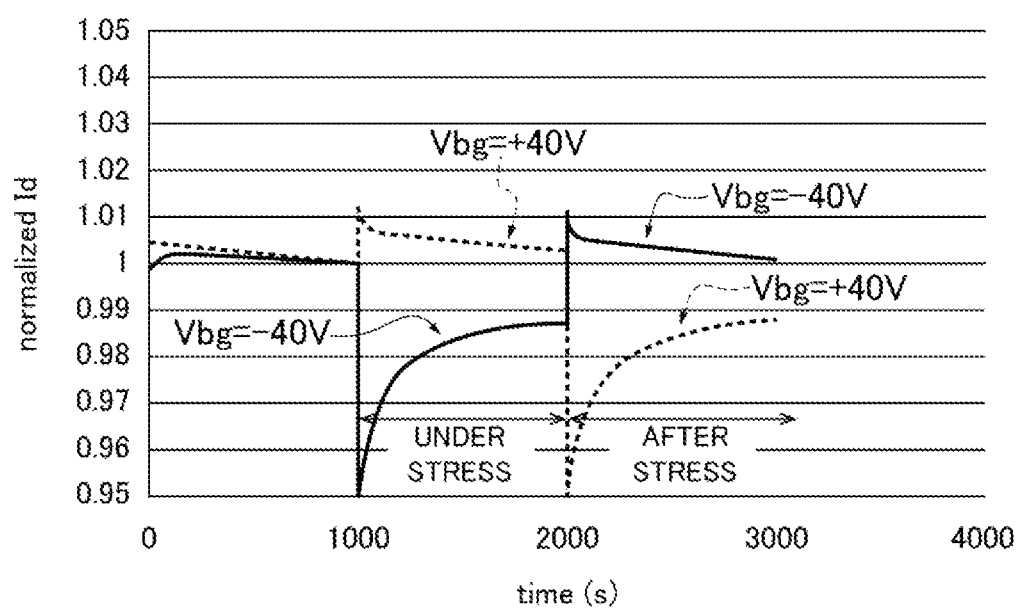
FIG. 14A shows stress voltage polarity comparison in a case that "electron emission" is predominant.
Figure 14B:
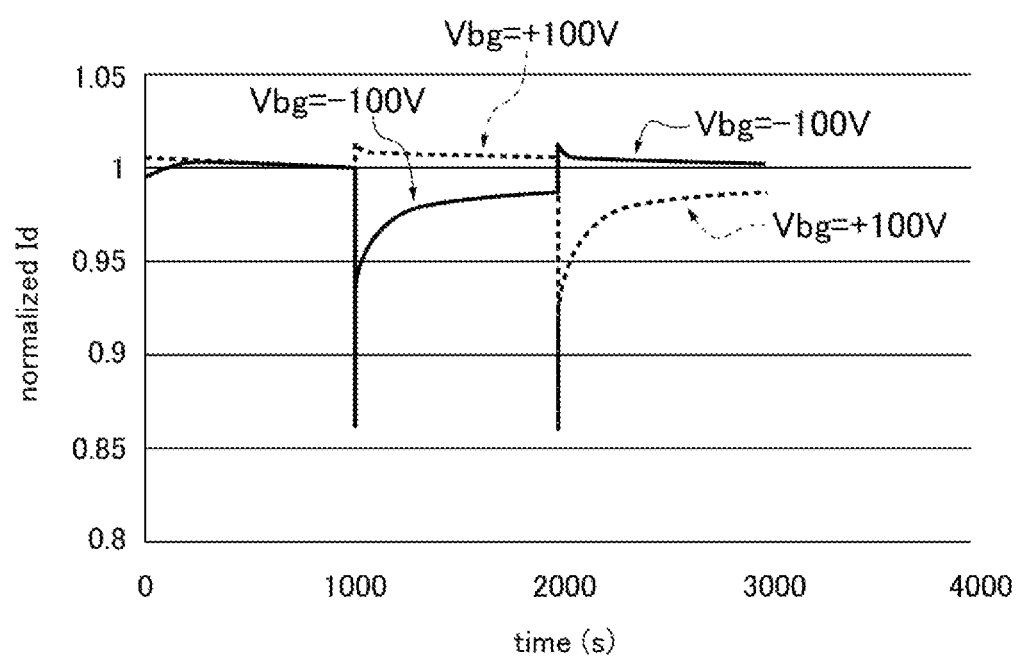
FIG. 14B shows stress voltage polarity comparison in a case that "electron emission" is predominant.

The measurement conditions in FIG. 14A and FIG. 14B were the same as those in FIG. 13A and FIG. 13B. However, a wafer used for producing the transistor is different between these cases. A crystal with the current increasing component based on "electron emission" being predominant under stress with the negative back gate voltage was, in comparison with that used for FIG. 13A and FIG. 13B. The back gate stress voltage was +40V and −40V in FIG. 14A, and was +100V and −100V in FIG. 14B. The drain current change under stress with back gate voltage of −40V in FIG. 14A and the drain current change after stress with back gate voltage of +40V in FIG. 14B have the same characteristics. The sharp decrease in the drain current was followed by an increase in the current. The same applies to the cases in FIG. 14B with the back gate stress being 100V. Due to the amount of sharp decrease in the drain current being substantially the same, a depletion layer due to the back gate voltage is similarly formed in the sub heterointerface crystalline layer. Thus, the portion where the electric field is concentrated on the wafer in the section (d) in FIG. 12C would be an evidence that the electric field is formed to be concentrated on the wafer side of the depletion layer. One reason behind the drain current increasing component being substantially the same between a state under stress with the negative back gate voltage and a state after stress with the positive back gate voltage is the predominant "electron emission" resulting in the absence of the "half recovery" caused by "hole emission".

Figure 15A:
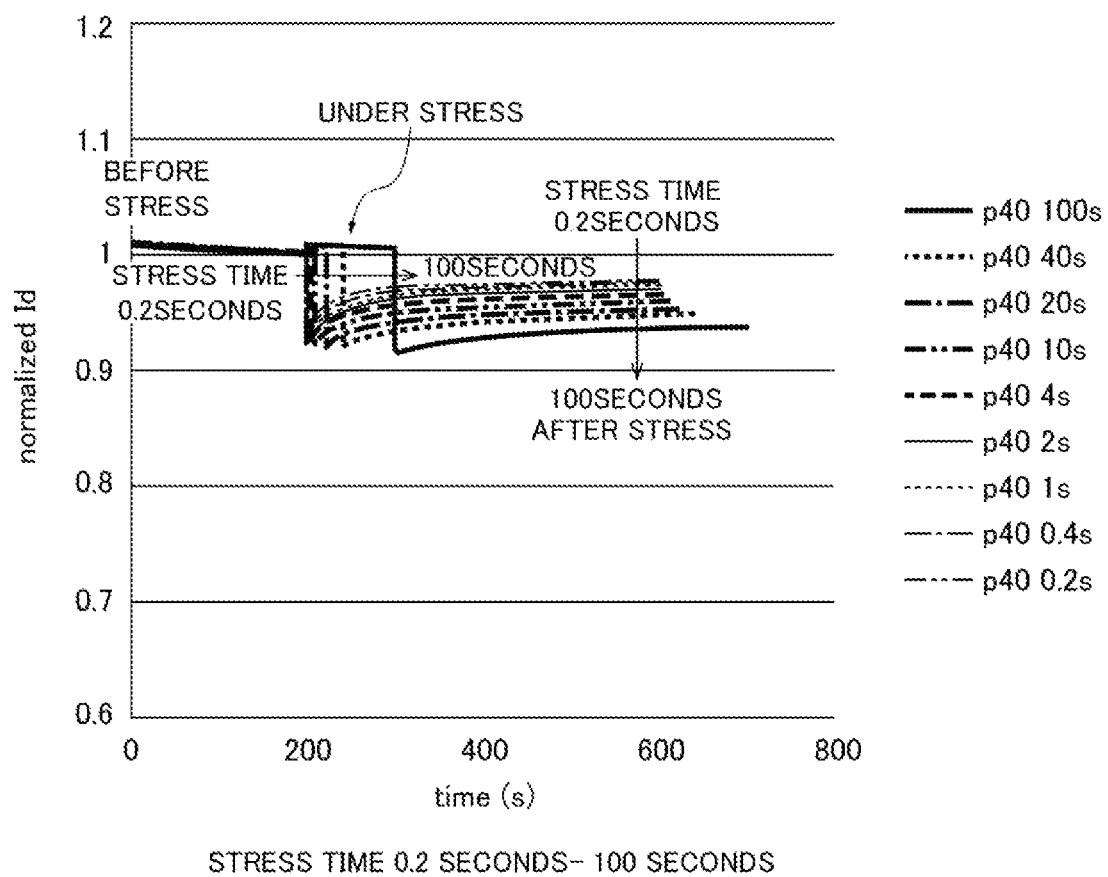
FIG. 15A shows dependency of back gate characteristics with respect to stress time, in a case that the back gate voltage is positive voltage.
Figure 15B:
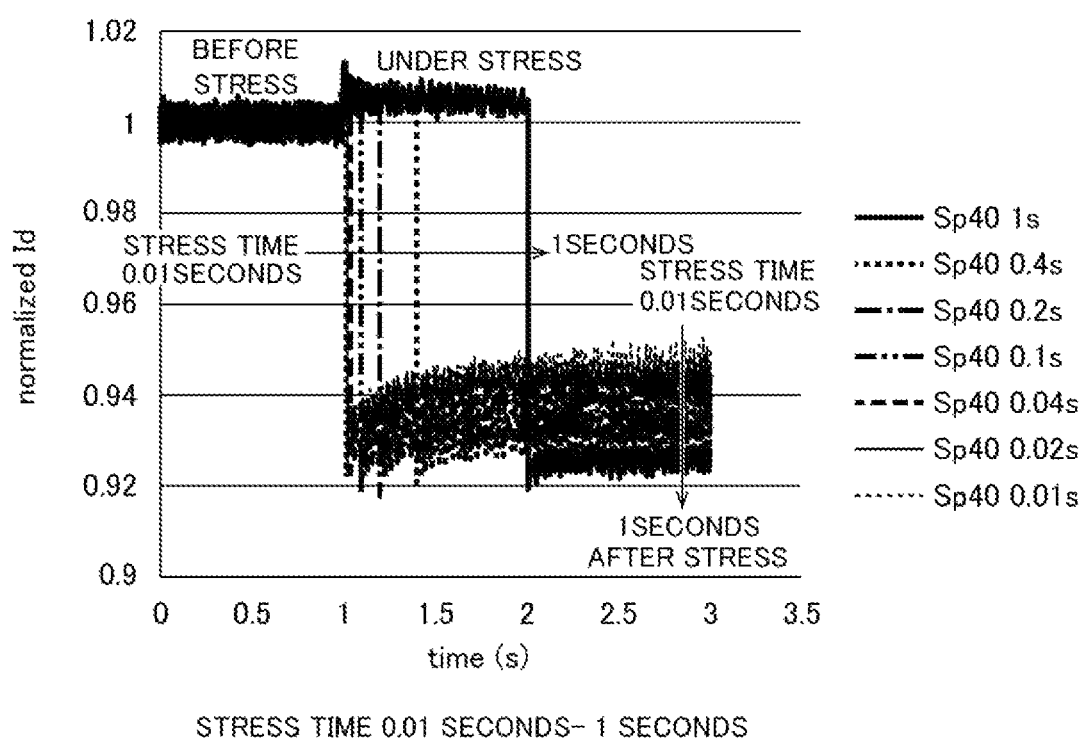
FIG. 15B shows dependency of back gate characteristics with respect to stress time, in a case that the back gate voltage is positive voltage.

FIG. 15A and FIG. 15B show a result of measuring a change in drain current under stress as in FIG. 8, with different back gate stress times. Note that the stress voltage was +40V. The stress time was 0.2 seconds to 100 seconds in FIG. 15A and was 0.01 seconds to 1 second in FIG. 15B. In both cases, after stress, the sharp decrease in the drain current was followed by the current increasing with time, with the increasing rate gradually decreasing with time. The sharp drain current decrease is constant with respect to the stress time. Thus, it can be understood that the concentration of electric field on the wafer side of the sub heterointerface crystalline layer in the section (c) in FIG. 12C is a phenomenon only occurring in a short period of time that is 0.01 seconds or shorter. Furthermore, the drain current increasing component depends on the stress time, indicating that a plurality of phenomena are involved under stress with the positive back gate voltage.

As described above, the drain current decrease after stress with the positive back gate stress voltage involves phenomena other than the cause of the current collapse, and thus is not suitable as the index for the current collapse due to the drain voltage stress. Thus, the current change under stress with the negative back gate voltage may be suitably used for the evaluation. By providing a wafer in which the drain current under stress "does not decrease with time" and "the electron emission speed is higher than the hole emission speed", a transistor that is less likely to have or is free of current collapse due to drain voltage stress attributable to the sub heterointerface crystalline layer can be produced.

(Current Collapse and Back Gate Collapse)

Figure 16A:
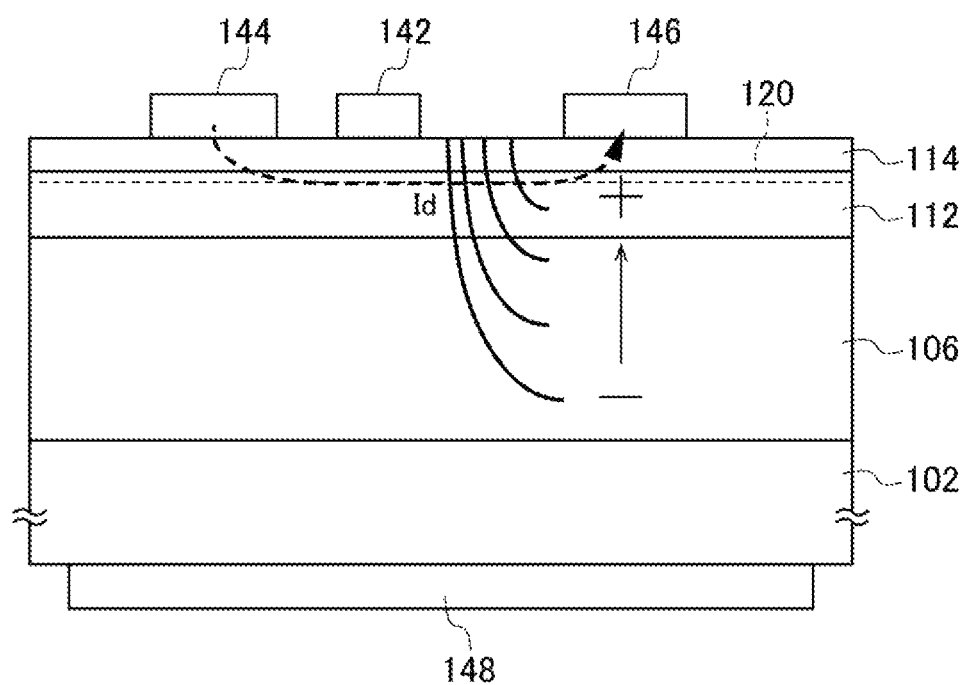
FIG. 16A shows a schematic view of an equipotential line in a buffer layer in a case that positive drain voltage stress is applied.
Figure 16B:
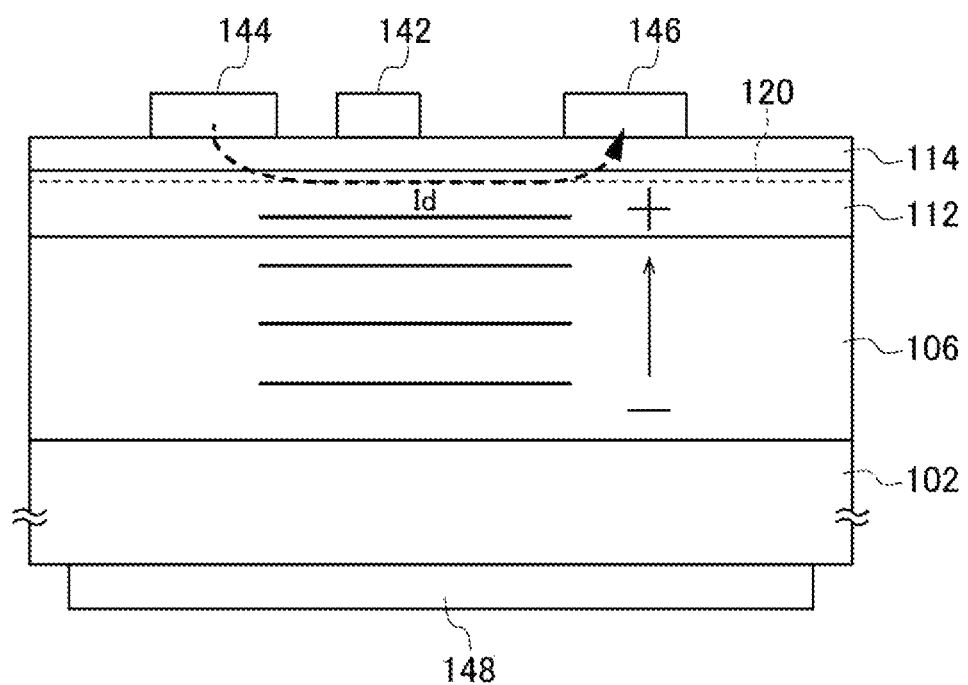
FIG. 16B shows a schematic view of an equipotential line in a buffer layer in a case that negative back gate voltage stress is applied.

Referring to FIG. 16A and FIG. 16B, relationship between a state under drain voltage stress in the OFF state and a state where the back gate voltage is negative voltage will be described, in relation to the current collapse attributable to the sub heterointerface crystalline layer. FIG. 16A is a diagram schematically showing equipotential lines as a result of applying positive drain voltage stress. When the transistor is in the OFF state, the wafer back surface electrode 148 is substantially at 0V. Thus, a potential distribution along the film thickness direction is formed. The gate voltage is higher on the negative side than the pinch off voltage, whereby a lateral electric field is formed in the sub heterointerface crystalline layer. This electric field causes the carrier emission from the trap level. Then, when negative space charges are produced by "hole emission", the current collapse occurs. In the film thickness direction, a potential difference corresponding to the maximum drain voltage is produced with respect to the back surface electrode. This potential difference decreases in response to the surface potential decreasing toward the gate side. An electric field in the lateral direction is further produced, which is strong on the front surface side of the "sub heterointerface crystalline layer" and thus cannot be ignored.

FIG. 16B is a diagram schematically showing equipotential lines as a result of applying negative back gate voltage stress. With the drain voltage being as low as about 1 V, an electric field is uniformly formed over the sub heterointerface crystalline layer. The electric field is formed in the vertical direction only. Still, the generation of space charges due to "hole emission" caused by the electric field occurs in a manner similar to that in the case of the electric field in the lateral direction. Thus, the current collapse due to the drain voltage stress can be evaluated with a change in the drain current due to the negative back gate voltage stress. At this time, if the amount of space charges generated can be accurately evaluated, the absolute value of the electric field needs not to be the same. Thus, a value of the back gate voltage can be selected with a certain level of freedom.

On the other hand, with the electric field in the vertical direction due to the negative back gate voltage stress, generation of the space charges caused by the electric field in the lateral direction due to the drain voltage stress might not be able to be evaluated. In particular, "hole emission" in a region near the front surface side of the "sub heterointerface crystalline layer" might be completely unable to be evaluated or might be under evaluated, as described below.

Before explaining the issues regarding the lateral direction voltage in the sub heterointerface crystalline layer due to the drain voltage stress, a method of analyzing a change in the drain current under stress with the negative back gate voltage will be described. It has been described that evaluation of the drain current under stress due to the negative back gate voltage, in particular, the drain current decrease due to generation of negative space charges as a result of the "hole emission" from the trap level in the sub heterointerface crystalline layer corresponds to the evaluation index for the current collapse due to the drain voltage stress attributable to the sub heterointerface crystalline layer.

Figure 17A:
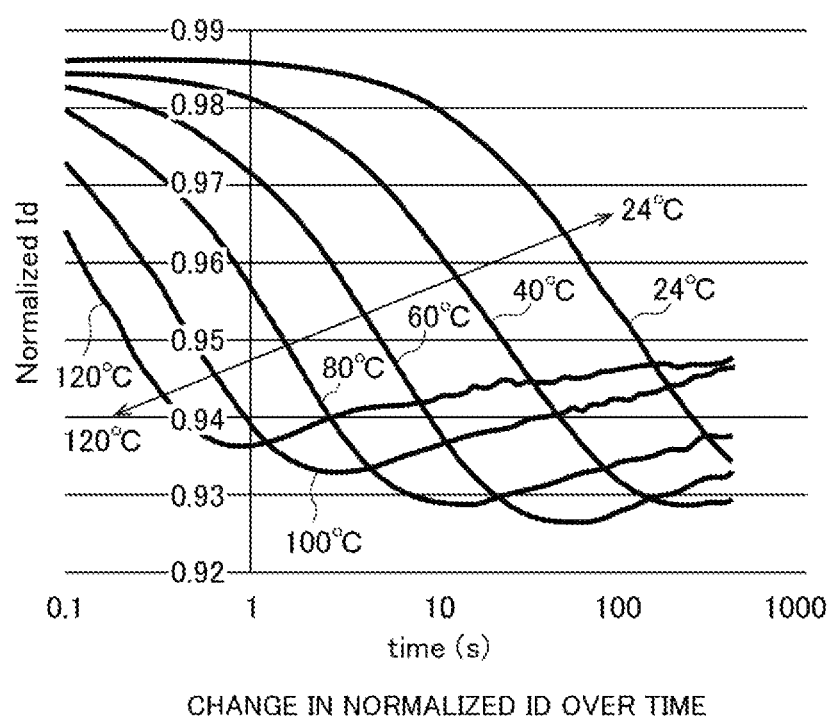
FIG. 17A shows temperature dependency of the drain current under stress with back gate voltage of −10V.

FIG. 17A shows drain current under stress with back gate voltage of −10V in a transistor that is the same as those in FIG. 13A and FIG. 13B. The temperature of a measurement sample was changed from 24° C. to 120° C. The horizontal axis represents logarithmic time and the vertical axis represents the normalized value of the drain current. The measurement was performed with an equal time, with numerical values calculated and plotted on the horizontal axis by interpolation at a logarithmically equal interval in a unit of 20 data points. At 24° C., the drain current decreased, indicating the characteristics of the "hole emission". A higher temperature resulted in a shorter time before the drain current starts to decrease. Furthermore, a current increasing component appeared. A higher temperature also resulted in a shorter time before the drain current starts to increase. As described above with reference to FIG. 11A to FIG. 11D, it can be seen that the time constant of a change in drain current under stress depends on the back gate voltage and also depends on the measurement temperature.

Figure 17B:
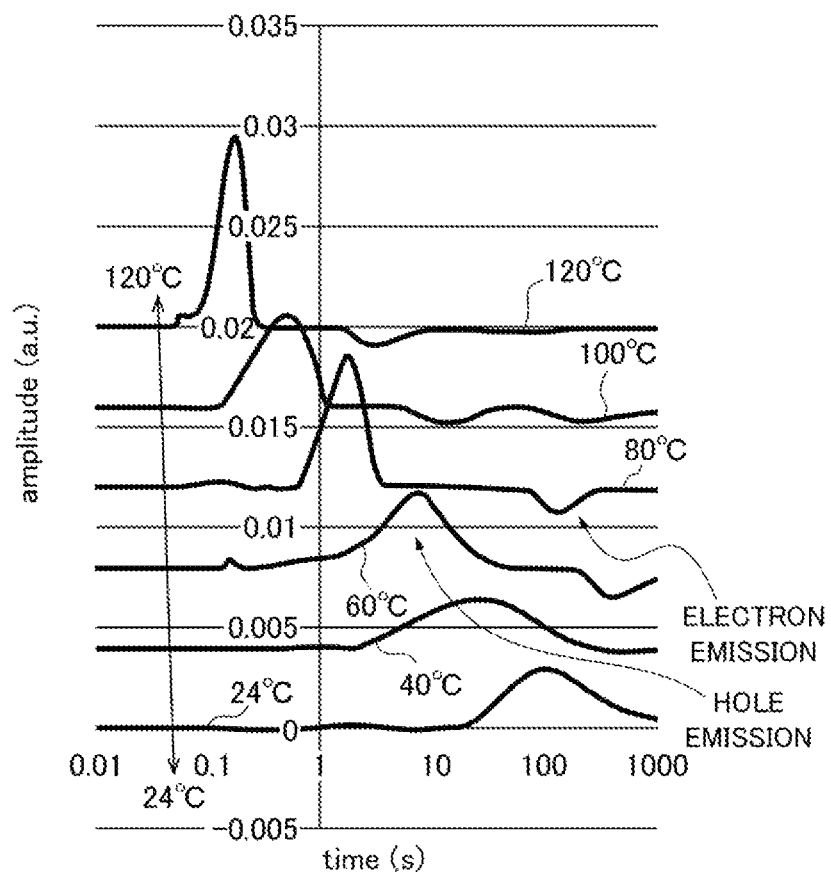
FIG. 17B shows a result of time constant analysis on the drain current in FIG. 17A.

FIG. 17B shows a result of time constant analysis on the drain current in FIG. 17A. The horizontal axis represents the time constant, and the vertical axis represents components of the time constant. The time constant analysis was performed using Formula 1, with a component ai of a time constant τi being a fitting variable, to achieve a smaller dispersion with respect to measurement valued. In the formula, Id(t) represents the drain current, Id(∞) represents a convergence value of the drain current which is also a fitting variable, and t represents a time elapsed after the start of the back gate voltage stress.

$$Id(t) = Id(\infty) + \sum_i ai \, \exp\!\left(-\frac{t}{\tau i}\right) \qquad \text{[Formula 1]}$$

The fitting was performed using Microsoft Excel Solver. The component ai was calculated with respect to the time constant τi from 0.06 seconds to 1,000 seconds, in a unit of 20 points. Along the vertical axis, base lines corresponding to the respective measurement temperatures are plotted while being shifted from each other. The baselines, corresponding to the respective temperatures of 24° C., 40° C., 60° C., 80° C., 100° C., and 120° C. in this order from the lower side, each represent a result of analysis on the measurement value at the corresponding temperature.

Two types of peaks, with a positive component and a negative component, can be seen on the time constant analysis result in FIG. 17B. The positive component is the drain current decreasing component and represents "hole emission", and the negative components is the drain current increasing component and represents "electron emission". A half width of the peak, which varies among the measurement temperatures, does not necessarily reflect the property of the trap level, because the variation includes variation in how the calculation converges.

Figure 18:
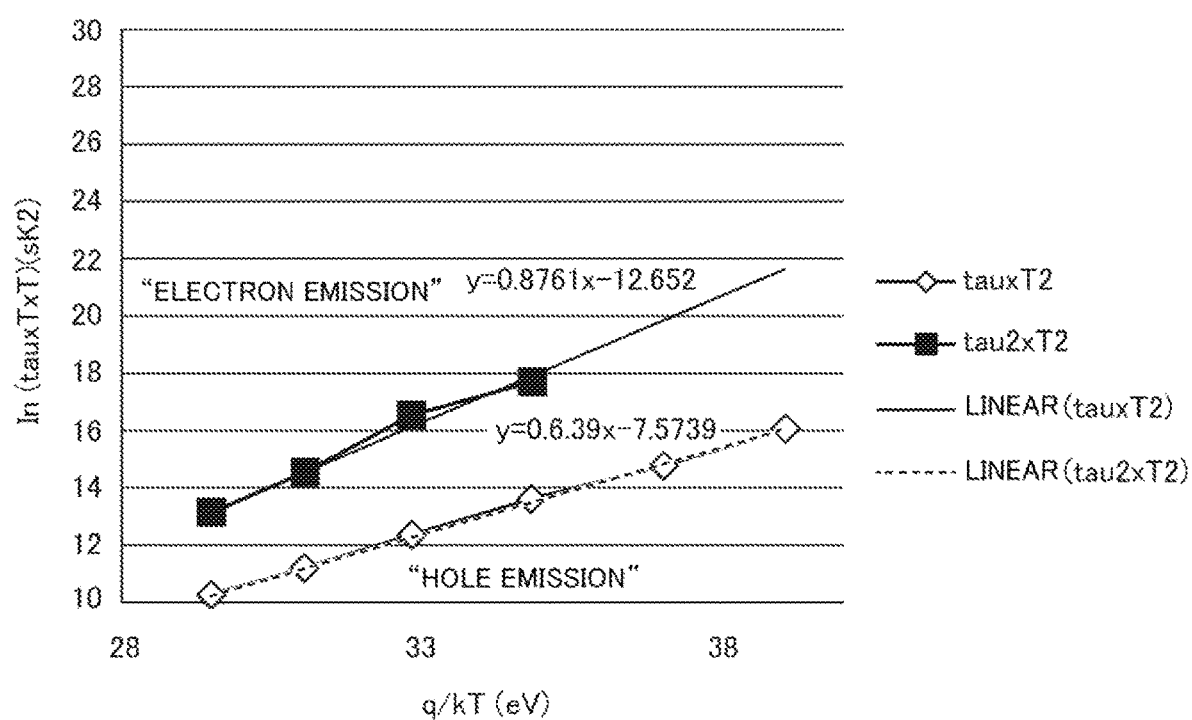
FIG. 18 shows an Arrhenius plot of a peak in a time constant spectrum.

FIG. 18 shows an Arrhenius plot of the peak time constant with respect to the measurement temperatures in FIG. 17B. The vertical axis corresponds to natural logarithm of time constant×(absolute temperature)^2, and the horizontal axis corresponds to (elementary charges/(Boltzmann's constant× absolute temperature)). According to the Shockley-Read-Hall process, the slope corresponds to energy for activating the carrier emission from the trap level. Activation energy for the "hole emission" process was 0.6 electron V, and the activation energy for the "electron emission" process was 0.88 electron V. Furthermore, capture cross section can be calculated from the intercept.

Figure 19:
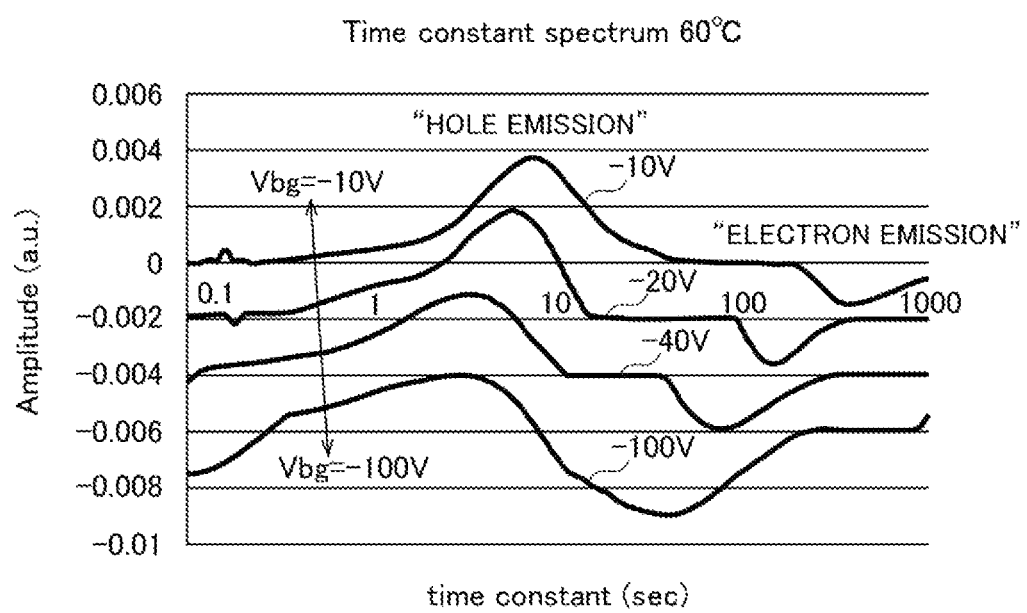
FIG. 19 shows voltage dependency of a time constant spectrum with respect to negative back gate voltage.

FIG. 19 shows a result of measuring dependency of the time constant analysis in FIG. 17B with respect to the back gate voltage. The measurement temperature was 60° C., and baselines corresponding to the respective back gate voltages, which are −10V, −20V, −40V, and −100V in this order from the upper side, are shifted from each other along the vertical axis. In both peaks corresponding to the "hole emission" and the "electron emission", a smaller time constant is obtained with a higher back gate voltage. Furthermore, the "electron emission" involved a larger change in time constant. While it may be difficult to evaluate the half widths of the peaks, the back gate voltage of −100V obviously resulted in a wide peak.

The phenomenon in which the time constant decreases as the back gate voltage increases seems to be caused by the "Poole-Frenkel effect" in which an external electric field reduces the activation energy for the carrier emission from the trap level. The quick reduction of the time constant due to the "electron emission" seems to be caused by the concentration of the electric field as a result of nonuniform the electric field. As described above, the "electron emission" involves the electric field concentrated on the wafer side in the sub heterointerface crystalline layer. Generally, the defect concentration is higher on the substrate side. Thus, a higher back gate voltage involves a higher electric field concentration on the substrate side, resulting in a smaller time constant of the "electron emission". An even higher voltage would lead to tunnel current contributing to the carrier emission from the trap. Such a factor seems to have resulted in the wide peak.

Based on the above, the description will now be given to the issues related to the lateral electric field due to the drain positive voltage stress, and the vertical electric filed due to the negative back gate voltage stress. In the case of back gate voltage stress, the electric field formed by the negative space charges generated by the "hole emission" is strong on the front surface side of the "sub heterointerface crystalline layer", whereas the electric filed formed by the positive space charges generated by the "electron emission" is strong on the substrate side of the sub heterointerface crystalline layer. Thus, the "electron emission" trap level on the substrate side of the sub heterointerface crystalline layer has a large impact.

Now, a case is considered where the concentration at the trap level corresponding to the "hole emission" on the front surface side of the "sub heterointerface crystalline layer" is enough to cause the current collapse due to the drain voltage stress, but the trap level of the "electron emission" on the substrate side of the sub heterointerface crystalline layer is excessive. The "hole emission" phenomenon can be identified from the initial current decrease under back gate stress, if a difference between the "hole emission" and the "electron emission" in the time constant is sufficiently large, or if the "hole emission" time constant is sufficiently large with respect to the measurement time. However, if the back gate voltage is increased to result in a small time constant of the "electron emission" that would cancel the signal of the "hole emission", the "hole emission" may be under evaluated or be undetectable. Specifically, the electric field is concentrated on the substrate side of the sub heterointerface crystalline layer to lead to a small change in the electric field on the two-dimensional electron, resulting in under evaluation of the "hole emission" trap level on the two-dimensional electron side.

In view of the above, because excessively high negative back gate voltage stress results in under evaluation of the trap level corresponding to the "hole emission", the characteristics of the "hole emission" trap level are preferably measured with the negative back gate voltage with an absolute value not larger than 100V. More preferably, negative voltage with an absolute value not larger than 40 V is used.

An analysis method enabling qualitative analysis on "electron emission speed being higher than hole emission speed" will be described below.

For qualitative analysis on the measurement result, a model based on characteristics of the back gate voltage relative to the drain current is introduced. The model assumes that the "depletion layer" generating the space charges on the front surface side of the "sub heterointerface crystalline layer" is formed, and that the trap level is uniform in the film thickness direction in the depletion layer as shown in the band energy model in FIG. 9B and FIG. 9C. Actually, the trap level concentration is expected to vary in a complex manner in the film thickness direction. However, information about the depth direction cannot be obtained from the characteristics of the back gate effect only. Still, this simple "depletion layer" model can provide a technically effective evaluation method including relative and qualitative comparison between samples.

Based on the "depletion layer" model, the relationship between a change in the drain current and the back gate voltage can be described with the following formulae.

Specifically, the normalized drain current Normalized Id can be represented by Formula 2 and Formula 3.

$$\text{Normalized } Id = \frac{N s \max - \Delta N s}{N s \max} \quad \text{[Formula 2]}$$

$$\Delta Ns = \frac{1}{2} N_{EBA} \times d + \frac{\varepsilon}{q \times d} \Delta Vbg \quad \text{[Formula 3]}$$

In the formulae, Nsmax represents an sheet density of the two-dimensional electron gas before the back gate voltage is applied, $\Delta N$ represents a change in the sheet density of the two-dimensional electron under back gate voltage stress, and $N_{EBA}$ represents the concentration of negative space charges generated by the "hole emission". $N_{EBA}$ having the minus sign represents the concentration of positive space charges generated by "electron emission". The term "effective" acceptor concentration is used under an assumption that the concentration is constant in the depletion layer. Furthermore, d represents the film thickness of the depletion layer, $\varepsilon$ represents dielectric constant, and q represents the elementary charge amount.

For Nsmax described above, which represents the sheet density of the two-dimensional electrons to be a reference for the normalized drain current, the present inventor used a value calculated from Formula 4 based on capacitance voltage characteristics of a Schottky diode produced together with the transistor.

$$N s \max = \int_{Vg=off}^{Vg=0} \frac{C(Vg)}{q} dVg \quad \text{[Formula 4]}$$

In the formula, C(Vg) represents the capacitance voltage characteristics of the Schottky diode and Vg represents the voltage of the Schottky electrode. The integration was performed within a range between the gate voltage to be the reference for the normalized drain current and voltage at which the two-dimensional electrons pinch off in the Schottky electrode.

Relational expressions based on the "depletion layer" model to be the basis of Formula 3 are described below.

Specifically, relationship between a change in sheet density of the two-dimensional electrons and a change in the intensity of the electric field of the sub heterointerface crystalline layer immediately below the two-dimensional electrons is:

$$\Delta Ns = \frac{\varepsilon}{q} \Delta E. \quad \text{[Formula 5]}$$

Relationship between the electric field and the back gate voltage is:

$$\Delta E = \frac{q}{\varepsilon} \Delta n_{EBA} \times d + \frac{\Delta V_E}{d}, \text{ and} \quad \text{[Formula 6]}$$

$$\Delta Vbg = \Delta V_E + \frac{q}{2\varepsilon} \times d^2 \times \Delta N_{EBA}. \quad \text{[Formula 7]}$$

In the formulae, $\Delta E$ represents an amount of change in the electric field in the sub heterointerface crystalline layer immediately below the two-dimensional electrons, and $\Delta V_E$ represents an amount of change in potential of the "depletion layer" in a case that the effective acceptor concentration is 0. Formula 3 is obtained by removing $\Delta E$ and $\Delta V_E$ from the above formulae.

Second Embodiment

The semiconductor wafer 100 features "the electron emission speed being higher than the hole emission speed when the space charge redistribution is achieved". This feature can be used as a criteria for an inspection to select a semiconductor wafer 100 expected to be usable for manufacturing a higher performance semiconductor device.

Figure 20:
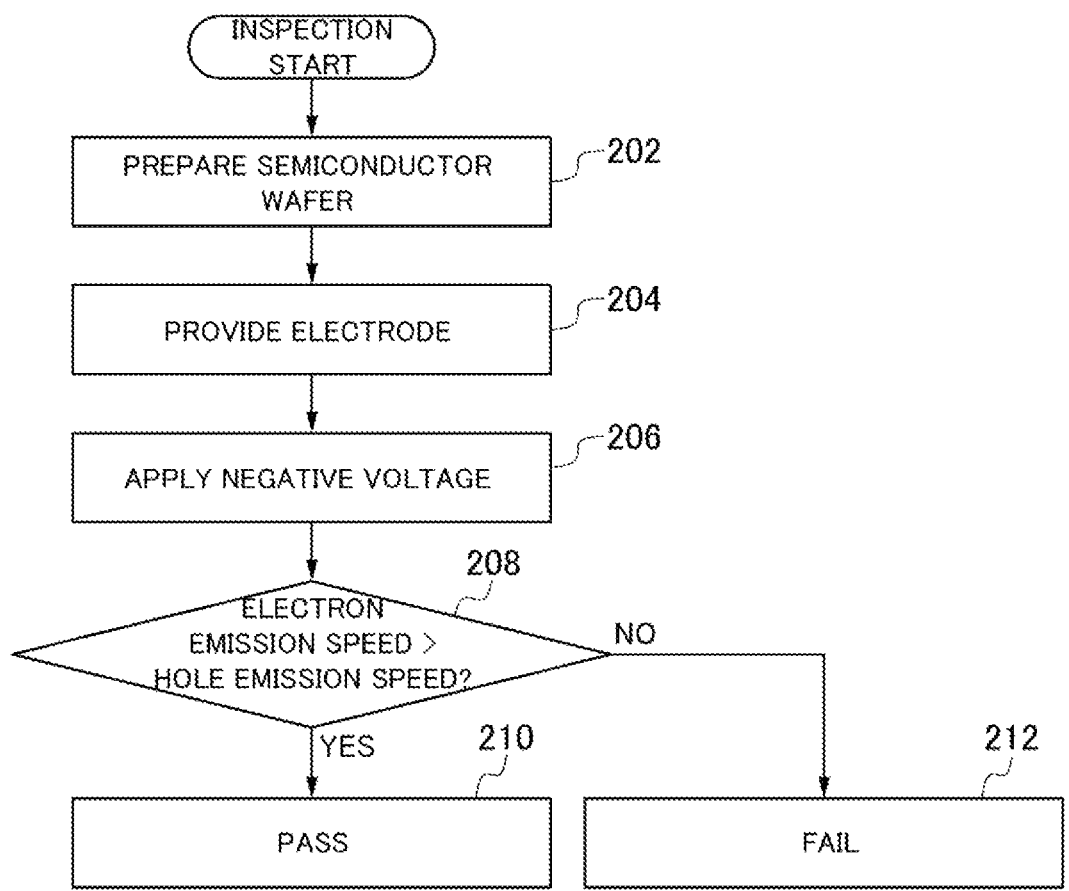
FIG. 20 is a flowchart showing a method of performing inspection on the semiconductor wafer 100

FIG. 20 is a flowchart showing a method of performing inspection on the semiconductor wafer 100. The semiconductor wafer 100 as described in the first embodiment is prepared (step 202), and the electrode as described above with reference to FIG. 4 is provided to the semiconductor wafer 100 (step 204). This electrode is for inspection, and can be formed in a Test Element Group (TEG) region of the semiconductor device, for example. Negative voltage is applied to the electrode thus provided (step 206), and it is determined whether the electron emission speed is higher than the hole emission speed (step 208). The wafer is determined to have passed the inspection when the electron emission speed is higher than the hole emission speed (step 210), and otherwise the wafer is determined to have failed to pass the inspection (step 212).

The semiconductor wafer 100 determined to have passed the inspection by the method can be used to manufacture an electronic device using the two-dimensional electron gas 120 as a channel. The electronic device thus manufactured features high performance and high non-defective rate, and thus can be highly cost competitive.

Third Embodiment

A semiconductor wafer according to the present embodiment has the same configuration as the semiconductor wafer 100, similarly has the first electrode 144 and the second electrode 146 arranged, and has the following feature. Specifically, the semiconductor wafer is characterized in that, when voltage at a level not causing saturation of current flowing between the first electrode 144 and the second electrode 146 is applied between the first electrode 144 and the second electrode 146 and negative voltage is applied to the substrate 102, with a lower one of potentials of the first electrode 144 and the second electrode 146 serving as a reference, the current flowing between the first electrode 144 and the second electrode 146 does not decrease with time. This negative voltage may be applied to the substrate 102 with the third electrode 148 as describe above provided, or may be directly applied to the substrate 102, if the substrate 102 is conductive. Such a semiconductor wafer 100 is less likely to have or is free of current collapse attributable to the buffer layer 106. As a result, the semiconductor wafer 100 usable for manufacturing high performance semiconductor devices can be obtained.

As in the second embodiment, the feature that "the current flowing between the first electrode 144 and the second electrode 146 does not decrease with time, when the negative voltage is applied to the substrate 102" can be used as a criteria for the inspection, so that a method of performing inspection on a semiconductor wafer expected to be usable for manufacturing high performance semiconductor devices can be obtained.

Figure 21:
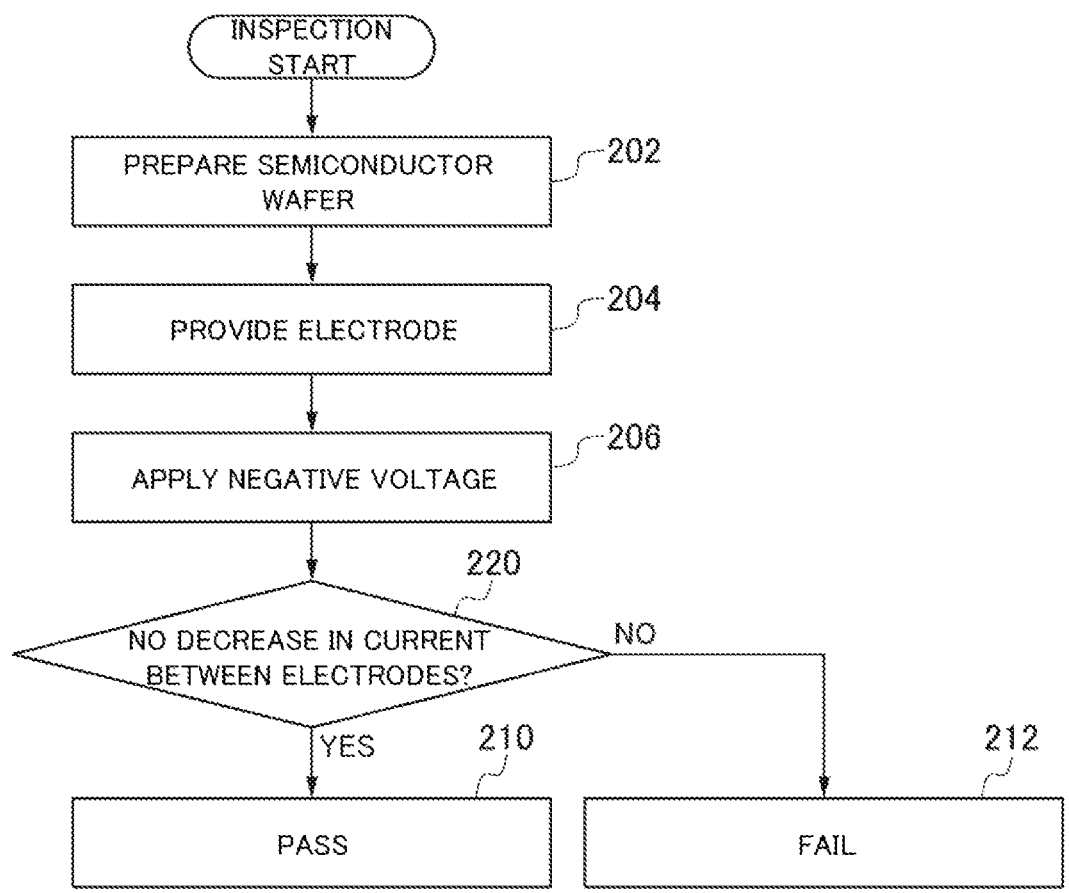
FIG. 21 is a flowchart showing another method of performing inspection.

FIG. 21 is a flowchart showing a method of performing inspection on a semiconductor wafer according to the third embodiment. The method includes steps (step 202, step 204, and step 206) that are that same those in the second embodiment, and further includes determining whether the current flowing between the first electrode 144 and the second electrode 146 does not decrease with time, when the negative voltage is applied to the substrate 102 (step 220). The semiconductor wafer is determined to have passed the inspection when the current between the electrodes increases (step 210) and is otherwise determined to have failed (step 212). The semiconductor wafer that is determined to have passed the inspection of the method can be used for manufacturing the electronic device as described above.

Fourth Embodiment

Figure 22A:
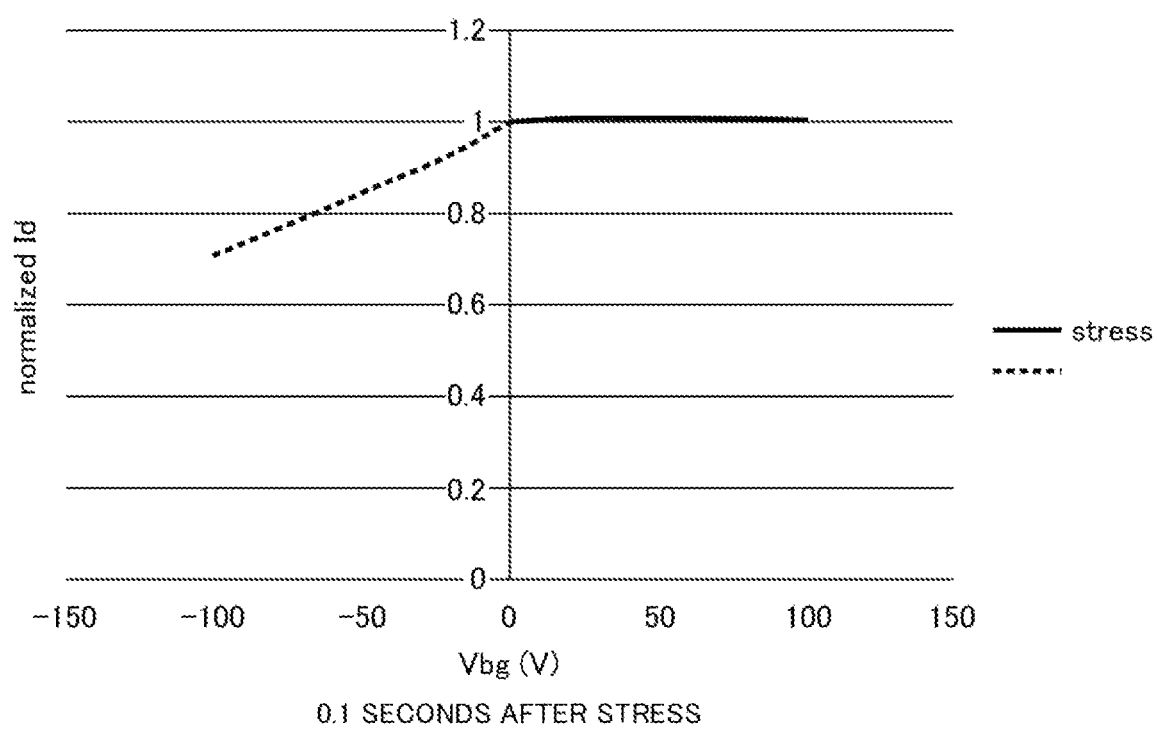
FIG. 22A shows the drain current at a time point 0.1 seconds after application of negative back gate voltage stress.
Figure 22B:
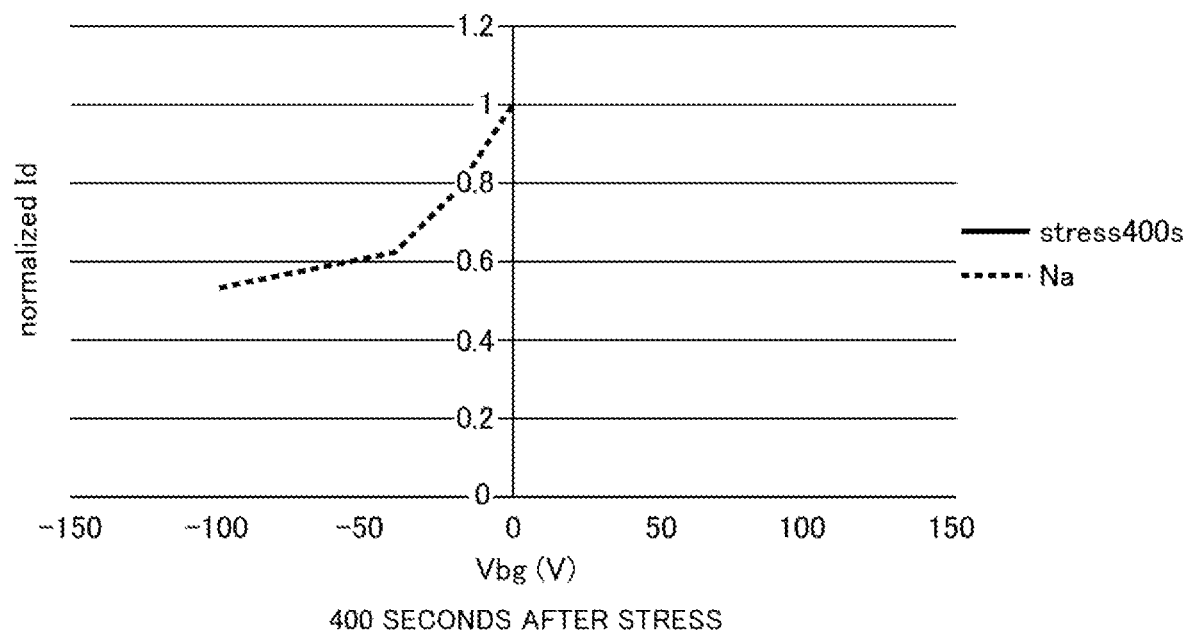
FIG. 22B shows the drain current at a time point 400 seconds after the application of negative back gate voltage stress.
Figure 23:
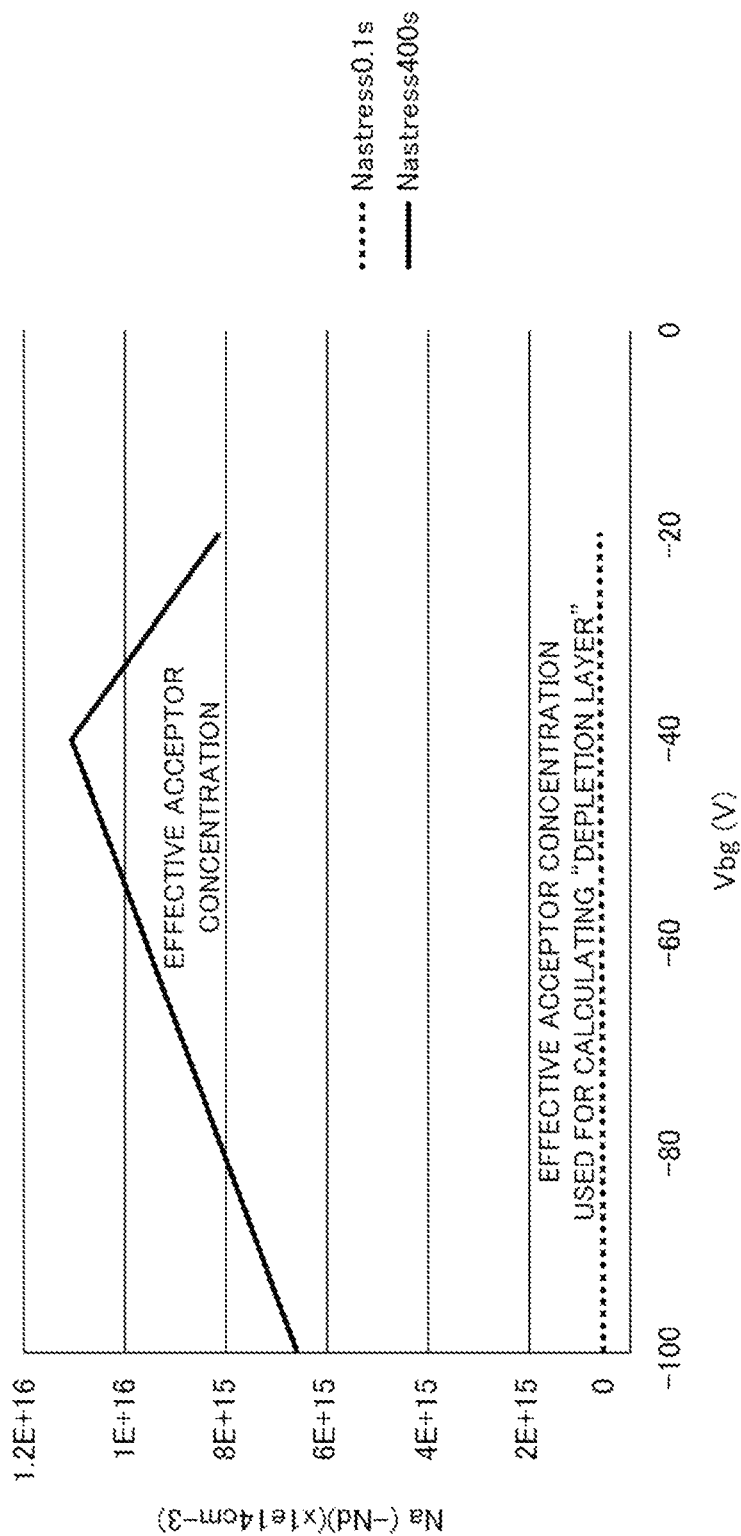
FIG. 23 shows effective acceptor concentration in a "depletion layer" calculated.

Using Formula 2 and Formula 3 described above, an amount of change in the space charges under stress with the negative back gate voltage Vbg in the "depletion layer" is converted into a numerical form, based on the measurement result as shown in FIG. 10A to FIG. 10C. FIG. 22A shows the dependency of normalized drain current (vertical axis) with respect to the back gate voltage (horizontal axis), 0.1 seconds after the application of the back gate voltage stress. If the back gate voltage is negative voltage, the normalized domain current is substantially proportional to the back gate voltage. First of all, from this data, the film thickness of the "depletion layer" in the sub heterointerface crystalline layer to which the back gate voltage is applied is calculated. As a method of calculating an assumed film thickness of the "depletion layer", the effective acceptor concentration was calculated at each of three voltage points (Vbg=−20V, −40V, and −100V) from Formula 2 and Formula 3. Then, the film thickness was calculated to have the minimum dispersion from an average value of the effective acceptor concentrations at these three points. The "Microsoft Excel" "Solver" was used for the calculation. The film thickness d of the depletion layer was calculated to be 3.3 μm. FIG. 22B shows dependency of the normalized drain current with respect to the back gate voltage, 400 seconds after the application of the back gate voltage stress. Using the thickness d of the "depletion layer" calculated, effective acceptor concentration at each voltage can be calculated with Formula 2 and Formula 3. FIG. 23 shows the effective acceptor concentration in the "depletion layer" thus calculated (a line graph with high concentration). As can be seen in FIG. 10A to FIG. 10C, in a case that Vbg is −20V or −40V, the "electron emission" has a small impact at a time point 400 seconds after the stress application, and thus an increase in the space charges due to the "hole emission" is effectively evaluated. The effective acceptor concentration $N_{EBA}$ was $8.2 \times 10^{15}$ $cm^{-3}$ when Vbg=−20V, and was $1.1 \times 10^{16}$ when Vbg=−40V, and thus it can be determined that the crystal features "hole emission" being predominant. Thus, the wafer can be determined as a wafer not satisfying the condition "the electron emission speed is higher than the hole emission speed".

Then, the determination condition was relaxed so that the reduction in drain current by less than 5% was assumed to be tolerable. Specifically, using Formula 2 and Formula 3, a tolerable effective acceptor concentration leading to a reduction in the drain current by 5% or less was calculated to be $1.2 \times 10^{15}$ $cm^{-3}$ or less. The effective acceptor concentration in the "depletion layer" was higher than this tolerable effective acceptor concentration. Thus, this wafer can be determined as a wafer not satisfying the condition "the electron emission speed is higher than the hole emission speed".

Data, in FIG. 23, with a low effective acceptor concentration and low voltage dependency corresponds to the effective acceptor concentration for calculating the film thickness d. This indicates that a lower effective acceptor concentration and less voltage dependency results in the "depletion layer" film thickness being more effectively calculated. Using the Microsoft Excel Solver described above, the film thickness and the voltage dependency of acceptor concentration in the depletion layer 400 seconds after back gate stress were calculated at once.

Fifth Embodiment

In the fourth embodiment described above, the effective acceptor concentration under stress was calculated using the drain current 400 seconds after stress. In this fifth embodiment, the effective acceptor concentration was calculated with time constant analysis on a change in the drain current under back gate voltage stress performed to extract "hole emission" and "electron emission" signals, as in FIG. 17A and FIG. 17B.

Figure 24:
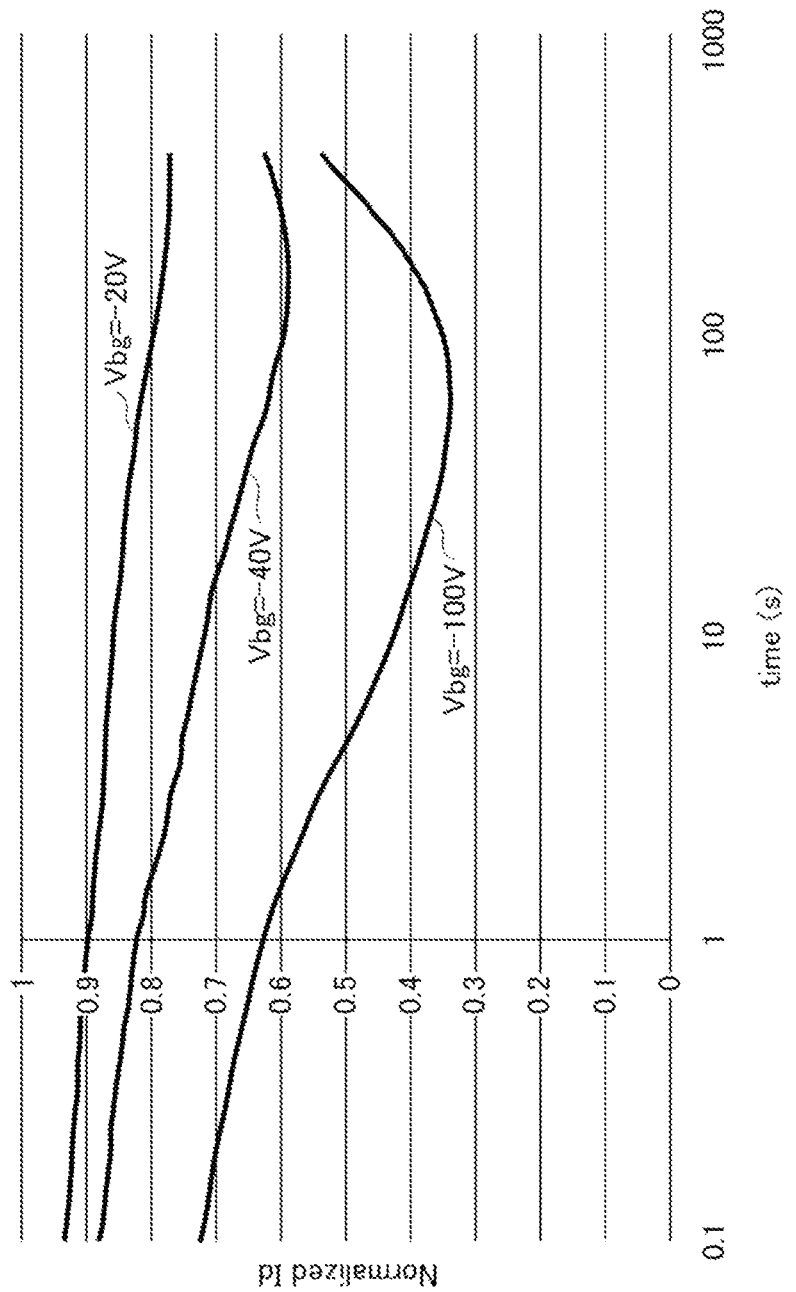
FIG. 24 shows how drain current changes under back gate voltage stress.
Figure 25A:
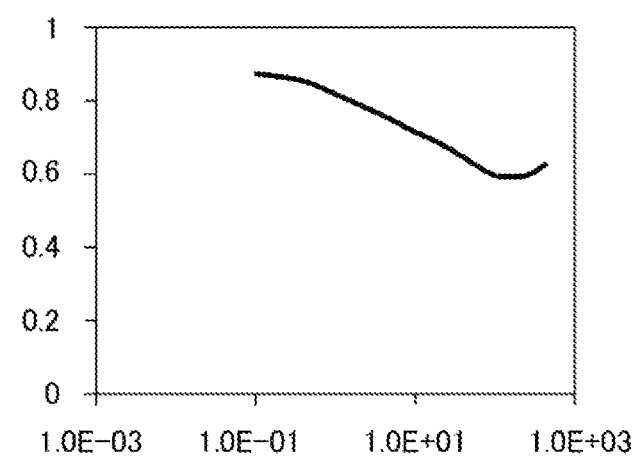
FIG. 25A shows domain current measurement results in a case that back gate voltage stress is −40V and values obtained by calculating a change in drain current over time from a spectrum extracted from time constant analysis, the results and the values being plotted in an overlapping manner.
Figure 25B:
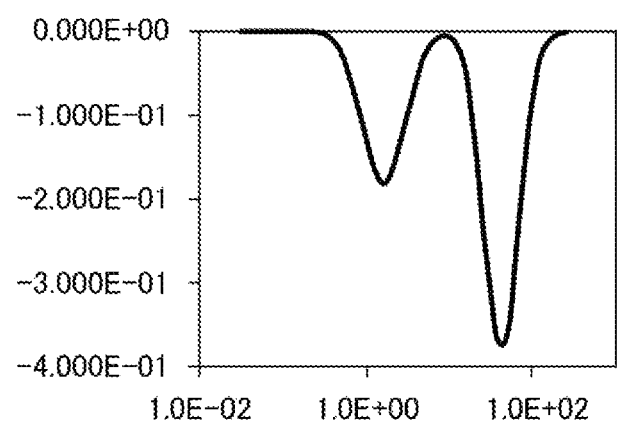
FIG. 25B shows a time constant spectrum for hole emission.
Figure 25C:
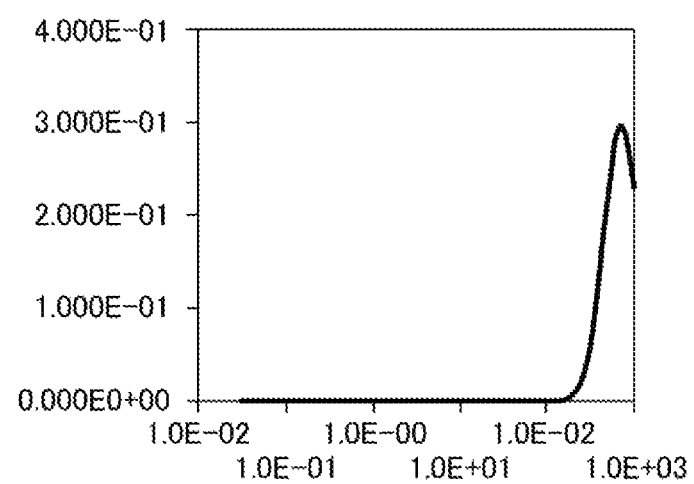
FIG. 25C shows a time constant spectrum for electron emission.

In FIG. 24, a change in the drain current under back gate voltage stress over time in FIG. 21 is plotted. The time, corresponding to the horizontal axis, was logarithmically plotted. A processing method that is the same as that in FIG. 17A was used. FIG. 25A, FIG. 25B, and FIG. 25C show a result of the time constant analysis in a case that the back gate voltage stress is −40V. FIG. 25A shows, in an overlapping manner, the measurement result and values as a result of calculating the change in the drain current over time from a spectrum extracted by the time constant analysis. It can be seen that result and the values substantially match. FIG. 25B and FIG. 25C show a time constant spectrum calculated to achieve the minimum dispersion between the measurement value and the calculated value. FIG. 25B and FIG. 25C respectively show results of calculating "hole emission" and "electron emission" components. Regarding the peak of the fitting used for the time constant spectrum, based on Formula 1, ai relative to τi was assumed to be a normalized normal distribution. Assuming the normalized normal distribution in the spectrum provides advantages that there will be less unknown fitting constants and that the intensity of the peak signal can be easily calculated due to the normalization. In this sample, the "hole emission" components were fitted with two peaks, and the "electron emission" was fitted with a single peak. Furthermore, a calculation method that is the same as that in FIG. 19A was used.

Figure 26:
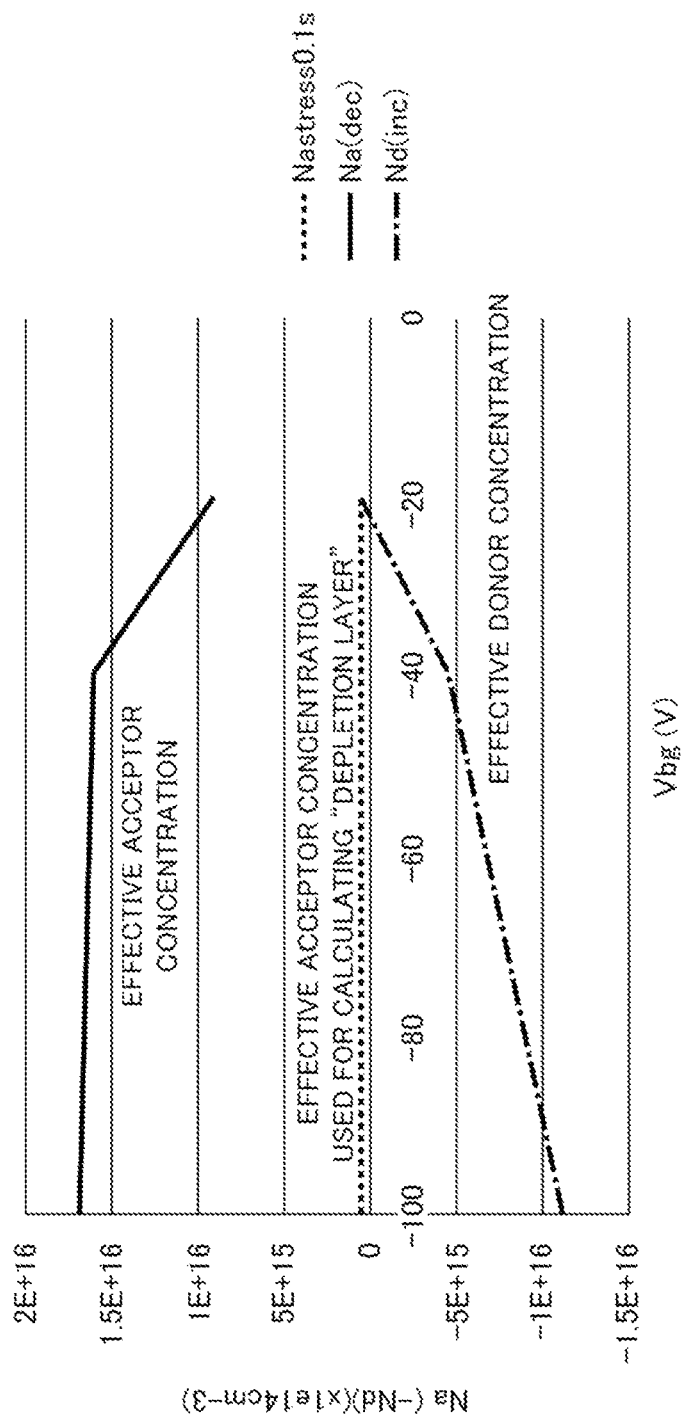
FIG. 26 shows effective acceptor concentration calculated from the time constant spectrum.

In FIG. 26, based on the peak of the time constant spectrum, the effective acceptor concentration, calculated using Formula 2 and Formula 3, is plotted with respect to back gate voltage. The negative side represents donor concentration of the "electron emission" component. A line graph with a high concentration represents the effective acceptor concentration calculated from the "hole emission" component. A straight line around 0 concentration represents the effective acceptor concentration calculated from a result of calculating the film thickness of the depletion layer as in FIG. 23. The line graph on the negative side represents effective acceptor concentration calculated from the "electron emission" component, which is donor concentration (effective donor concentration) because being of a negative value. The effective acceptor concentration based on the "hole emission" was higher than the effective donor concentration corresponding to the "electron emission". Thus, the wafer can be determined to be a wafer not satisfying the condition "the electron emission speed is higher than the hole emission speed".

Then, the determination condition was relaxed so that the reduction in drain current by less than 5% was assumed to be tolerable. Specifically, using Formula 2 and Formula 3, a tolerable effective acceptor concentration leading to a reduction in the drain current by 5% or less was calculated to be $1.2 \times 10^{15}$ $cm^{-3}$ or less. The effective acceptor concentration in the "depletion layer" was higher than this tolerable effective acceptor concentration. Thus, this wafer can be determined as a wafer not satisfying the condition "the electron emission speed is higher than the hole emission speed". The decrease in the drain current is more preferably 2% or less so that the current collapse due to the drain voltage stress can be more effectively suppressed. Here, the tolerable acceptor concentration may be proportional to the tolerable amount of drain current decrease obtained by Formula 2 and Formula 3.

Sixth Embodiment

Figure 27:
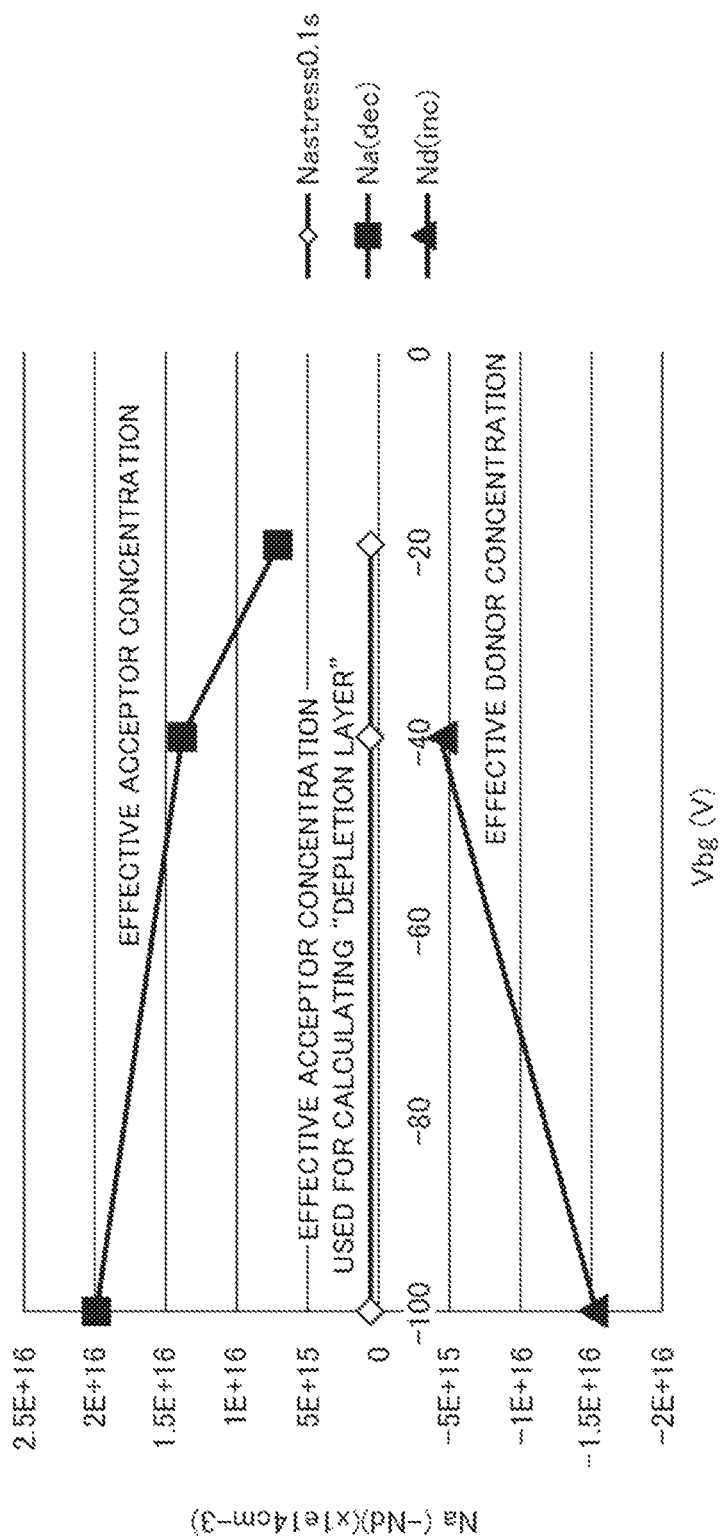
FIG. 27 shows effective acceptor concentration simply calculated from a plurality of time constant components.

In the fifth embodiment described above, the time constant analysis was simplified. Specifically, the measurement values were fitted with ai in Formula 1 set to be 0 except for the peak value of the time constant spectrum (the normalized normal distribution in FIG. 25A to FIG. 25C corresponds to 0). FIG. 27 shows a result of calculating the effective acceptor concentration from the time constant components. Specifically, the "hole emission" components were fitted with two time constant components, and the "electron emission" components were fitted with a single time constant component. The value obtained was substantially the same as that in FIG. 26. The determination on whether the "electron emission speed is higher than hole emission speed" was that same as that in the sixth embodiment.

Seventh Embodiment

In FIG. 10A, FIG. 10B, and FIG. 10C, the drain current under back gate voltage stress decreased with time. The decreased amount of the drain current exceeds 5% at each back gate voltage, and thus it can be determined that the wafer does not to satisfy the condition that the drain current "does not decrease with time".

Figure 28:
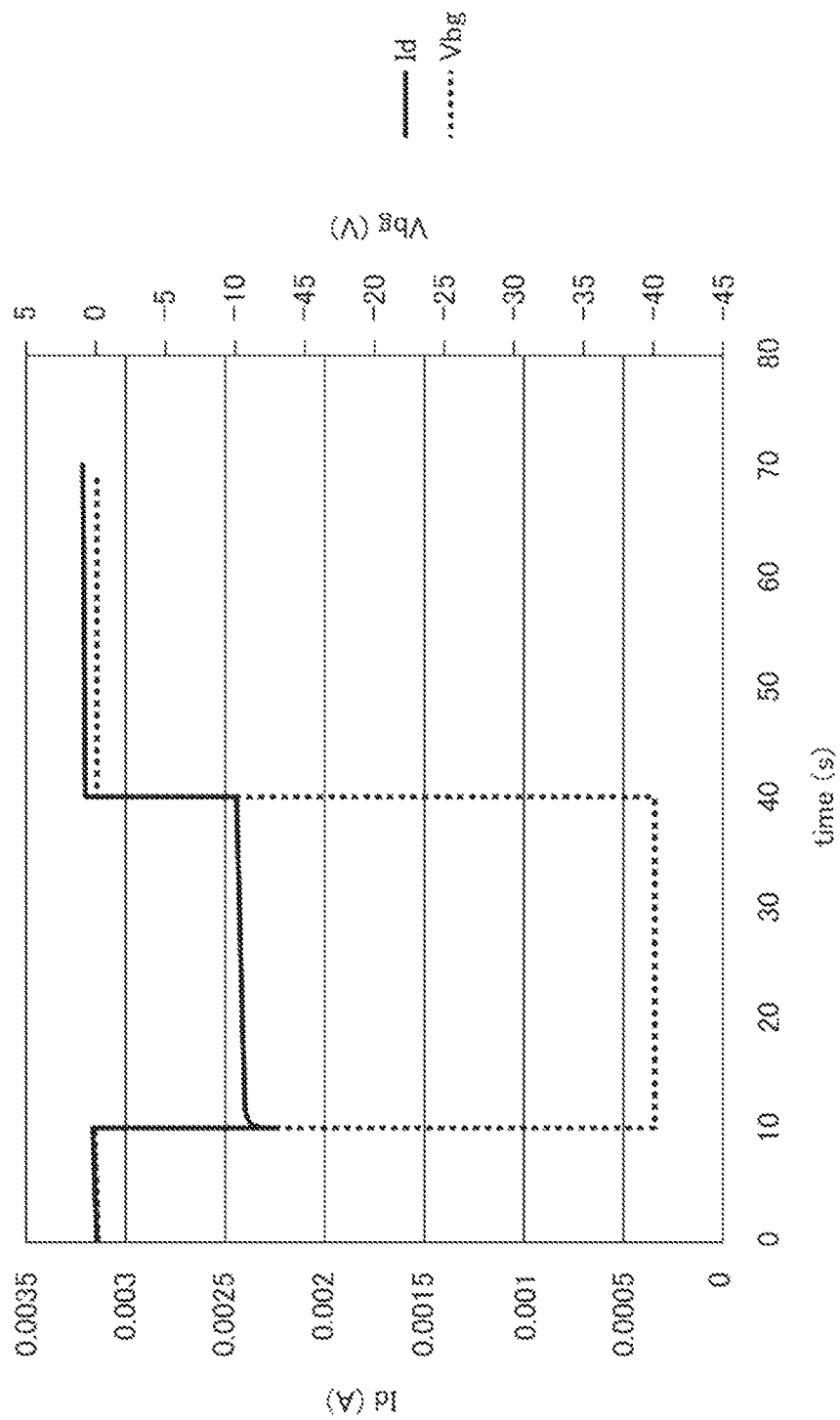
FIG. 28 shows a back gate voltage stress operation performed under light irradiation for initialization.

As described above, the back gate characteristics of a single transistor need to be continuously measured under a plurality of conditions. The measurements are all performed in a light shielded state. As shown in FIG. 8A and FIG. 8B, the drain current after back gate stress is in a decreased state. This means that when the same device subsequently goes through a measurement, the measurement starts in a different state without the drain current recovering. Thus, a certain countermeasure needs to be taken. Generally, nitride semiconductors such as GaN involves a large gap band energy width and a large trap level activation energy, and thus requires a long relaxation time. As described in Non-Patent Document 3, to wait for the drain current to naturally recover, an unrealistically long waiting time is required. Generally, the GaN crystal would never be in thermal equilibrium because it is never left without light irradiation or voltage stress for a long period of time. Thus, although it may not be thermal equilibrium, initialization is required with a certain operation. The inventors implemented the initialization by applying the back gate stress under light irradiation. FIG. 28 shows a change in the drain current due to the actual initialization operation. Specifically, the back gate voltage of −40 V was applied in a stepwise manner, while performing the light irradiation. The diagram shows data as a result of the initialization operation, performed with voltage of −40V applied stepwise to the back gate under light irradiation, immediately after the measurement with the back gate voltage of −40V shown in FIG. 10A, FIG. 10B, and FIG. 10C. The drain current recovered to the current before stress. The light irradiation was performed by using a white LED light for a stereo microphone of a prober used for the measurement. For the experiments described in the invention of the present application, the same initialization operation was performed before measurements including a regular I-V measurement other than the back gate effect measurement.

Example 1

Simulation was performed to check how the drain current (Id) is affected by the phenomenon "hole emission" and "electron emission" from the trap in the buffer layer 106 made of a GaN layer (which may hereinafter be referred to as a "GaN buffer layer". In this case, the first crystalline layer 112 (which may also be referred to as "channel layer 112") is set to be the GaN layer with the same trap concentration as the buffer layer 106, and thus no boundary needs to be set between the channel layer 112 and the buffer layer 106. There may be cases where the buffer layer 106 includes the channel layer 112). An acceptor type trap (trapping holes to be neutral, and emitting holes to be monovalent negative charges) is assumed to be a "hole emission" source. A donor type trap (trapping electrons to be neutral and emitting electrons be monovalent positive charges) is assumed to be an "electron emission" source.

The simulation was performed on the back gate voltage stress with negative voltage applied to the third electrode 148 with the first electrode 144 serving as the reference, and was also performed on drain voltage stress with positive voltage applied to the second electrode 146, with the first electrode 144 serving as the reference. The drain voltage stress was used for emulating a change in the channel resistance between On/Off of the transistor, and relationship thereof with the back gate effect was checked. Under actual drain voltage stress, a change in resistance due to a change in surface charges between the gate and the drain is expected to have an impact. Still, no surface trap is set in this example to check the impact of the GaN buffer layer.

Figure 29:
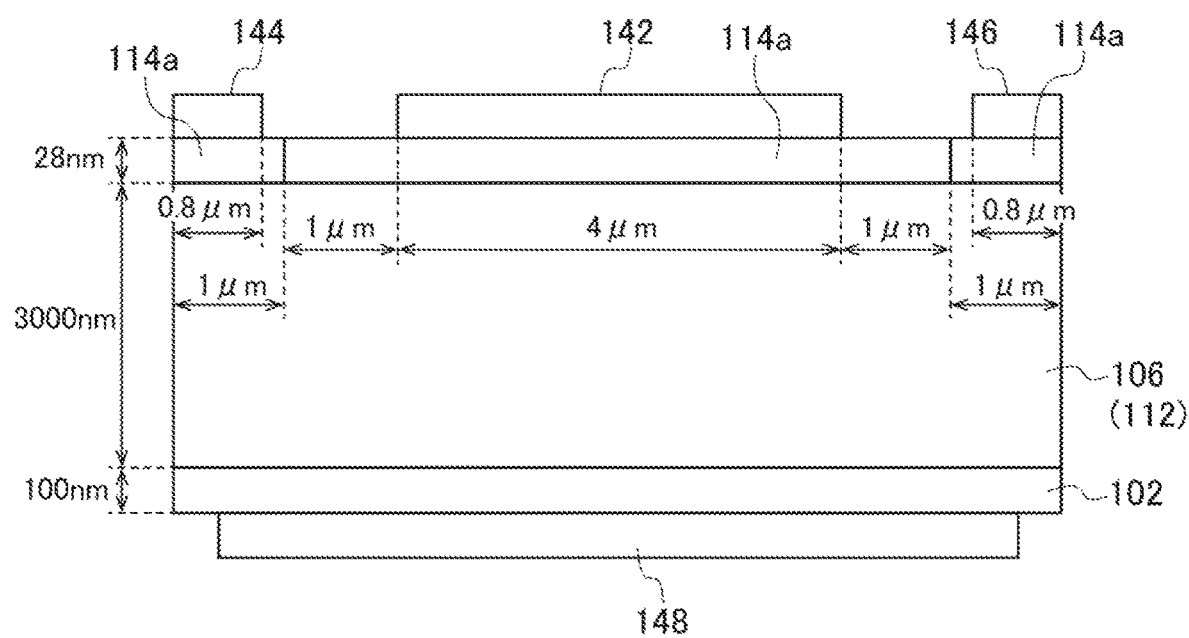
FIG. 29 is a cross-sectional view showing a device structure used for simulation.

The semiconductor device simulation was performed on a device structure shown in FIG. 29, using drift-diffusion model. An AlGaN layer (second crystalline layer 114a) with an Al composition of 0.24 and a thickness of 28 nm, serves as a barrier layer of the HEMT. The two-dimensional electron gas is produced at an interface between this layer and the GaN layer, due to spontaneous polarization difference between lattice strain piezoelectric effect and the GaN layer (first crystalline layer 112). This two-dimensional electron gas serves as a carrier in charge of electrical conduction of a channel of the electric field effect transistor. A threshold voltage leading to drain current of an electric field effect transistor being substantially 0 is approximately −2V. Due to a difference in a Fermi level of the GaN layer, the threshold is slightly lower in a case of the acceptor type trap rich. However, this has no negative impact on comparison of the phenomenon.

A donor type trap and an acceptor type trap are assumed in the GaN buffer layer, with their energy levels respectively set to be 0.616e V from an end of the conduction band and 0.543e V from an end of a valence band, with reference to a document (D. Cornigli, F. Monti, S. Reggiani, E. Gnani, A. Gnudi, G. Baccarani, Solid-State Electronics, 115, 173-178 (2016)). In the donor type trap rich layer structure, the donor type trap and the acceptor type trap in the GaN buffer layer are respectively set to have concentrations of $1.5 \times 10^{16}$ cm$^{-3}$ and $0.5 \times 10^{16}$ cm$^{-3}$. In the acceptor type trap rich layer structure, the donor type trap and the acceptor type trap in the GaN buffer layer were respectively set to have concentrations of $0.2 \times 10^{16}$ cm$^{-3}$ and $0.8 \times 10^{16}$ cm$^{-3}$.

Figure 30:
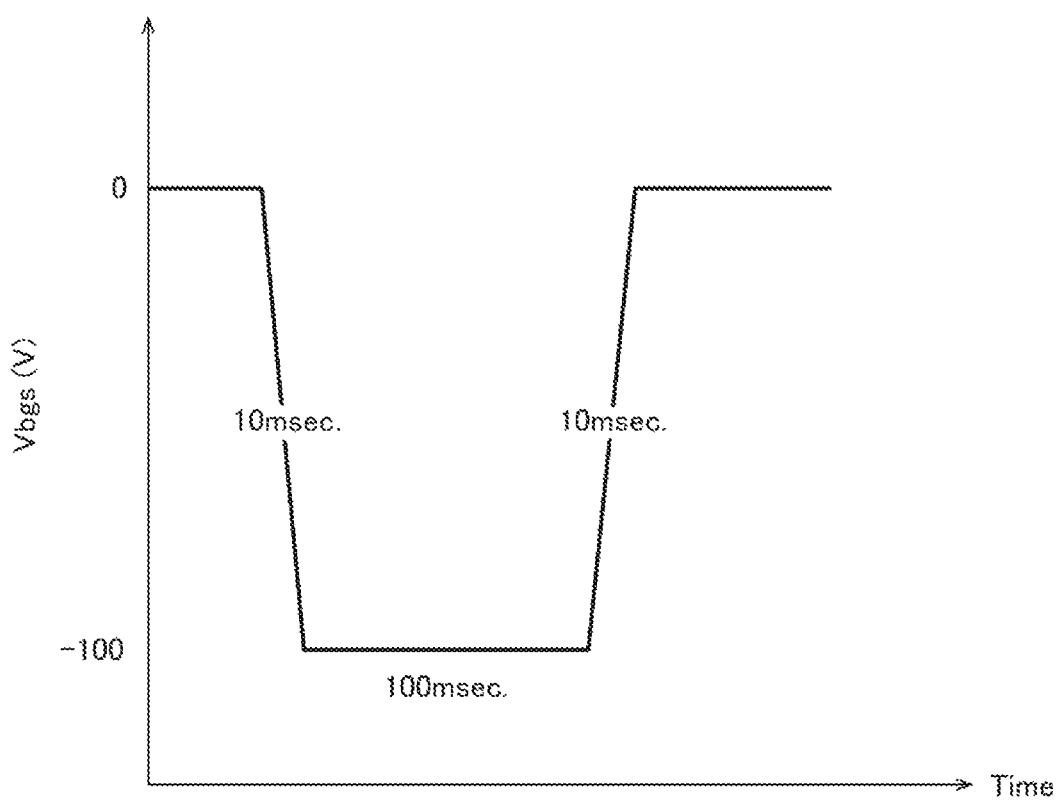
FIG. 30 shows a time profile of voltage applied under back gate voltage stress (application of negative voltage to a third electrode 148).

FIG. 30 shows a time profile of back gate-source voltage applied under back gate voltage stress (application of negative voltage to the third electrode 148). In the simulation for the back gate voltage stress, a change in the drain current, relative to the voltage profile shown in FIG. 30, was calculated. The calculation was performed with the gate-source voltage set to be 0V, and the drain-source voltage set to be 1V. A time required for the back gate voltage to transition from 0V to −100V, and a time required for the back gate voltage to transition from 100 V to 0V were each set to be 10 milliseconds.

Figure 31:
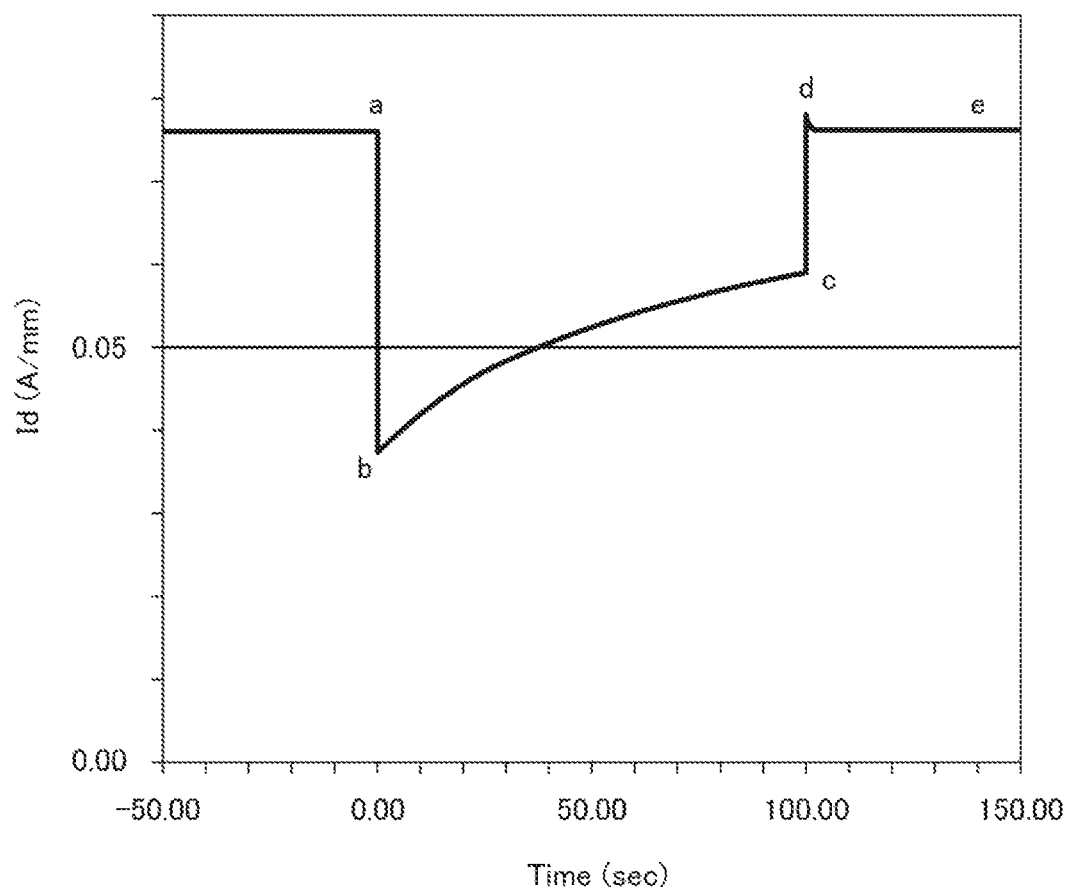
FIG. 31 shows a drain current profile in a case that the back gate voltage stress illustrated in FIG. 30 is applied (with a buffer layer 106 being donor type trap rich).

A result of the simulation on the back gate voltage stress in the donor type trap rich layer structure will be described. FIG. 31 shows a drain current profile in a case where the back gate voltage stress is applied (with the buffer layer 106 being donor type trap rich). The current decreased due to the back gate voltage stress (from a point a to a point b). Under back gate voltage stress, the drain current increased with time (from the point b to a point c). The drain current substantially recovered to the initial state after back gate voltage stress (from a point d to a point e).

Figure 32:
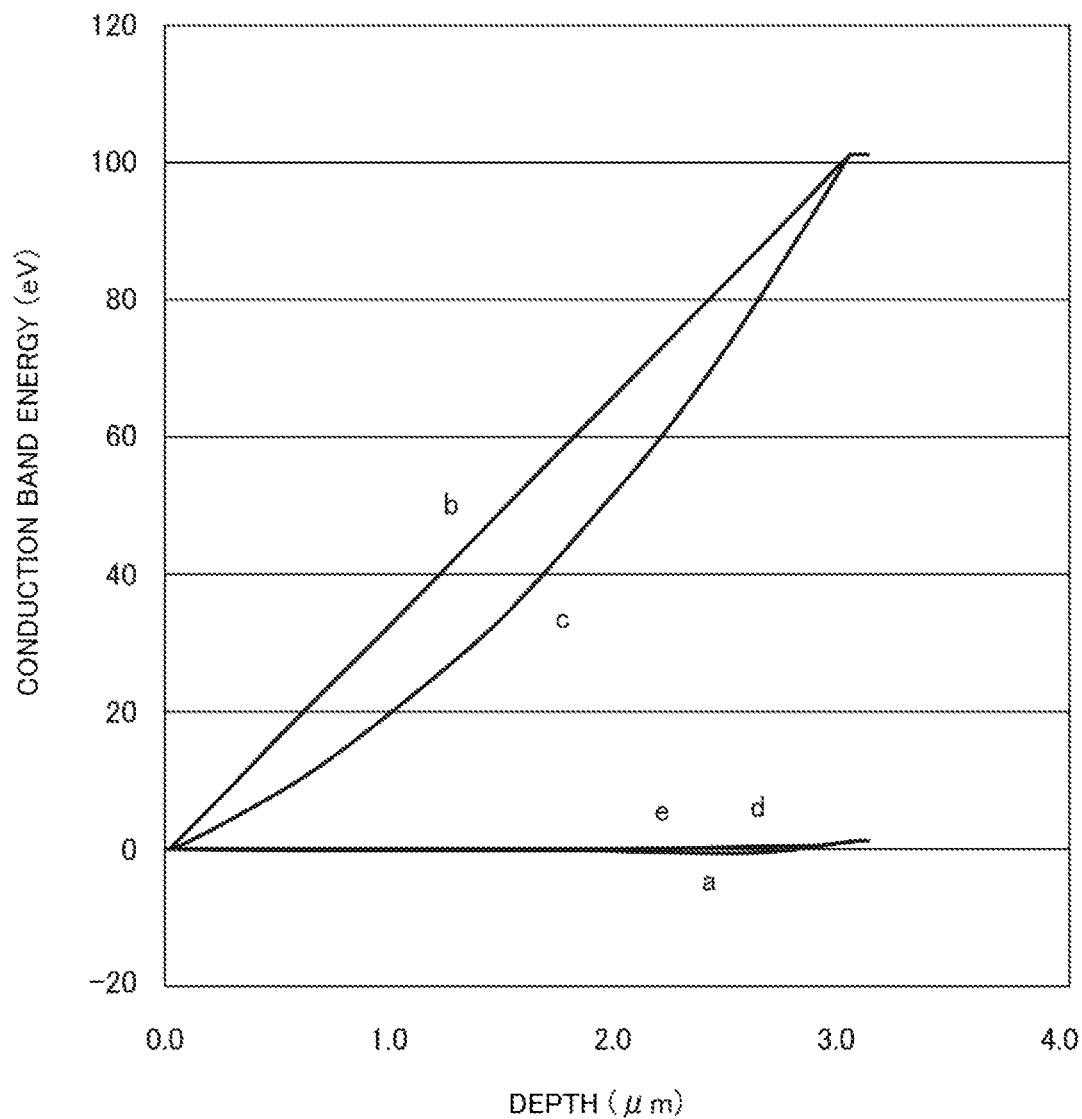
FIG. 32 shows a conduction band energy depth profile in a case that the back gate voltage stress shown in FIG. 30 is applied (with the buffer layer 106 being donor type trap rich.)

A conduction band energy depth profile of a center portion of the gate electrode, from the point a to the point e in FIG. 31 will be described. FIG. 32 shows a conduction band energy depth profile in a case that the back gate voltage stress is applied (with the buffer layer 106 being donor type trap rich). Depth 0 is immediately below the gate electrode. The back gate electrode is at a depth of approximately 3 um. When the back gate voltage −100V is applied (from the point a to the point b), the electric field spreads to a region immediately below the channel so that the two-dimensional electron gas density decreases, whereby the current decreases. At the point c, the conduction band energy of the GaN layer has a downwardly convex shape relative to the depth, and the electric field due to the back gate voltage stress immediately below the channel is compensated, whereby the two-dimensional electron gas density increases. At the point d and the point e at which the back gate voltage returns to 0V, the conduction band energy profile substantially returns to the initial state at the point a, and the drain current also substantially recovers to the initial state.

This phenomenon is explained as follows based on detailed data of the simulation. Specifically, in the initial state (point a), the acceptor type trap of the GaN layer is ionized, and this is compensated by the donor type trap. The ionization was performed only with a part of the donor type trap corresponding to the concentration of the acceptor type trap, and the remaining part was in a state of trapping electrons. At the point b immediately after the application of back gate voltage −100V, the pseudo Fermi levels in the GaN layer were separated, and the carrier emission from the trap starts. The acceptor type trap was ionized in the initial state, and the hole emission therefrom was almost zero and thus was ignorable. On the other hand, with the electrons trapped in the part of the donor type trap in the initial state emitted, positive space charges were generated. The space charges thus generated resulted in the downwardly convex conduction band energy profile. Thus, the electric field below the channel changed so that the current increased up to the point c. A speed of this change in the current over time corresponds to the time constant of the emission from the donor type trap. The current momentarily exceeded that in the initial state, at the point d immediately after the back gate voltage has returned to 0V, but then swiftly returned to the current value in the initial state. The conduction band energy is lowered by the donor type trap ionized by the back gate voltage stress, but is expected to swiftly return to a state close to the initial state, due to electrons injected from the channel side.

Comparative Example 1

Figure 33:
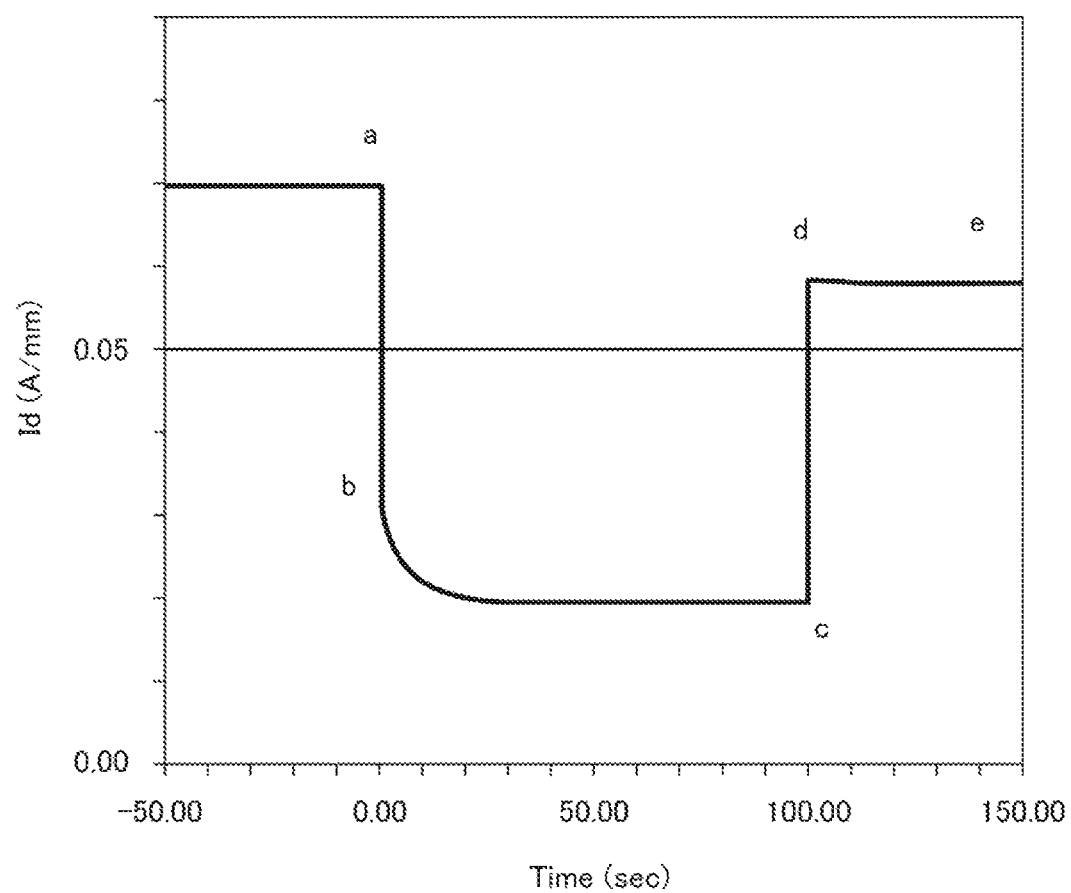
FIG. 33 shows a drain current profile in a case that the back gate voltage stress illustrated in FIG. 30 is applied (with a buffer layer 106 being acceptor type trap rich).

A result of simulation on back gate voltage stress in an acceptor type trap rich layer structure will be described. FIG. 33 shows a drain current profile in a case that the back gate voltage stress is applied (with the buffer layer 106 being donor type trap rich). The current decreased due to the back gate voltage stress (from a point a to a point b). The drain current decreased with time under back gate voltage stress (from the point b to a point c). The current after back gate voltage stress (from a point d to a point e) was lower than that in the initial state.

Figure 34:
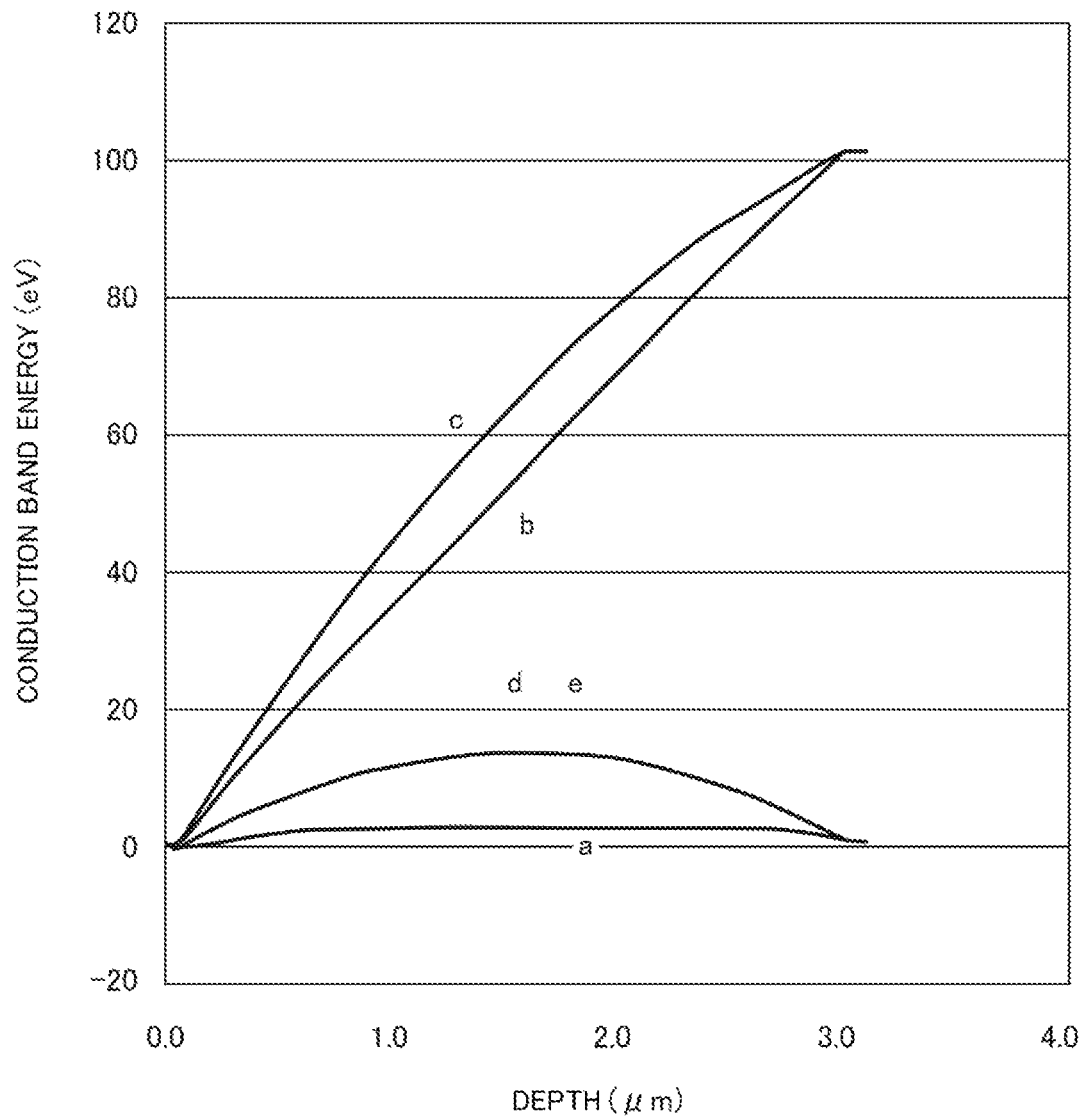
FIG. 34 shows a conduction band energy depth profile in a case that the back gate voltage stress illustrated in FIG. 30 is applied (with a buffer layer 106 being acceptor type trap rich).

A conduction band energy depth profile of a center portion of the gate electrode, from the point a to the point e in FIG. 33 will be described. FIG. 34 shows a conduction band energy depth profile in a case that the back gate voltage stress is applied (with the buffer layer 106 being acceptor type trap rich). Depth 0 is immediately below the gate electrode. The back gate electrode is at a depth of approximately 3 um. When the back gate voltage of −100V was applied (from the point a to the point b), the electric field spread to a region immediately below the channel so that the two-dimensional electron gas density decreased, whereby the current decreased. At the point c, the conduction band energy of the GaN layer has a upwardly convex shape relative to the depth, and the electric field due to the back gate voltage stress immediately below the channel increased, whereby the two-dimensional electron gas density decreased. At the point d and the point e at which the back gate voltage returns to 0V, the conduction band energy profile with the upwardly convex shape as in the state shown in the point c was maintained, and thus the current remained to be in the decreased state.

This phenomenon is explained as follows based on detailed data of the simulation. Specifically, in the initial state (point a), the donor type trap of the GaN layer was ionized, and this was compensated by the acceptor type trap. The ionization was performed only with a part of the acceptor type trap corresponding to the concentration of the donor type trap, and the remaining part was in a state of trapping holes. At the point b immediately after the application of back gate voltage of −100V, the pseudo fermi levels in the GaN layer were separated, and the carrier emission from the trap started. The donor type trap was ionized in the initial state, and the electron emission therefrom was almost zero and thus was ignorable. On the other hand, with the holes trapped in the part of the acceptor type trap in the initial state emitted, negative space charges were generated. The space charges thus generated resulted in the upwardly convex conduction band energy profile. Thus, the electric field below the channel changed so that the current increased up to the point c. A speed of this change in the current over time corresponds to the time constant of the emission from the acceptor type trap. At the point d immediately after the back gate voltage has returned to 0V, the upwardly convex profile was maintained due to the space charges generated by the holes emitted from the acceptor trap, whereby the current was lower than that in the initial state. Holes will be trapped toward the thermal equilibrium so that the conduction band energy is lowered toward the initial state, and the current eventually recovers to the initial state. However, due to an extremely small amount of holes generated/injected, the current remained to be low until the point e. In an actual device, the holes are injected due to leak current caused by threading dislocation, crystal defect at the grain boundary, and the like. Holes are further generated/injected by carrier excitation/generation due to light irradiation, and thus the current is expected to recover to the original current within a limited amount of time.

The results described above are summarized as follows. Specifically, in the case of the donor type trap rich, the current will not be lower than that in the initial state, at the point when the back gate voltage returns to 0V after back gate voltage stress. In such a case, current increases with time under back gate voltage stress, based on the time constant of the electron emission from the donor type trap. In the case of acceptor type trap rich, the current will be lower than that in the initial state, at the point when the back gate voltage returns to 0V after back gate voltage stress. This phenomenon is based on the amount of hole emission from the acceptor type trap under back gate voltage stress. The current decreases with time under back gate voltage stress, based on the time constant of the hole emission.

Figure 35:
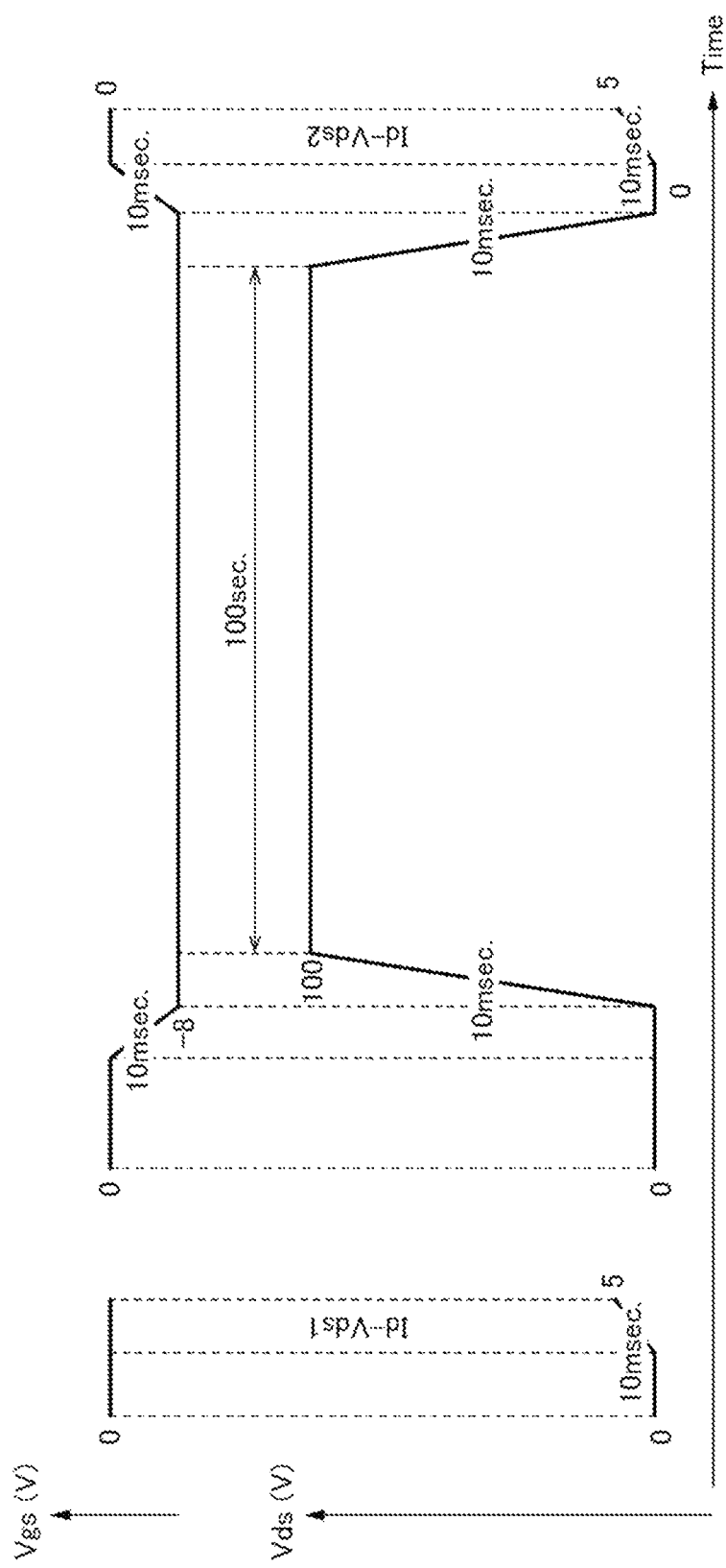
FIG. 35 shows a time profile of voltage under drain voltage stress (application of positive voltage to a second electrode 146).

FIG. 35 shows a time profile of gate-source voltage and drain-source voltage applied under drain voltage stress (application of positive voltage to the second electrode 146). In the simulation on the drain voltage stress, with respect to the profiles of the gate-source voltage and the drain-source voltage shown in FIG. 35, relationships Id–Vds1 and Id–Vds2 between the drain current and the drain-source voltage was calculated and compared. This is what is generally known as "current collapse" due to drain voltage stress. The back gate-source voltage was set to be 0V. The gate-source voltage was 0V during the calculation of Id–Vd1 and Id–Vd2. The gate-source voltage was −8 V and the drain-source voltage was 100V under drain stress. The stress time was set to be 100 seconds.

Figure 36:
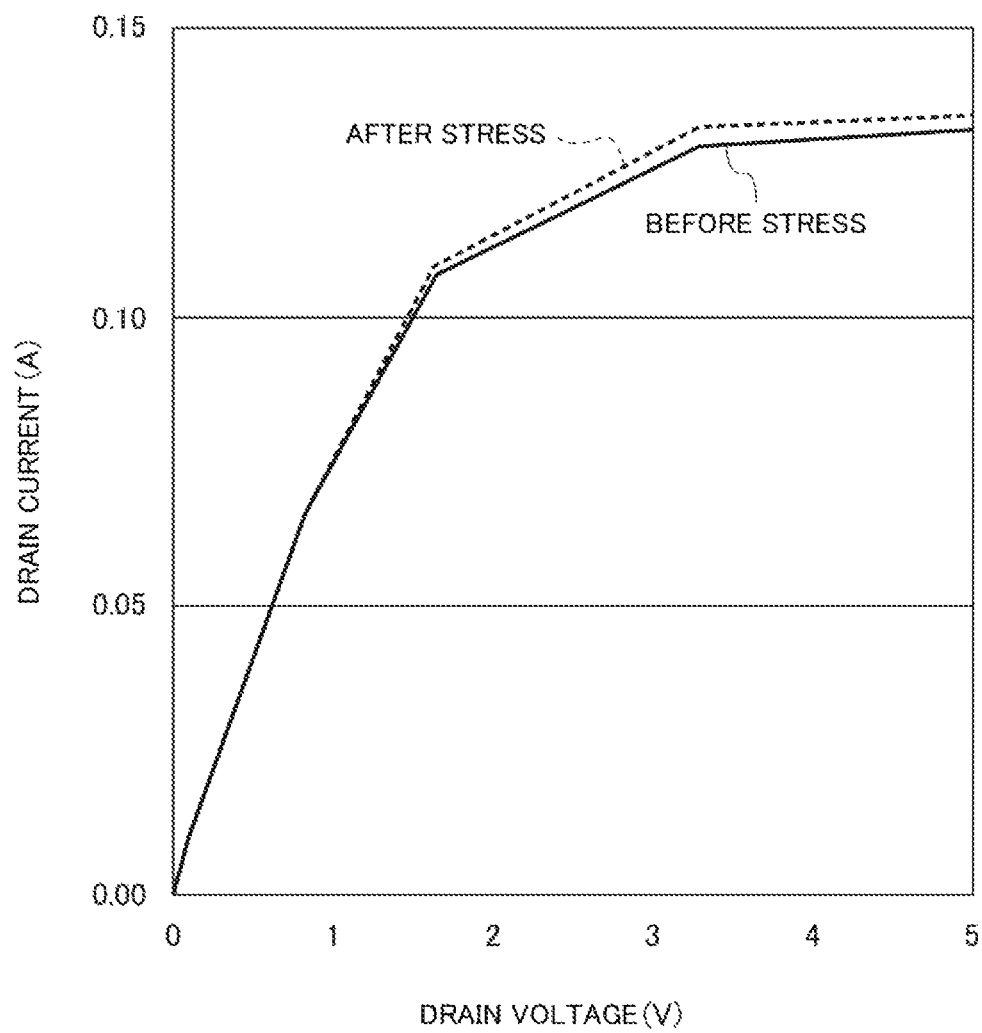
FIG. 36 shows drain current-drain voltage characteristics before and after application of the drain voltage stress shown in FIG. 35 (with the buffer layer being donor type trap rich).
Figure 37:
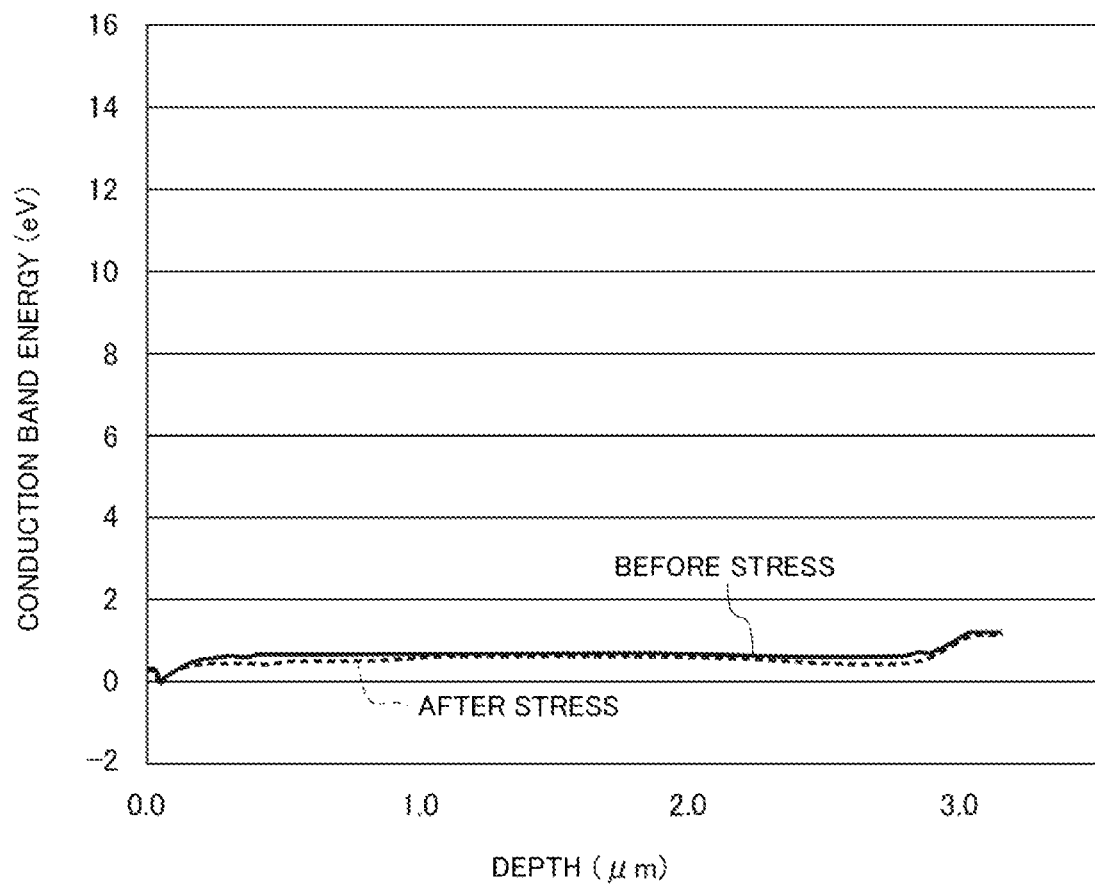
FIG. 37 shows a conduction band energy depth profile before and after the application of the drain voltage stress shown in FIG. 35 (with the buffer layer 106 being donor type rich).

A description will be given on a result of simulation on drain current-drain voltage characteristics before and after drain voltage stress and a depth profile of the conduction band energy below an intermediate point between the gate and drain electrodes, in a case that the GaN buffer layer has the donor type trap rich layer structure. FIG. 36 shows drain current-drain voltage characteristics before and after the application of drain voltage stress (with the buffer layer 106 being donor type trap rich). FIG. 37 shows the conduction band energy depth profile before and after the application of drain voltage stress (with the buffer layer 106 being donor type trap rich). The case of donor type trap rich involved no decrease in the current after drain voltage stress. Furthermore, it can be seen that the conduction band energy almost did not change at all.

Figure 38:
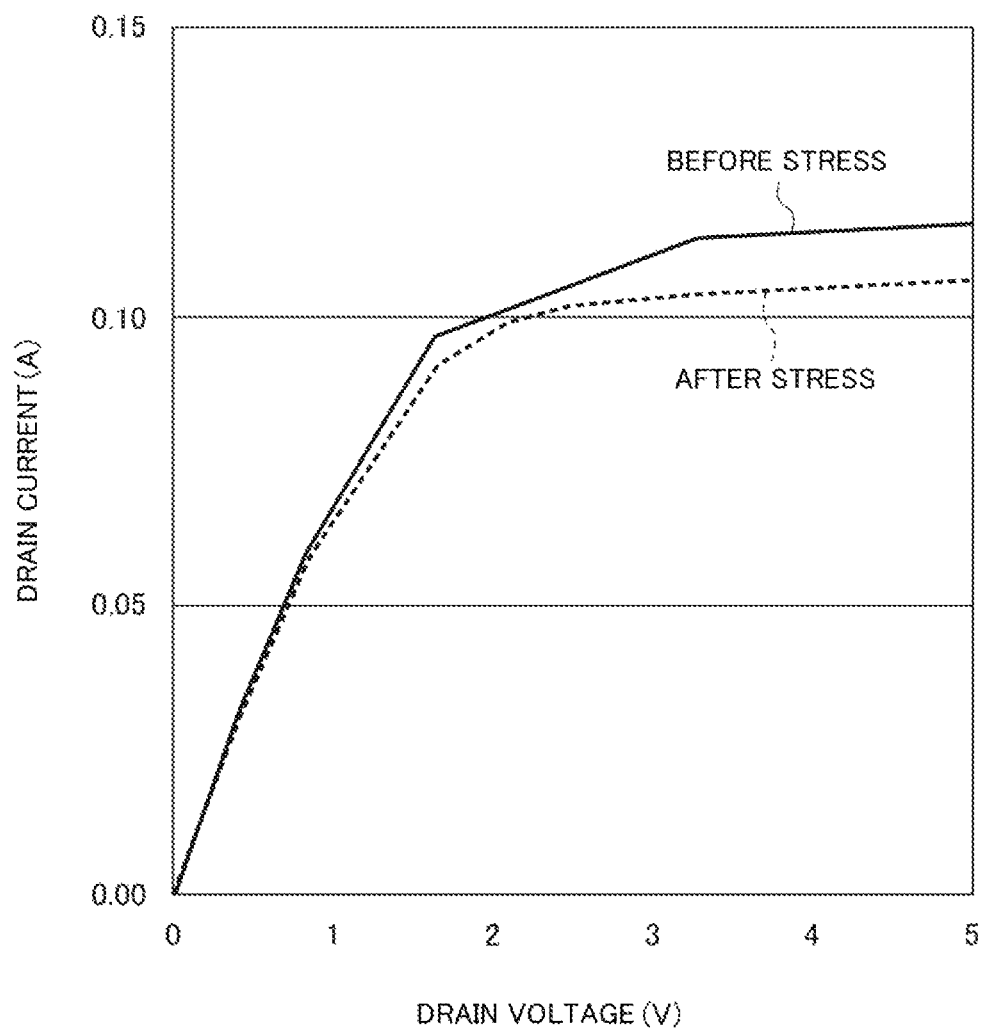
FIG. 38 shows drain current-drain voltage characteristics before and after the application of the drain voltage stress shown in FIG. 35 (with the buffer layer 106 being acceptor type rich).
Figure 39:
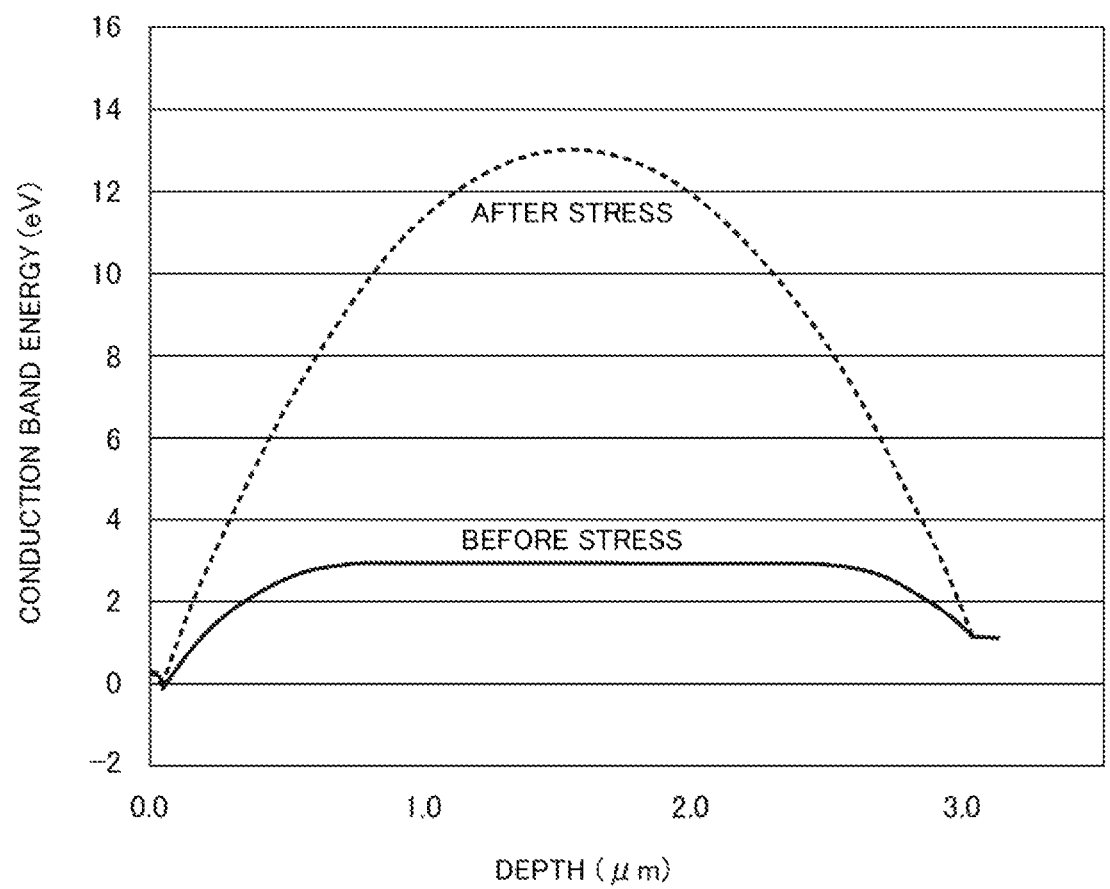
FIG. 39 shows conduction band energy depth profile before and after the application of the drain voltage stress shown in FIG. 35 (with the buffer layer 106 being acceptor type rich).

A description will be given on a result of simulation on drain current-drain voltage characteristics before and after drain voltage stress and a depth profile of the conduction band energy below an intermediate point between the gate and drain electrodes, in a case that the GaN buffer layer has the acceptor type trap rich layer structure. FIG. 38 shows drain current-drain voltage characteristics before and after the application of drain voltage stress (with the buffer layer 106 being acceptor type trap rich). FIG. 39 shows the conduction band energy depth profile before and after the application of drain voltage stress (with the buffer layer 106 being acceptor type trap rich). The case of acceptor type trap rich involves the decrease in the current after drain voltage stress. The conduction band energy is high after drain voltage stress, resulting in the lower current. The high conduction band energy is excepted to have been caused by the negative space charges due to the hole emission from the acceptor type trap under drain voltage stress, as in the case of back gate voltage stress. The holes are captured so that the initial state is eventually achieved. Still, the recovery takes a longer time relative to the measurement time due to the small amount of holes generated/injected.

It is known that drain voltage stress measurement (known as "current collapse" measurement) for an actual device is affected by the reduced drain current due to the charges generated from the surface trap. Thus, it is not necessarily easy to evaluate the collapse components of current attributable to the buffer layer. The decrease in the drain current due to back gate voltage stress with the negative voltage as described above is caused by a mechanism that is the same as that behind the decrease in the drain current due to drain voltage stress. Thus, the "current collapse" attributable to the buffer layer can be evaluated based on the back gate voltage characteristics. Furthermore, it has been found that the current decrease does not occur when the GaN buffer layer is donor type trap rich, but occurs when the GaN buffer layer is acceptor type trap rich.

Example 2

Figure 40:
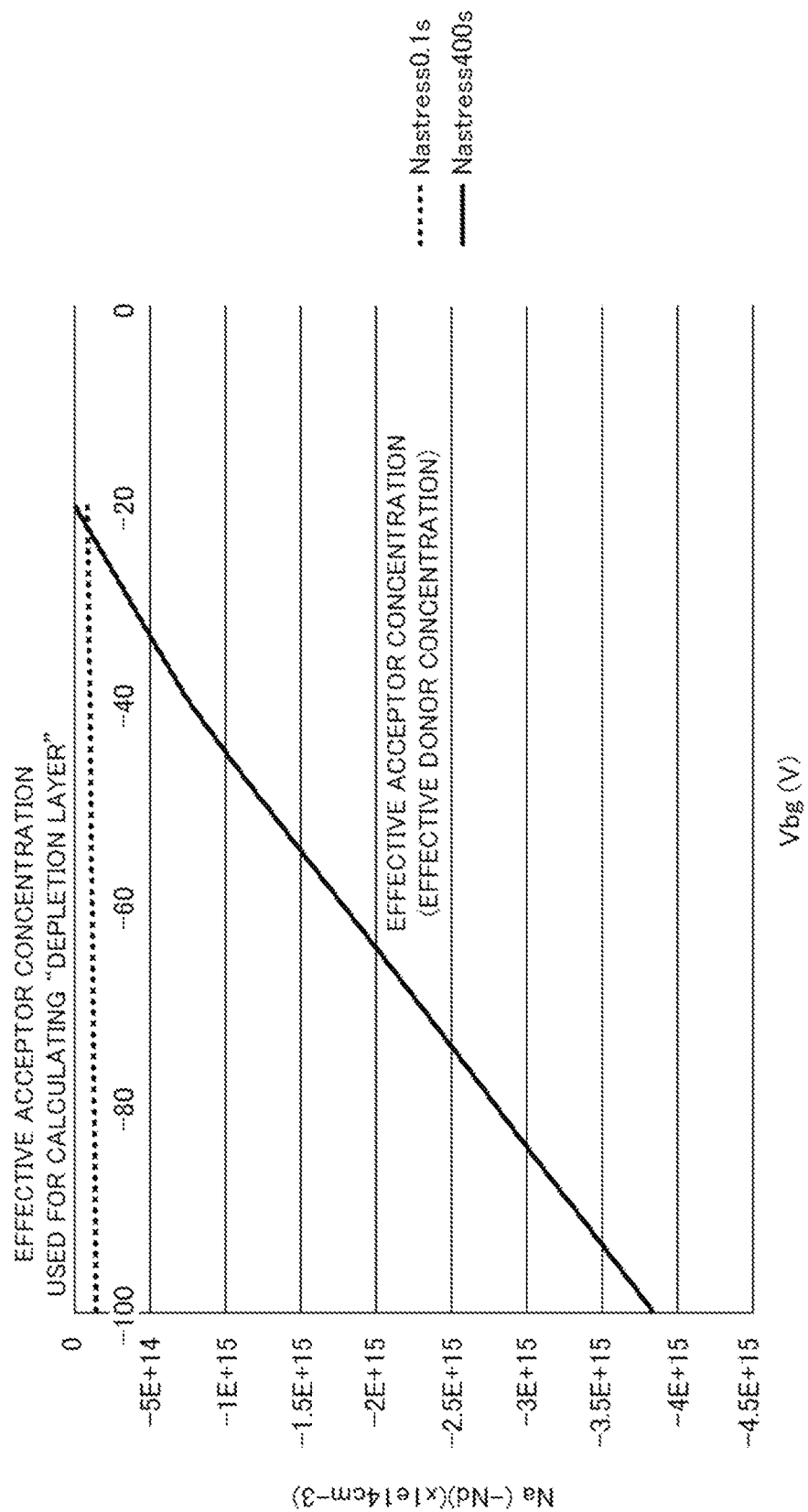
FIG. 40 shows effective acceptor concentration in a "depletion layer" calculated with a method (according to a fourth embodiment) for a wafer A that is different from that in FIG. 23.
Figure 41:
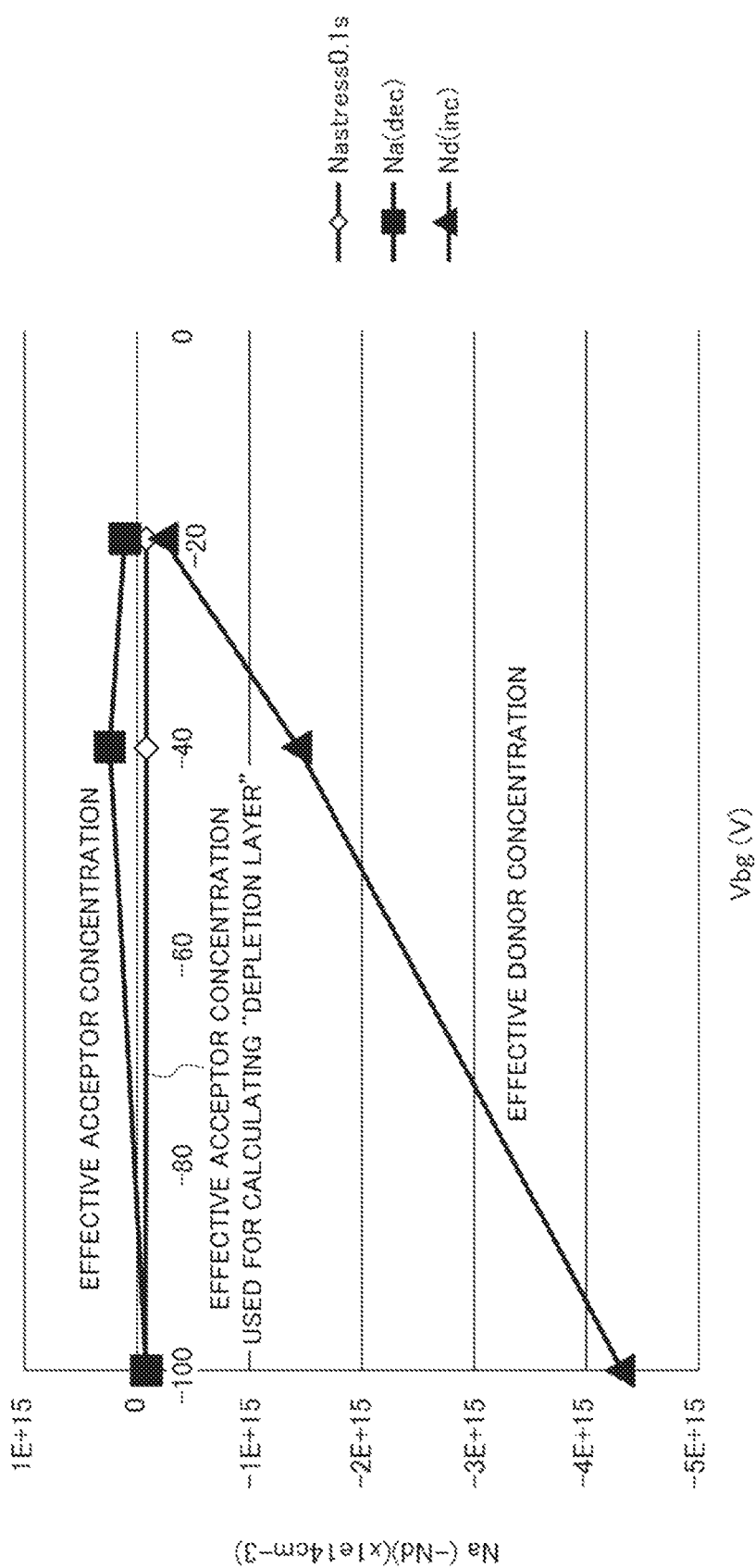
FIG. 41 shows effective acceptor concentration in a "depletion layer" calculated with a method (according to a sixth embodiment) for the wafer A that is different from that in FIG. 23.

FIG. 40 shows a result of producing a transistor from a wafer A different from that in FIG. 23, and performing analysis by the method described above in the fourth embodiment, to calculate the effective acceptor concentration. The wafer structure, the production method for and the structure of the transistor, and the measurement conditions were all the same. As can be seen in FIG. 40, the effective acceptor concentration of a negative value was obtained at each back gate voltage. Thus, the wafer can be determined as a wafer with "electron emission speed being higher than hole emission speed". FIG. 41 shows effective acceptor concentration and effective donor concentration calculated for the wafer A with the method described above in the sixth embodiment. The effective acceptor concentration resulting in a change in the drain current by 5% was $1.2 \times 10^{15}$ cm$^{-3}$ which is sufficiently low. Thus, the wafer can be determined as a wafer with "electron emission speed being higher than hole emission speed".

Comparative Example 2

Figure 42:
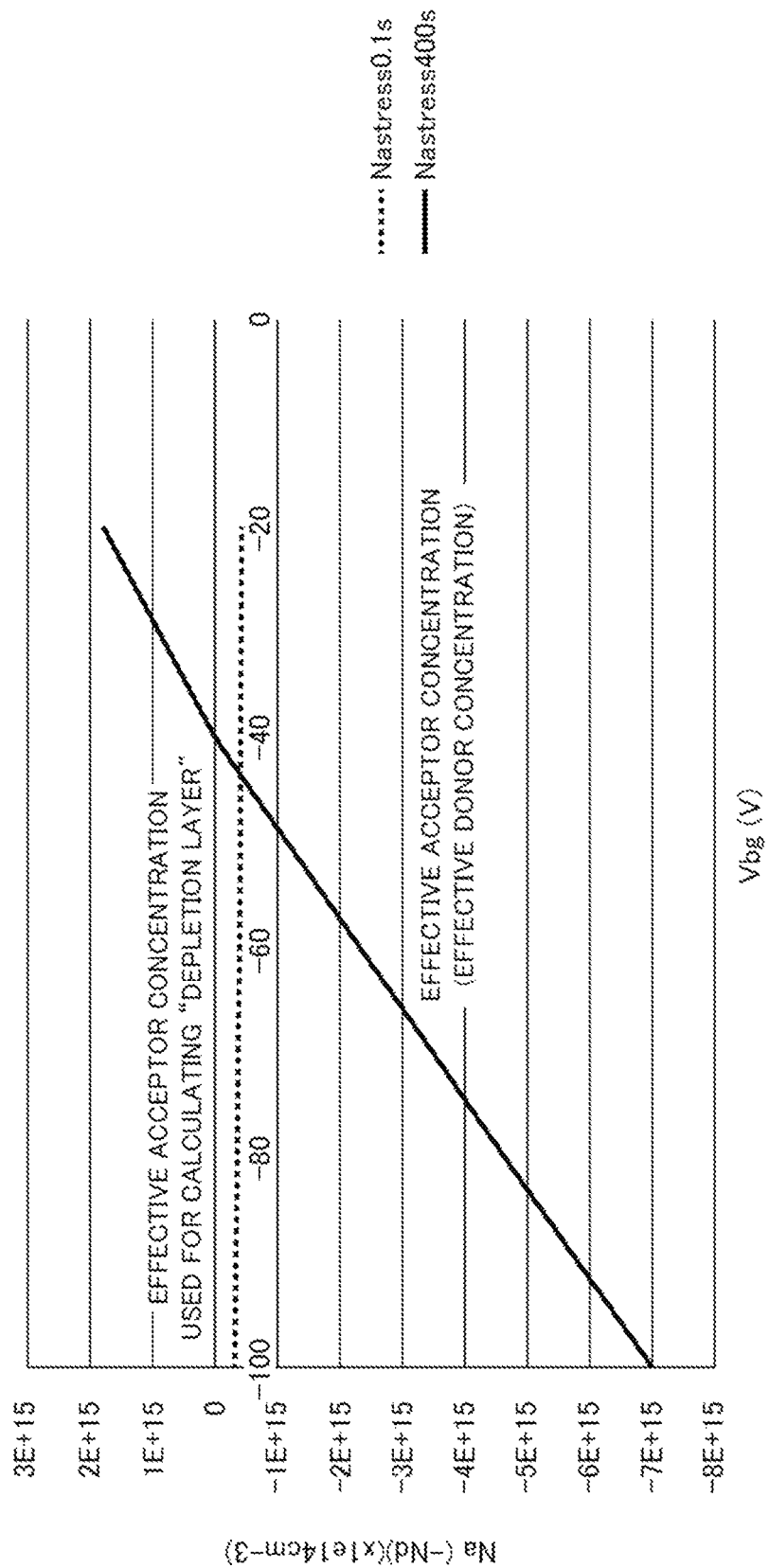
FIG. 42 shows effective acceptor concentration in a "depletion layer" calculated with a method (according to the fourth embodiment) for a wafer B that is different from that in FIG. 23.
Figure 43:
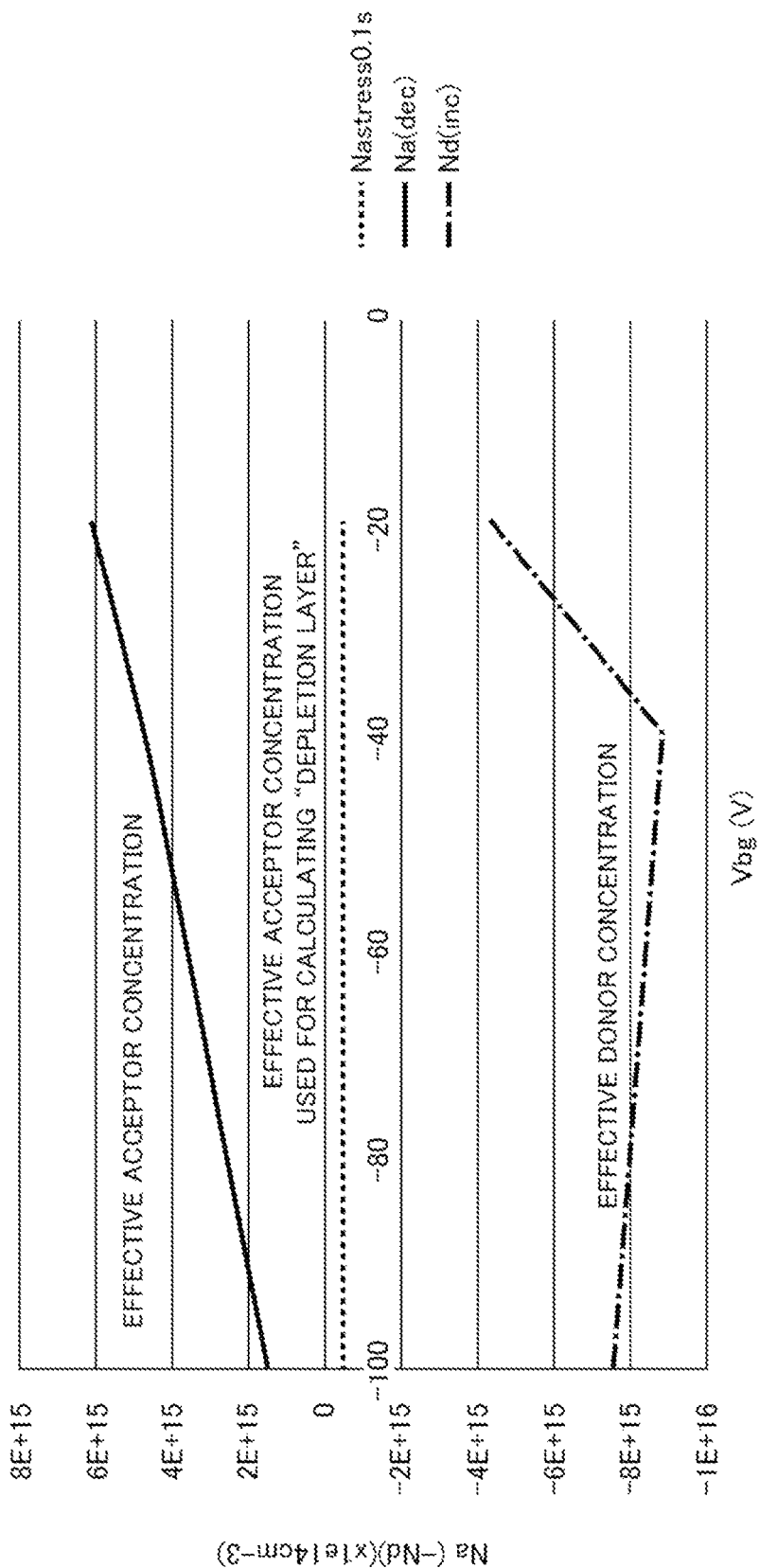
FIG. 43 shows effective acceptor concentration in a "depletion layer" calculated with a method (according to the sixth embodiment) for the wafer B that is different from that in FIG. 23.

FIG. 42 shows a result of producing a transistor from a wafer B different from that in FIG. 23, and performing analysis by the method described above in the fourth embodiment, to calculate the effective acceptor concentration. The wafer structure, the production method for and the structure of the transistor, and the measurement conditions were all the same. As shown in FIG. 42, effective acceptor concentration of a positive value was obtained with Vbg=−20V, and the effective acceptor concentration resulting in a change in the drain current by 5% was $1.8 \times 10^{15}$ cm$^{-3}$. Thus, the same level of decrease in the drain current is expected. Thus, the wafer is not a wafer with "electron emission speed being higher than hole emission speed". FIG. 43 shows effective acceptor concentration and effective donor concentration calculated for the wafer B with the method described above in the fifth embodiment. The effective acceptor concentration resulting in a change in the drain current by 5% was $1.2 \times 10^{15}$ cm$^{-3}$ which is smaller than the effective acceptor concentration calculated. Thus, the wafer is not a wafer with "electron emission speed being higher than hole emission speed". With the method according to the fifth embodiment, the effective acceptor and the effective donor concentration are detected independently from each other, and thus the determination can be more effectively made than the method according to the fourth embodiment.

Third Example

Figure 44A:
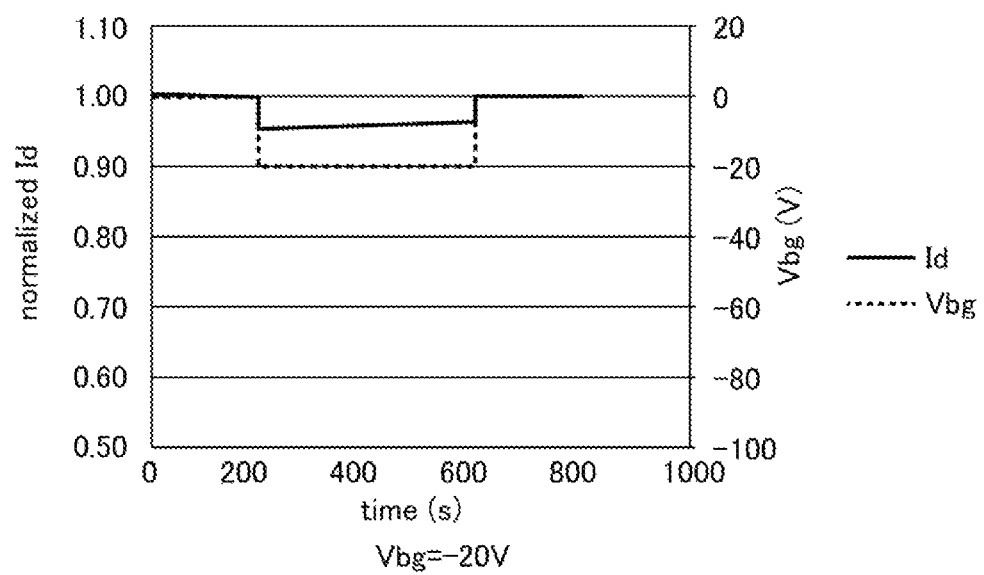
FIG. 44A shows a change in drain current with negative back gate voltage varied, in a wafer C different from that in FIG. 10A to FIG. 10C.
Figure 44B:
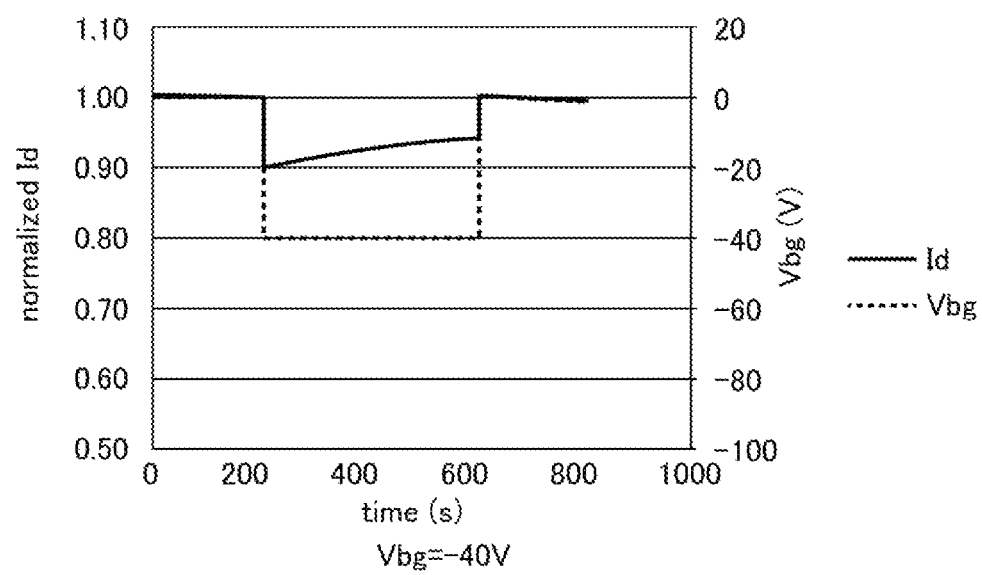
FIG. 44B shows a change in the drain current with negative back gate voltage varied, in the wafer C different from that in FIG. 10A to FIG. 10C.
Figure 44C:
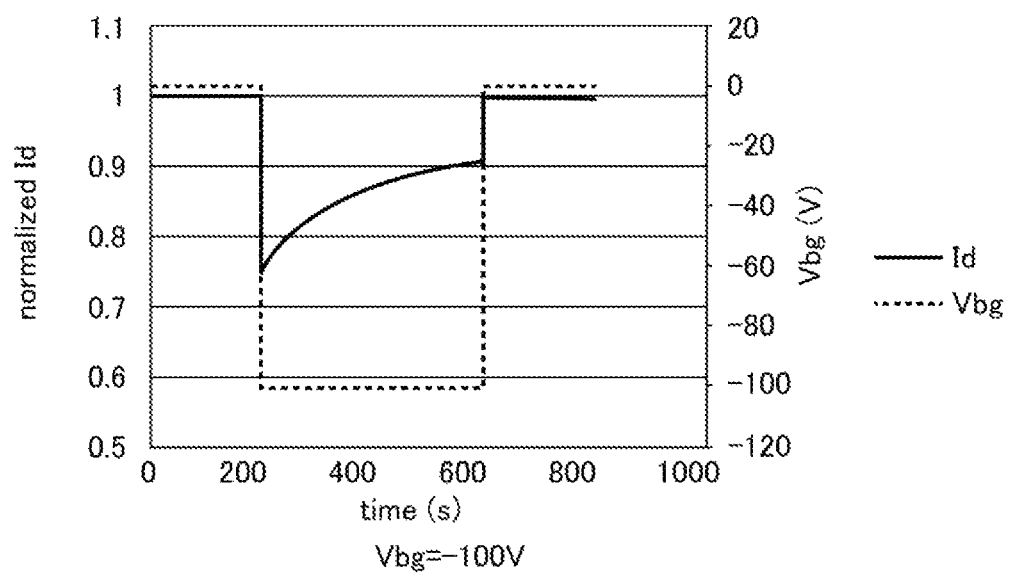
FIG. 44C shows a change in the drain current with negative back gate voltage varied, in the wafer C different from that in FIG. 10A to FIG. 10C.
Figure 45:
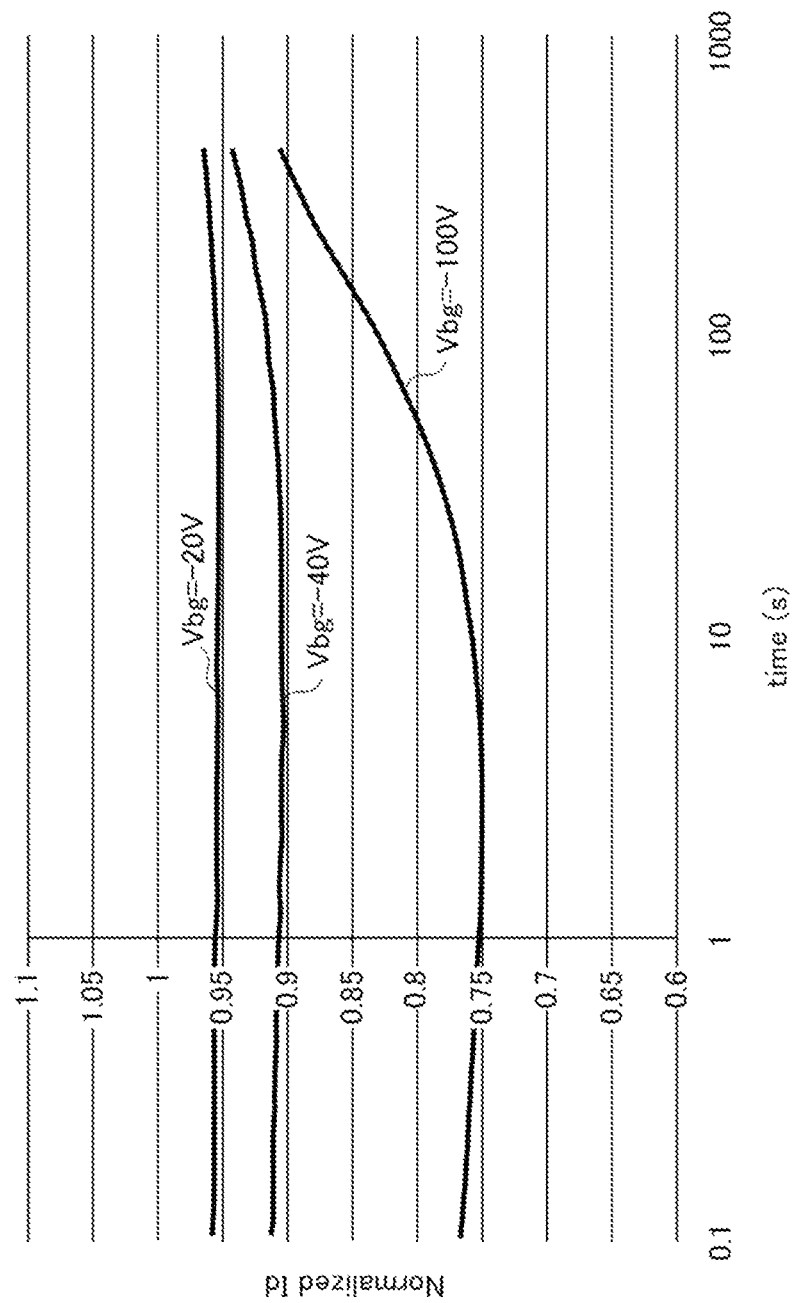
FIG. 45 shows how drain current changes over time under back gate voltage stress in the wafer C illustrated in FIG. 44A to FIG. 44C.

FIG. 44A, FIG. 44B, and FIG. 44C show a change in drain current measured using the method that is the same as that in FIG. 10A to FIG. 10C with the back gate voltage varied, in a case that a transistor was produced from a wafer C different from that in FIG. 10A to FIG. 10C. The wafer structure, the production method for and the structure of the transistor, and the measurement conditions were all the same. The drain current substantially did not decrease with time, at any back gate voltage. In FIG. 45, the change in the drain current under back gate voltage stress in FIG. 44A to FIG. 44C is logarithmically plotted along the vertical axis. Elapsed time from the start of stress was logarithmically plotted along the horizontal axis. Respective data curves respectively correspond to Vbg=−20V, −40V, and −100V in this order from the upper side. FIG. 45 shows, at each Vbg, a component with a slight decrease in the drain current within several seconds after stress, which cannot be found in FIG. 44A to FIG. 44C. The decreased amounts of the drain current were all not larger than 5%, and were particularly not larger than 2% of the drain current. Thus, it can be determined that the drain current "does not decrease with time".

LIST OF REFERENCE NUMERALS

100 . . . semiconductor wafer, 102 . . . substrate, 106 . . . buffer layer, 112 . . . first crystalline layer (channel layer), 114 . . . second layer, 114a . . . second crystalline layer, 114b . . . insulating layer, 120 . . . two-dimensional electron gas, 142 . . . electrode (gate electrode), 144 . . . first electrode (source electrode), 146 . . . second electrode (drain electrode), 148 . . . third electrode (wafer back surface electrode).

What is claimed is:

1. A semiconductor wafer comprising:
   a substrate;
   a buffer layer;
   a first crystalline layer; and
   a second layer, wherein
   the substrate, the buffer layer, the first crystalline layer, and the second layer are positioned in order of the substrate, the buffer layer, the first crystalline layer and the second layer,
   the buffer layer and the first crystalline layer are made of a group III nitride layer,
   a bandgap of the first crystalline layer is smaller than a bandgap of the second layer,
   when the semiconductor wafer is formed as a transistor wafer, a channel of a transistor is formed at or near an interface between the first crystalline layer and the second layer, and
   with a first electrode and a second electrode, electrically connected to the channel, provided closer to a front surface than the channel is, and with a third electrode, at which an electric field is applicable to a spatial region positioned between the channel and the substrate, provided closer to a back surface than the channel is, when space charge redistribution, for emitting electrons and holes from a bandgap of a crystal positioned in the spatial region, is achieved by applying negative voltage to the third electrode or by applying positive voltage to the second electrode with the first electrode serving as a reference, an electron emission speed in the space charge redistribution is higher than a hole emission speed.

2. A semiconductor wafer comprising:
   a substrate;
   a buffer layer;
   a first crystalline layer; and
   a second layer, wherein
   the substrate, the buffer layer, the first crystalline layer, and the second layer are positioned in order of the substrate, the buffer layer, the first crystalline layer, and the second layer,
   the buffer layer and the first crystalline layer are made of a group III nitride layer,
   a bandgap of the first crystalline layer is smaller than a bandgap of the second layer,
   when the semiconductor wafer is formed as a transistor wafer, a channel of a transistor is formed at or near an interface between the first crystalline layer and the second layer, and
   with a first electrode and a second electrode, electrically connected to the channel, provided closer to a front surface than the channel is, when voltage at a level not causing saturation of current flowing between the first electrode and the second electrode is applied between the first electrode and the second electrode and negative voltage is applied to the wafer with a lower one of potentials of the first electrode and the second electrode serving as a reference, the current flowing between the first electrode and the second electrode does not decrease with time.

3. The semiconductor wafer according to claim 1, wherein
   the second layer is a second crystalline layer made of a group III nitride layer, and
   the channel is two-dimensional electron gas.

4. The semiconductor wafer according to claim 3, wherein the first crystalline layer is made of $Al_xGa_{1-x}N$ and the second crystalline layer is made of $Al_yGa_{1-y}N$ where $x \neq y$.

5. The semiconductor wafer according to claim 4, wherein the wafer is made of a conductive monocrystalline Si, the first crystalline layer is made of GaN, and the second crystalline layer is made of $Al_yGa_{1-y}N$ where $0<y\leq 1$.

6. The semiconductor wafer according to claim 3, wherein an absolute value of the negative voltage is smaller than an absolute value of pinch-off voltage of the two-dimensional electron gas.

7. The semiconductor wafer according to claim 1, wherein the second layer is an insulating layer functioning as a gate insulating film for the transistor when the transistor is formed.

8. The semiconductor wafer according to claim 1, wherein the negative voltage is voltage within a range between −10V and −200V.

9. The semiconductor wafer according to claim 1, wherein the wafer is a conductive wafer.

10. The semiconductor wafer according to claim 1, wherein
    the wafer is a monocrystalline wafer made of Si, SiC, or GaN.

11. An electronic device comprising the semiconductor wafer according to claim 1.

* * * * *